(12) United States Patent
Kim et al.

(10) Patent No.: US 7,580,088 B2
(45) Date of Patent: Aug. 25, 2009

(54) CONTACT FOR SEMICONDUCTOR AND DISPLAY DEVICES

(75) Inventors: Jang-Soo Kim, Suwon (KR);
Hyang-Shik Kong, Suwon (KR);
Min-Wook Park, Ponghang (KR);
Sang-Jin Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/854,059

(22) Filed: Sep. 12, 2007

(65) Prior Publication Data

US 2007/0296885 A1 Dec. 27, 2007

Related U.S. Application Data

(62) Division of application No. 10/273,073, filed on Oct. 17, 2002, now Pat. No. 7,271,867.

(30) Foreign Application Priority Data

Oct. 22, 2001 (KR) .......................... 2001-0065185

(51) Int. Cl.
*G02F 1/136* (2006.01)
*H01L 21/4763* (2006.01)
(52) U.S. Cl. ........................................ 349/43; 438/624
(58) Field of Classification Search ............. 349/42–43; 257/59, 72, 91; 438/623–624, 72
See application file for complete search history.

(56) References Cited

U.S. PATENT DOCUMENTS 4,929,060 A 5/1990 Sugimoto et al.

(Continued)

FOREIGN PATENT DOCUMENTS

CN 1254948 5/2000

(Continued)

OTHER PUBLICATIONS

Merriam-Webster's Collegiate Dictionary, Tenth Edition, Copyright 2001, pp. 850-851.

*Primary Examiner*—Dung T. Nguyen
(74) *Attorney, Agent, or Firm*—F. Chau & Associates, LLC

(57) ABSTRACT

A device and corresponding method of fabrication thereof are disclosed, where the device provides a contact for semiconductor and display devices, the device including a substrate, a first wiring line assembly formed on the substrate, an under-layer formed on the first wiring line assembly, an organic insulating layer formed on the under-layer such that the organic insulating layer covers the under-layer, a pattern on the organic insulating layer for contact holes to expose the under-layer, etched contact holes formed in the under-layer in correspondence with the pattern such that the underlying first wiring line assembly is exposed to the outside, a cured organic insulating layer formed on the under-layer, and a second wiring line assembly formed on the organic insulating layer such that the second wiring line assembly is connected to the first wiring line assembly through the etched contact holes, and the corresponding method of fabrication including forming a first wiring line assembly on a substrate, forming an under-layer on the first wiring line assembly, forming an organic insulating layer such that the organic insulating layer covers the under-layer patterning the organic insulating layer to thereby form contact holes exposing the under-layer, etching the under-layer exposed through the contact holes such that the underlying first wiring line assembly is exposed to the outside, curing the organic insulating layer, and forming a second wiring line assembly on the organic insulating layer such that the second wiring line assembly is connected to the first wiring line assembly through the contact holes.

16 Claims, 54 Drawing Sheets

U.S. PATENT DOCUMENTS

| | | |
|---|---|---|
| 6,646,692 B2 | 11/2003 | Yamazaki et al. |
| 6,731,358 B2 * | 5/2004 | Tanaka et al. ............... 349/108 |
| 6,750,475 B1 * | 6/2004 | Izumi et al. .................. 257/59 |
| 6,762,802 B2 | 7/2004 | Ono et al. |
| 6,844,906 B2 * | 1/2005 | Moon et al. ................. 349/123 |
| 6,943,068 B2 | 9/2005 | Chang et al. |
| 2003/0086036 A1 | 5/2003 | Yang et al. |

FOREIGN PATENT DOCUMENTS

| | | |
|---|---|---|
| EP | 1 065 714 A1 | 1/2001 |
| JP | 61-272950 | 12/1986 |
| JP | 03042871 | 2/1991 |
| JP | 03265168 | 11/1991 |
| JP | 03270168 | 12/1991 |
| JP | 05082768 | 4/1993 |
| JP | 06242433 | 9/1994 |
| JP | 08-017928 | 1/1996 |
| JP | 10307305 | 11/1998 |
| JP | 11-024268 | 1/1999 |
| JP | 2000-155335 | 6/2000 |
| JP | 2000-07-28 | 7/2000 |
| JP | 2000199917 | 7/2000 |
| JP | 2001-032086 | 2/2001 |
| JP | 2001-100652 | 4/2001 |
| JP | 2000-206571 | 7/2007 |

* cited by examiner

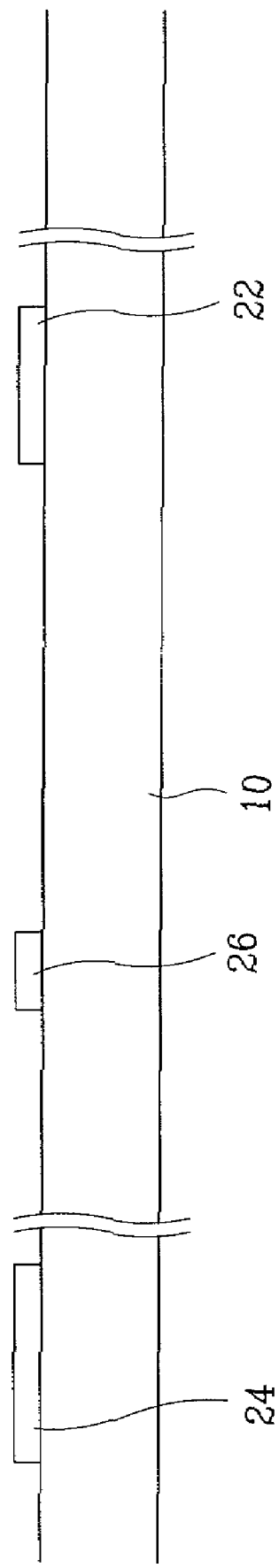

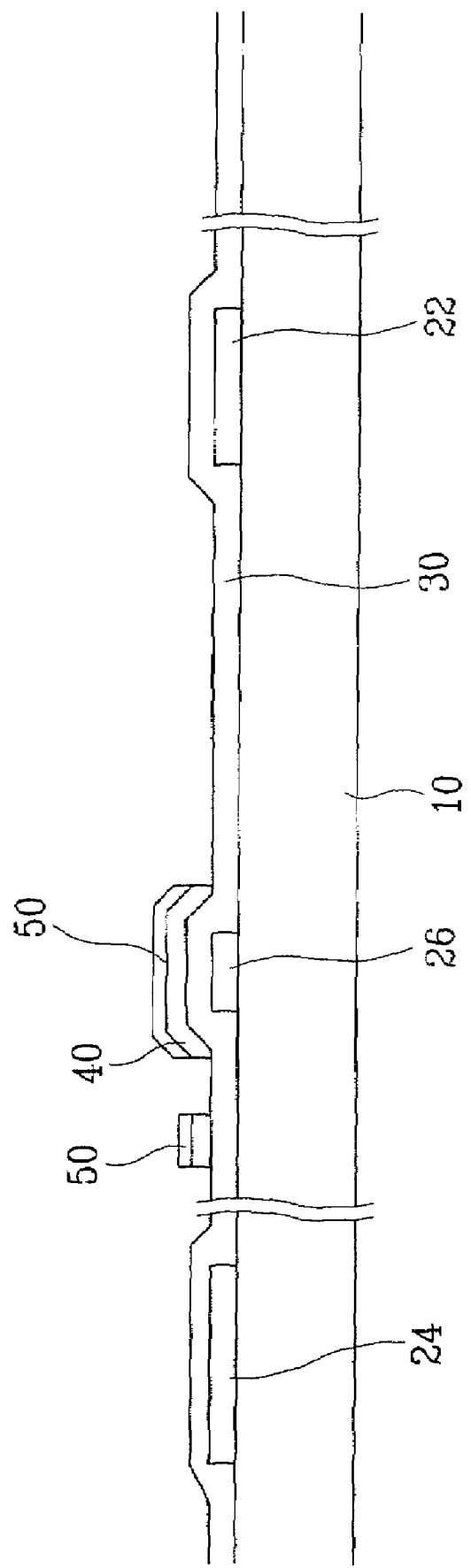

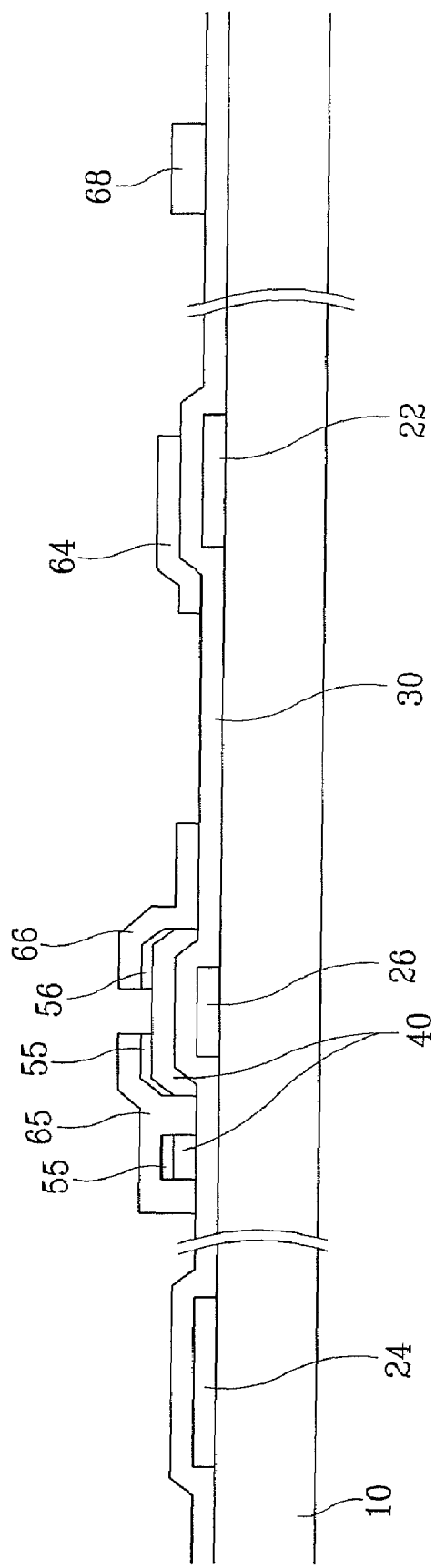

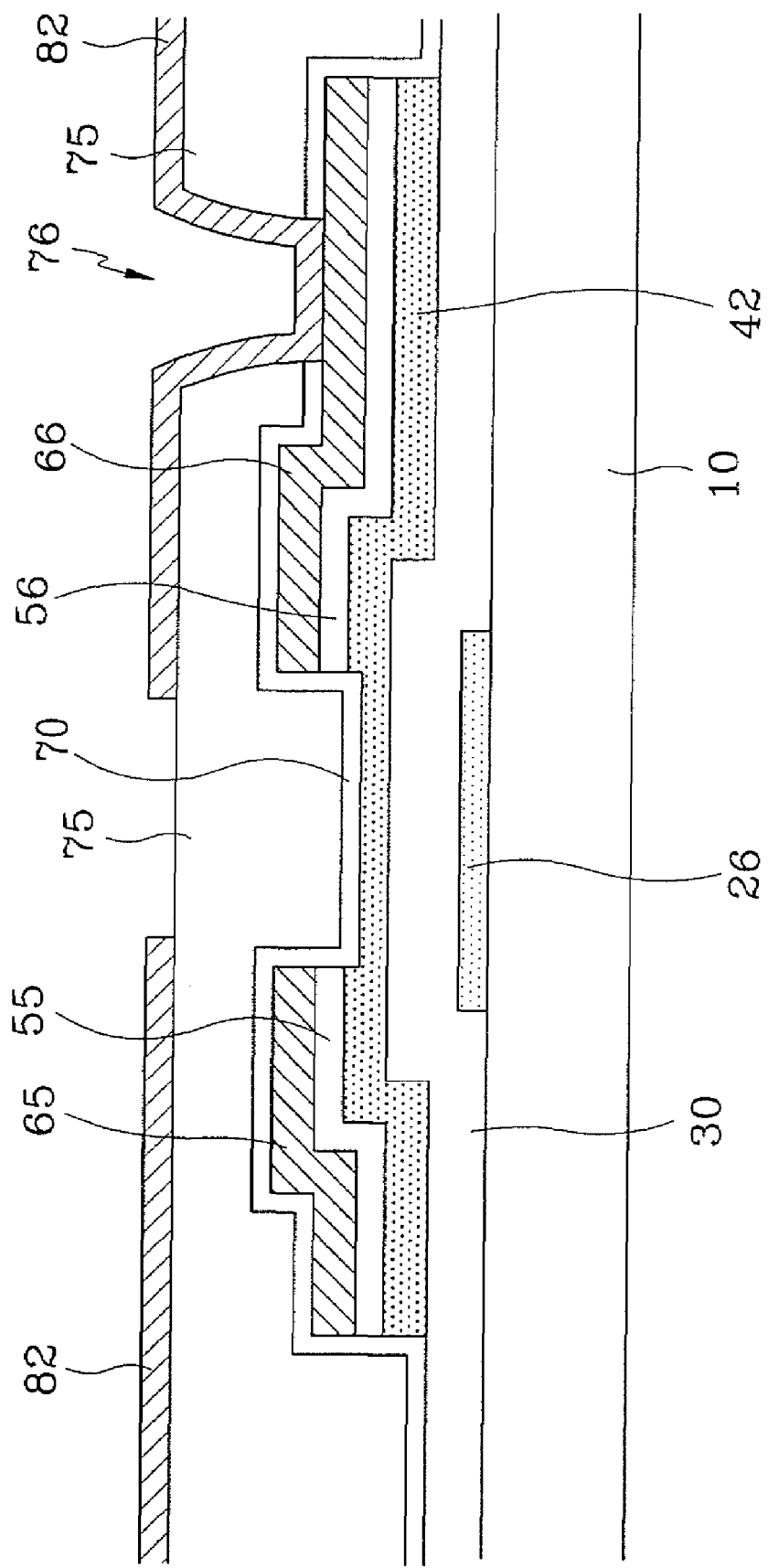

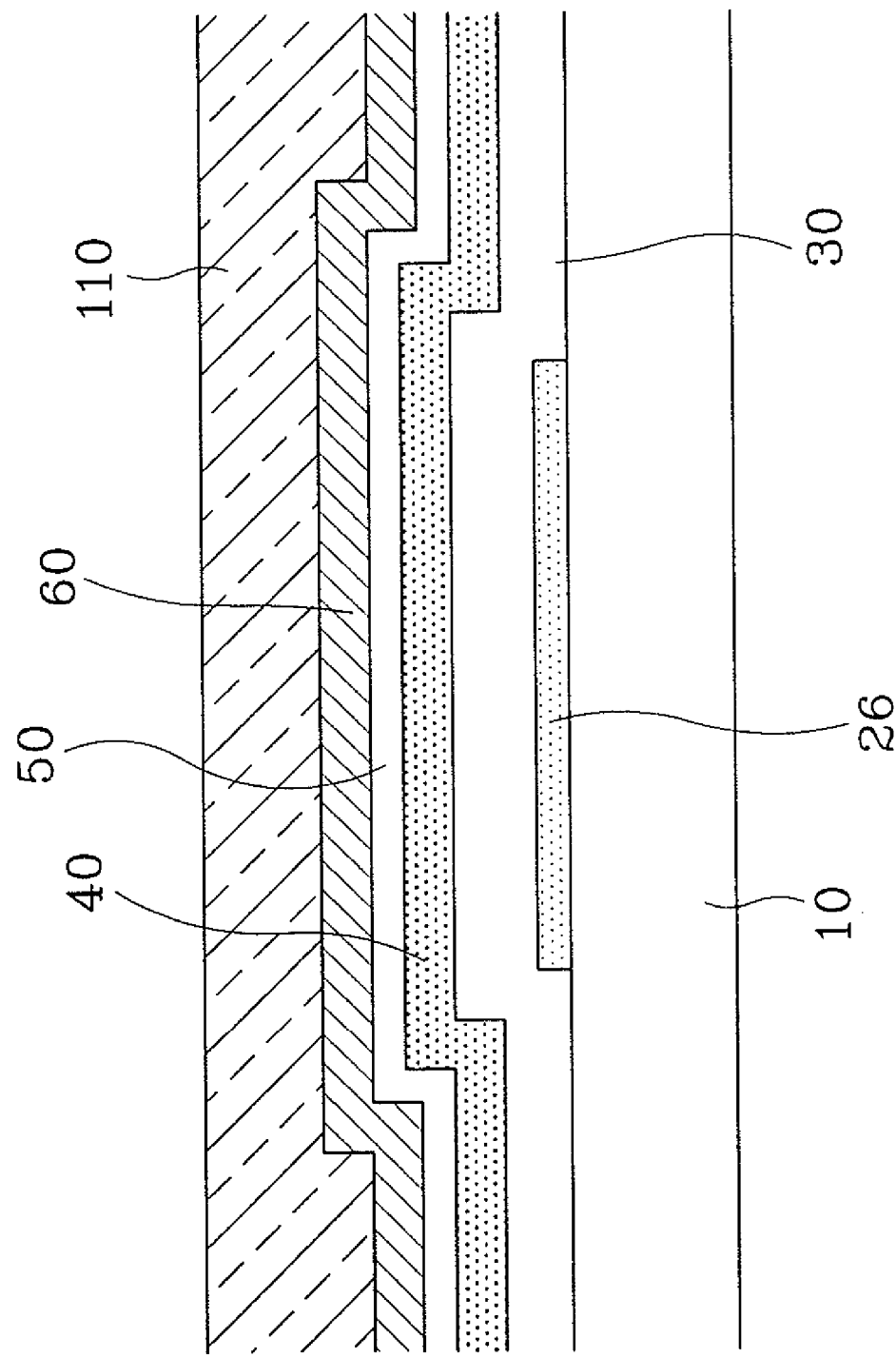

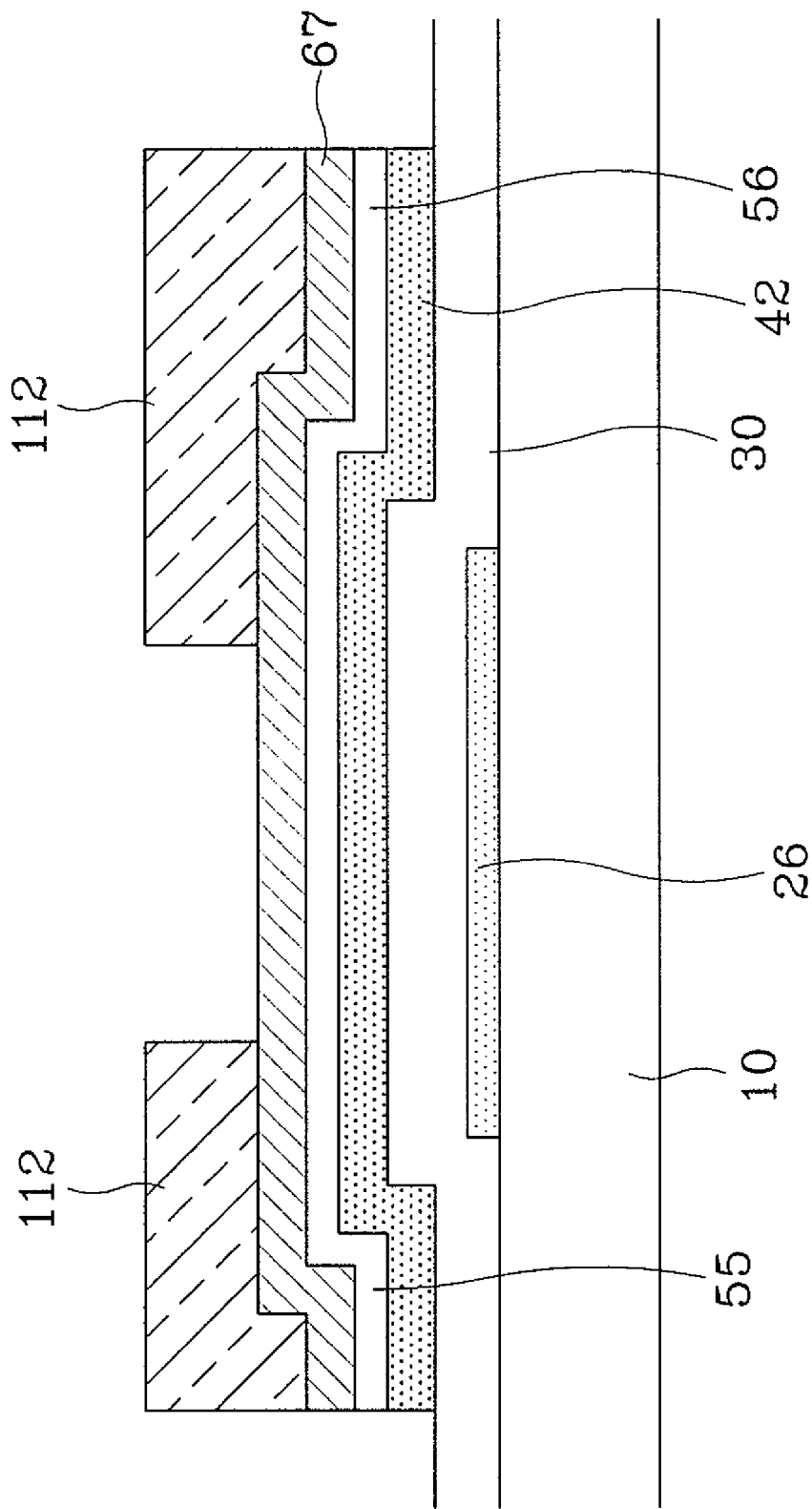

CONTACT FOR SEMICONDUCTOR AND DISPLAY DEVICES

CROSS REFERENCE TO RELATED APPLICATIONS

This application is a divisional of U.S. patent application Ser. No. 10/273,073, filed Oct. 17, 2002 now U.S. Pat. No. 7,271,867, which claims priority to Korean Application 2001-0065185, filed Oct. 22, 2001, the disclosures of which are incorporated by reference herein in their entireties.

BACKGROUND OF THE INVENTION (a) Field of the Invention

The present disclosure relates to a contact structure for a semiconductor device as well as for a thin film transistor array substrate of a liquid crystal display, and a method of fabricating the same.

(b) Description of Related Art

Generally, as a semiconductor device becomes integrated, the semiconductor device is optimized in its area while bearing a multi-layered wiring line assembly together with an insulating layer. To minimize interference of the signals transmitted through the wiring line assembly, the insulating layer is formed with a low dielectric material. Contact holes are formed at the insulating layer, and the wiring lines involving the same signal are electrically connected to each other through the contact holes. In the contact hole formation process based on etching, an undercut is liable to be made at the contact area while weakening the step coverage of the contact structure. Furthermore, the wiring line assembly placed over the insulating layer may be deformed in its profile, or cut at the contact area.

Meanwhile, a liquid crystal display, one of the most widely used flat panel displays, has two substrates with electrodes, and a liquid crystal layer sandwiched between the substrates. Voltages are applied to the electrodes so that the liquid crystal molecules in the liquid crystal layer are re-oriented to sic) thereby control the light transmission.

One of the substrates is provided with thin film transistors for switching the voltages applied to the electrodes, and usually called the "thin film transistor array substrate." The thin film transistor array substrate further includes gate lines for carrying scanning signals, data lines crossing over the gate lines to carry picture signals, gate and data pads for receiving scanning signals and picture signals from the outside and transmitting them to the gate and the data lines, and pixel electrodes formed at the pixel regions defined by the gate and the data lines while being connected to the thin film transistors.

To obtain improved picture quality of the display device, the opening or aperture ratio of the pixels should be enhanced as much as possible. For that purpose the wiring line assembly and the pixel electrodes are overlapped with each other while interposing an insulating layer. The insulating layer is formed with a low dielectric organic material to minimize interference of the signals transmitted through the wiring line assembly.

A method of fabricating the thin film transistor array substrate involves a process of exposing the pads for receiving the required signals from the outside, or a process of exposing the portions of the wiring lines to be in contact with other wiring line portions. When a target layer is etched using the overlying insulating layer with contact holes as a mask, while not etching the insulating layer such that the insulating layer bears a sufficient thickness, it is seriously undercut at the contact area while weakening the step coverage thereof. In this case, the overlying insulating layer may be deformed in its profile, or cut at the contact area. To solve such a problem, the sidewall of the contact hole may be formed with a stepped shape. However, in this case, the organic insulating layer should suffer several photolithography processes, and this complicates the relevant processing steps.

SUMMARY OF THE INVENTION

These and other drawbacks and disadvantages of the prior art are addressed by a contact for semiconductor and display devices and corresponding method of fabrication.

In an exemplary embodiment, the contact is a portion of a thin film transistor array substrate for a liquid crystal display, where the thin film transistor array substrate includes a substrate, a gate line assembly formed on the substrate, the gate line assembly having gate lines proceeding in the horizontal direction to carry scanning signals, gate electrodes being parts of the gate lines, and gate pads connected to the gate lines, a gate insulating layer covering the gate line assembly, a semiconductor pattern formed on the gate insulating layer, a data line assembly formed on the semiconductor pattern and the gate insulating layer, the data line assembly having data lines proceeding in the vertical direction, source electrodes connected to the data lines, drain electrodes separated from the source electrodes while facing the source electrodes around the gate electrodes, and data pads connected to the data lines, a protective layer formed on the data line assembly and the semiconductor pattern, an organic insulating layer formed on the protective layer with contact holes exposing the drain electrodes, the gate pads and the data pads together with the protective layer, the side wall of the organic insulating layer defining the contact holes bearing an inclination degree of about 30-60°, and pixel electrodes formed on the organic insulating layer while being electrically connected to the drain electrodes.

The corresponding method of fabrication for the contact portion of a thin film transistor array substrate for a liquid crystal display includes forming a gate line assembly on an insulating substrate, the gate line assembly having gate lines, and gate electrodes connected to the gate lines, depositing a gate insulating layer onto the substrate with the gate line assembly, forming a semiconductor layer on the gate insulating layer, forming a data line assembly, the gate line assembly having data lines crossing over the gate lines, source electrodes connected to the data lines while being positioned close to the gate electrodes, and drain electrodes positioned opposite to the source electrodes with respect to the gate electrodes, depositing a protective layer, forming an organic insulating layer on the protective layer, patterning the organic insulating layer to thereby form first contact holes exposing the protective layer over the drain electrodes, etching the protective layer exposed through the first contact holes such that the drain electrodes are exposed to the outside, curing the organic insulating layer- and forming pixel electrodes on the protective layer such that the pixel electrodes are connected to the drain electrodes through the first contact holes.

In another exemplary embodiment, contact for semiconductor devices and corresponding method of fabrication are provided where the method includes forming a first wiring line assembly on a substrate, forming an under-layer on the first wiring line assembly, forming an organic insulating layer such that the organic insulating layer covers the under-layer, patterning the organic insulating layer to thereby form contact holes exposing the under-layer, etching the under-layer exposed through the contact holes such that the underlying first wiring line assembly is exposed to the outside, curing the organic insulating layer, and forming a second wiring line assembly on the organic insulating layer such that the second wiring line assembly is connected to the first wiring line assembly through the contact holes.

These and other aspects, features and advantages of the present disclosure will become apparent from the following description of exemplary embodiments, which is to be read in connection with the accompanying drawings.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 4B is a cross sectional view of the thin film transistor array substrate taken along the IVb-IVb' line of FIG. 4A;

FIG. 5B is a cross sectional view of the thin film transistor array substrate taken along the Vb-Vb' line of FIG. 5A;

FIG. 6B is a cross sectional view of the thin film transistor array substrate taken along the VIb-VIb' line of FIG. 6A;

FIGS. 11 and 12 are cross sectional views of the thin film transistor array substrate taken along the XI-XI' line and the XII-XII' line of FIG. 10;

FIGS. 14A and 14B illustrate the step of fabricating the thin film transistor array substrate following the step illustrated in FIGS. 13B and 13C;

DETAILED DESCRIPTION OF PREFERRED EMBODIMENTS

Preferred embodiments of the present invention are described with reference to the accompanying drawings. Embodiments of the present disclosure provide a semiconductor device and a thin film transistor array substrate for a liquid crystal display, which bear an insulting layer with a sufficient thickness while enhancing the profile of the contact structure. Embodiments of the present disclosure also provide a method of fabricating a semiconductor device and a thin film transistor array substrate that involves simplified processing steps.

FIGS. 1A to 1G are cross sectional views illustrating the steps of forming a contact structure for a semiconductor device according to embodiments of the present disclosure.

Figure 1A:
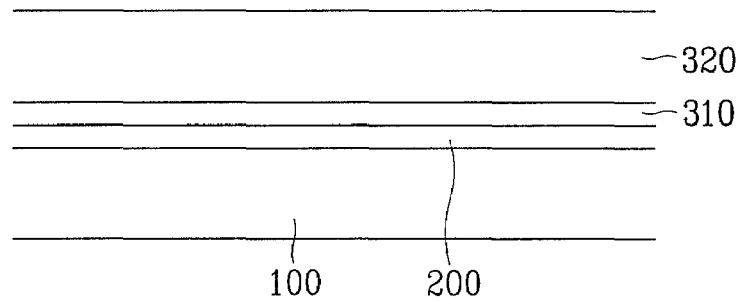
FIGS. 1A to 1G sequentially illustrate the steps of fabricating a contact to structure for a semiconductor device according to embodiments of the present disclosure.

As shown in FIG. 1A, a silicon nitride or silicon oxide-based insulating layer 310 and a low dielectric organic insulating layer 320 are sequentially deposited onto a substrate 100 with a first wiring line assembly to thereby form an inter-layered insulating layer 300. It is preferable that the organic insulating layer 320 involves photosensitivity, and the thickness of the insulating layer 310 is established to be about 1000 Å or less.

Figure 1B:
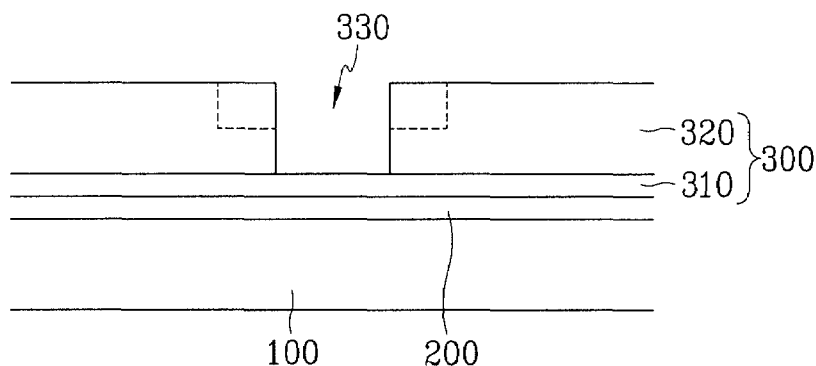

Thereafter, as shown in FIG. 1B, the organic insulating layer 320 is exposed to light using a mask with a light transmission region, and developed to thereby form a contact hole 330 exposing the underlying insulating layer 310. To control the light transmission, a slit or lattice-shaped pattern or a semitransparent film is formed around the light transmission region such that the portion of the organic insulating layer 320 around the contact hole 330 corresponding to the slit or lattice-shaped pattern or the semitransparent film bears a relatively thin thickness compared to other portions thereof. This makes the sidewall of the contact hole 330 proceed gradually at the subsequent curing process.

Figure 1C:
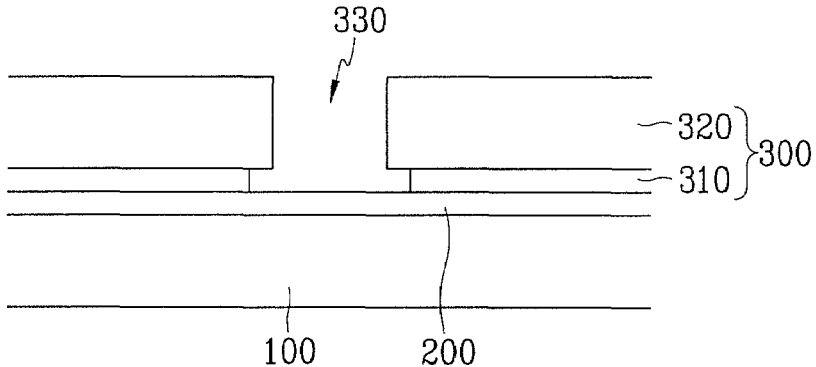

As shown in FIG. 1C, the insulating layer 310 exposed through the contact hole 330 is etched to thereby expose the first wiring line assembly 200 to the outside. To minimize interference of the signals transmitted through the first wiring line assembly 200 or other wiring lines to be formed on the organic insulating layer 320 the organic insulating layer 320 should bear a sufficient thickness. For that purpose, the etching condition should be established such that only the insulating layer 310 is etched while not etching the organic insulating layer 320. In such an etching condition, as the etching is made only through dry etching, the etching gas reacts in an isotropic manner. Therefore, as shown in FIG. 1C, the insulating layer 310 is etched up to the bottom of the organic insulating layer 320 so that undercut is made there.

Figure 1D:
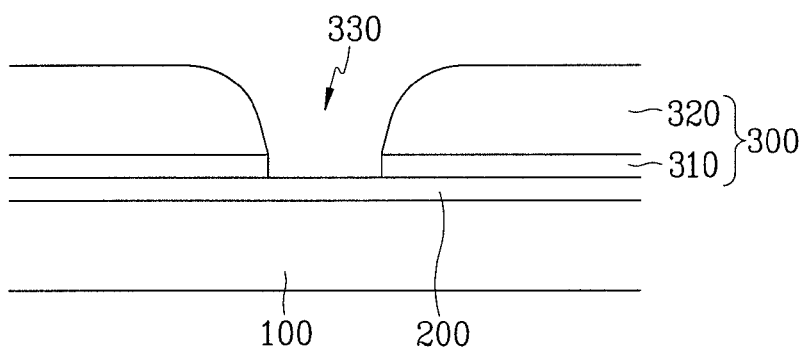
Figure 1E:
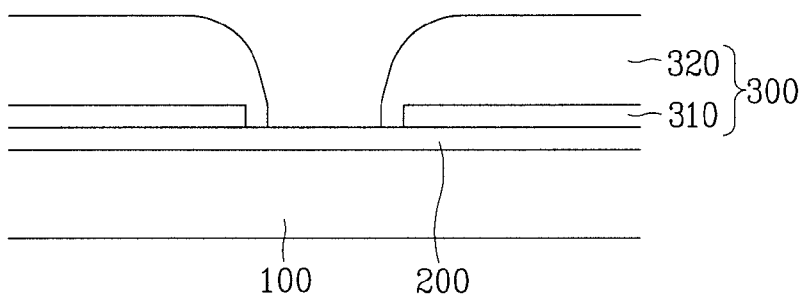

Thereafter, curing is made with respect to the organic insulating layer 320 to harden it and, at the same time, the organic insulating layer 320 is contracted or re-flown to the bottom of the contact hole 330 while removing the undercut structure. In the case where the contraction is predominated, as shown in FIG. 1D, the boundary of the organic insulating layer 320 outlining the contact hole 330 agrees with the boundary of the underlying insulating layer 310 outlining the contact hole 330, or proceeds over the insulating layer 310. In the case where the re-flowing is made during the curing process, as shown in FIG. 1E the boundary of the organic insulating layer 320 outlining the contact hole 330 may cover the boundary of the insulating layer 310. Ashing may be preferably made before the curing process to fluently transform the organic insulating layer 320 during the curing process. When the first wiring line assembly 200 is exposed through dry-etching the insulating layer 310 exposed through the contact hole 330, a solid film is formed on the surface of the organic insulating layer 320. Such a film prohibits transformation of the organic insulating layer 320 during the curing process. Therefore, the solid film should be removed from the surface of the organic insulating layer 320. The organic insulating layer 320 is reduced in thickness through the ashing such that it bears a thickness of about 1000 Å or less.

Figure 1F:
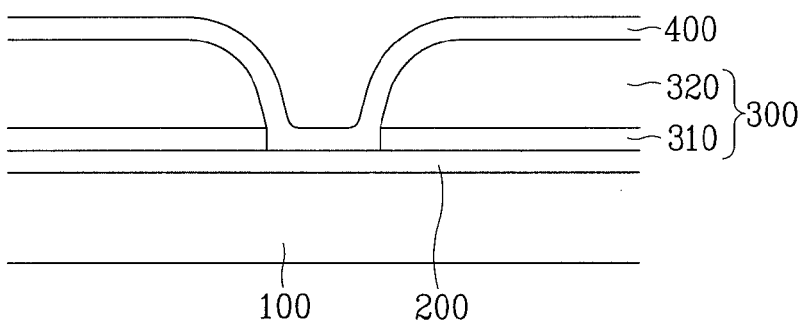
Figure 1G:
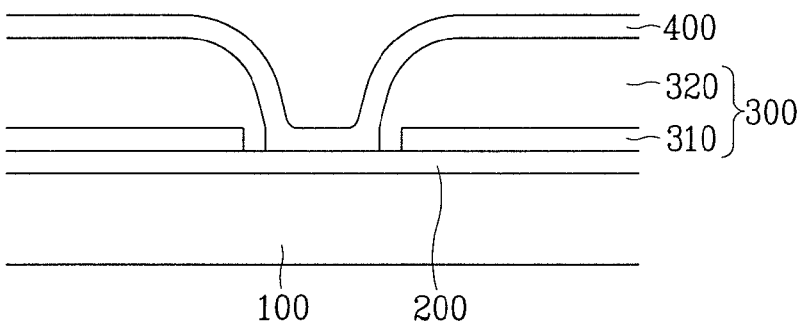

Thereafter, as shown in FIGS. 1F and 1G, a conductive material-based layer is deposited onto the organic insulating layer 320, and patterned through photolithography to thereby form a second wiring line assembly 400. The second wiring line assembly 400 is electrically connected to the first wiring line assembly 200 through the contact hole 330.

As described above, the inter-layered insulating layer 300 is formed with an organic material. The insulating layer 310 placed under the organic insulating layer 320 is etched through the contact hole 330 of the organic insulating layer 320, and curing is made with respect to the organic insulating layer 320 such that the undercut structure existent at the bottom of the organic insulating layer 320 is removed. Consequently, the second wiring line assembly 400 connected to the first wiring line assembly 200 through the contact hole 330 is prevented from being cut, and the second wiring line assembly 400 at the contact area bears a profile proceeding in a gradual manner.

It is possible that the layer overlaid with the organic insulating layer 320 is formed with a conductive material. For example, in the case where the conductive layer is etched up to the bottom of the organic insulating layer and undercut is made at the contact area, curing is made with respect to the organic insulating layer while removing the undercut structure.

Meanwhile, the above process may be well adapted for use in fabricating a thin film transistor array substrate for a liquid crystal display.

Figure 2:
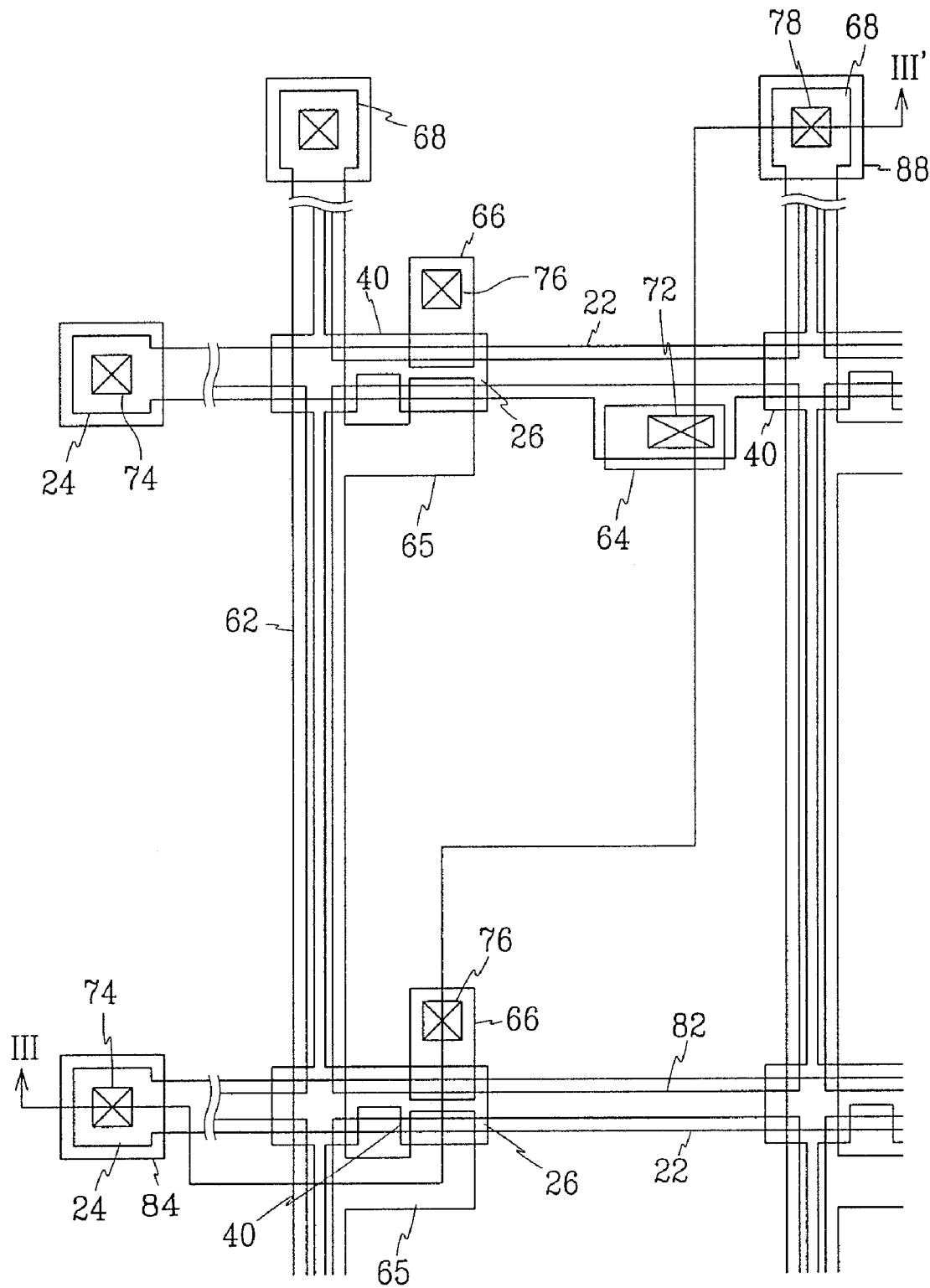
FIG. 2 is a plan view of a thin film transistor array substrate for a liquid crystal display according to a first preferred embodiment of the present disclosure.
Figure 3:
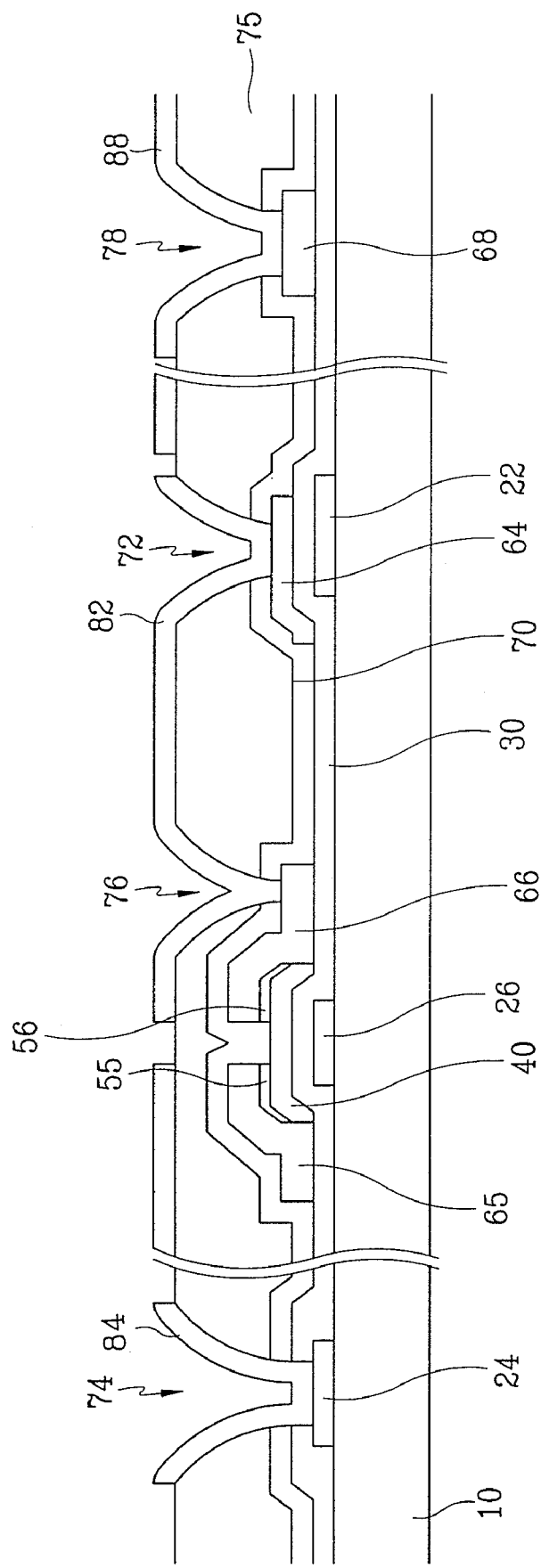
FIG. 3 is a cross sectional view of the thin film transistor array substrate taken along the III-III' line of FIG. 2.

FIG. 2 is a plan view of a thin film transistor array substrate for a liquid crystal display according to a first preferred embodiment of the present disclosure, and FIG. 3 is a cross sectional view of the thin film transistor array substrate taken along the III-III' line of FIG. 2.

A gate line assembly is formed on an insulating substrate 10 with a low resistance aluminum-based metallic material. The gate line assembly includes gate lines 22 proceeding in the horizontal direction, gate pads 24 connected to the gate lines 21 to receive gate signals from the outside and transmit them to the gate lines 22, and gate electrodes 26 connected to the gate lines 22 to form thin film transistors together with other electrode components.

The gate line assembly may be formed with an aluminum-based single-layered structure, or a multiple-layered structure. In the case where the gate line assembly is formed with a double-layered structure, it is preferable that one layer is formed with a low resistance material, and the other layer is formed with ITO, IZO, or a material bearing good contact characteristic with other materials, such as chrome and molybdenum.

A gate insulating layer 30 is formed on the substrate 10 with silicon nitride SiNx while covering the gate line assembly. The gate insulating layer 30 has contact holes 74 exposing the gate pads 24 together with a protective layer 70 to be formed later.

A semiconductor layer 40 is formed on the gate insulating layer 30 with amorphous silicon while being placed over the gate electrodes 26. Ohmic contact layers 55 and 56 are formed on the semiconductor layer 40 with $n^+$ hydrogenated amorphous silicon where silicide or n-type impurities are doped at high concentration while being separated from each other around the gate electrodes 26.

A data line assembly is formed on the ohmic contact layers 55 and 56 as well as on the gate insulating layer 30 with a metallic or conductive material such as aluminum Al, aluminum alloy, molybdenum Mo, molybdenum-tungsten alloy MoW, chrome Cr, and tantalum Ta. The data line assembly includes data lines 62 proceeding in the vertical direction while crossing over the gate lines 22 to define pixel regions, source electrodes 65 branched from the data lines 62 while being extended over the one-sided ohmic contact layer 54, data pads 68 connected to the one-sided ends of the data lines 62 to receive picture signals from the outside, and drain electrodes 66 separated from the source electrodes 64 around the gate electrodes 26 while being placed on the other-sided ohmic contact layer 56. The data line assembly may further include storage capacitor conductive patterns 64 that are overlapped with the gate lines 22 to form storage capacitors.

The data line assembly may be formed with an aluminum-based single-layered structure, or a multiple layered structure. In the case where the data line assembly is formed with a double-layered structure, it is preferable that one layer is formed with a low resistance material, and the other layer is formed with a material bearing good contact characteristic with other materials. For instance, Cr/Al (or Al alloy) or Al/Mo may be used for that purpose. In this case, the Cr-based layer has a function of preventing the aluminum or aluminum alloy-based layer from being diffused to the silicon-based layers 40, 55 and 56, as well as a function of securing the contact characteristic between the data line assembly and pixel electrodes 82 in a stable manner.

A protective layer 70 is formed on the data line assembly and the gate insulating layer 30 with silicon nitride, and an organic insulating layer 75 is formed on the protective layer 70 with a low dielectric acryl-based organic material bearing an excellent flattening characteristic. Contact holes 72, 76 and 78 are formed at the protective layer 70 while exposing the storage capacitor conductive patterns 64, the drain electrodes 66 and the data pads 68, respectively. Furthermore, contact holes 74 are formed at the protective layer 70 while exposing the gate pads 24 together with the gate insulating layer 30. The organic insulating layer 75 suffers curing so that the sidewall thereof defining the contact holes 72, 74, 76 and 78 is tapered to be gradually inclined by the range of about 30-60°. This smoothly guides the profile of subsidiary pads 84 and 88 and pixel electrodes 82 to be formed later. As shown in FIG. 3, the boundaries of the organic insulating layer 75 and the protective layer 70 outlining the contact holes 72, 74, 76 and 78 agree to each other. It is possible that the boundary of the organic insulating layer 75 at the contact area covers the boundary of the protective layer 70 or the gate insulating layer 30 while contacting the underlying wiring lines, or does not reach the latter while exposing the protective layer 70.

A pixel line assembly is formed on the organic insulating layer 75 with a transparent conductive material such as indium tin oxide (ITO) and indium zinc oxide (IZO). The pixel line assembly includes pixel electrodes 82 placed at the pixel regions while being connected to the drain electrodes 66 through the contact holes 76, and subsidiary gate and data pads 84 and 88 connected to the gate and the data pads 24 and 68 through the contact holes 74 and 78. As described herein, the organic insulating layer 75 is tapered at the contact area while bearing a gradual inclination degree. As the boundary of the protective layer 70 at the contact area agrees to that of the organic insulating layer 75, the pixel electrodes 82, the subsidiary gate pads 84 and the subsidiary data pads 88 have a gradual profile at the contract area while being prevented from being cut.

As shown in FIGS. 2 and 3, the pixel electrodes 82 are overlapped with the gate lines 22 to thereby form storage capacitors. In the case where the storage capacity is deficient, a storage capacitor line assembly may be additionally formed at the same plane as the gate line assembly.

A method of fabricating the thin film transistor array substrate will be now explained with reference to FIGS. 4A to 9 as well as FIGS. 2 and 3.

Figure 4A:
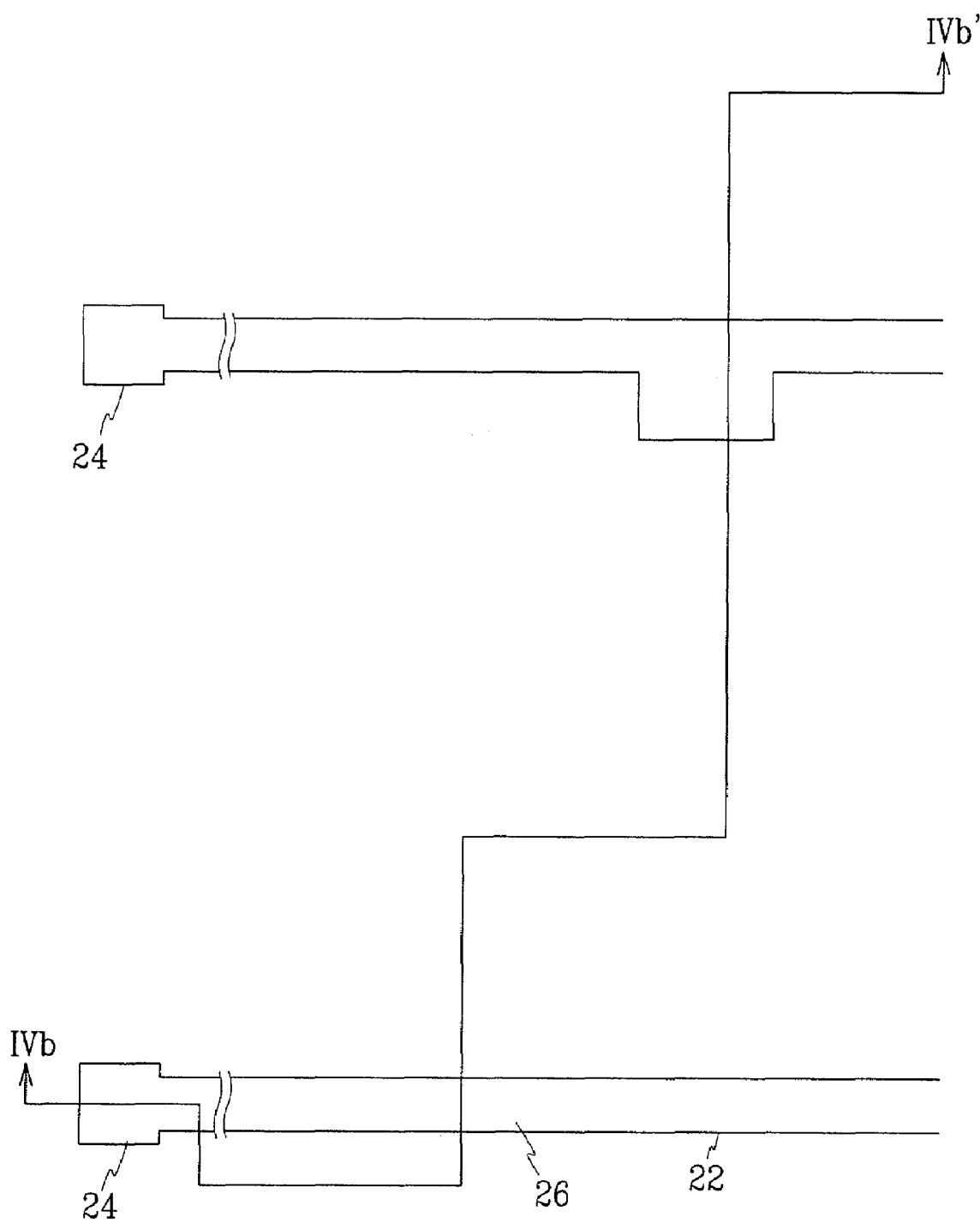
FIGS. 4A, 5A, 6A and 7A sequentially illustrate the steps of fabricating the thin film transistor array substrate shown in FIG. 2.

As shown in FIGS. 4A and 4B, a conductive layer based on a conductive material bearing an excellent contact characteristic with other materials or a low resistance conductive material such as aluminum, aluminum alloy, silver and silver alloy is deposited onto a substrate 10, and patterned to thereby form a gate line assembly. The gate line assembly has gate lines 22, gate electrodes 26, and gate pads 24.

Figure 5A:
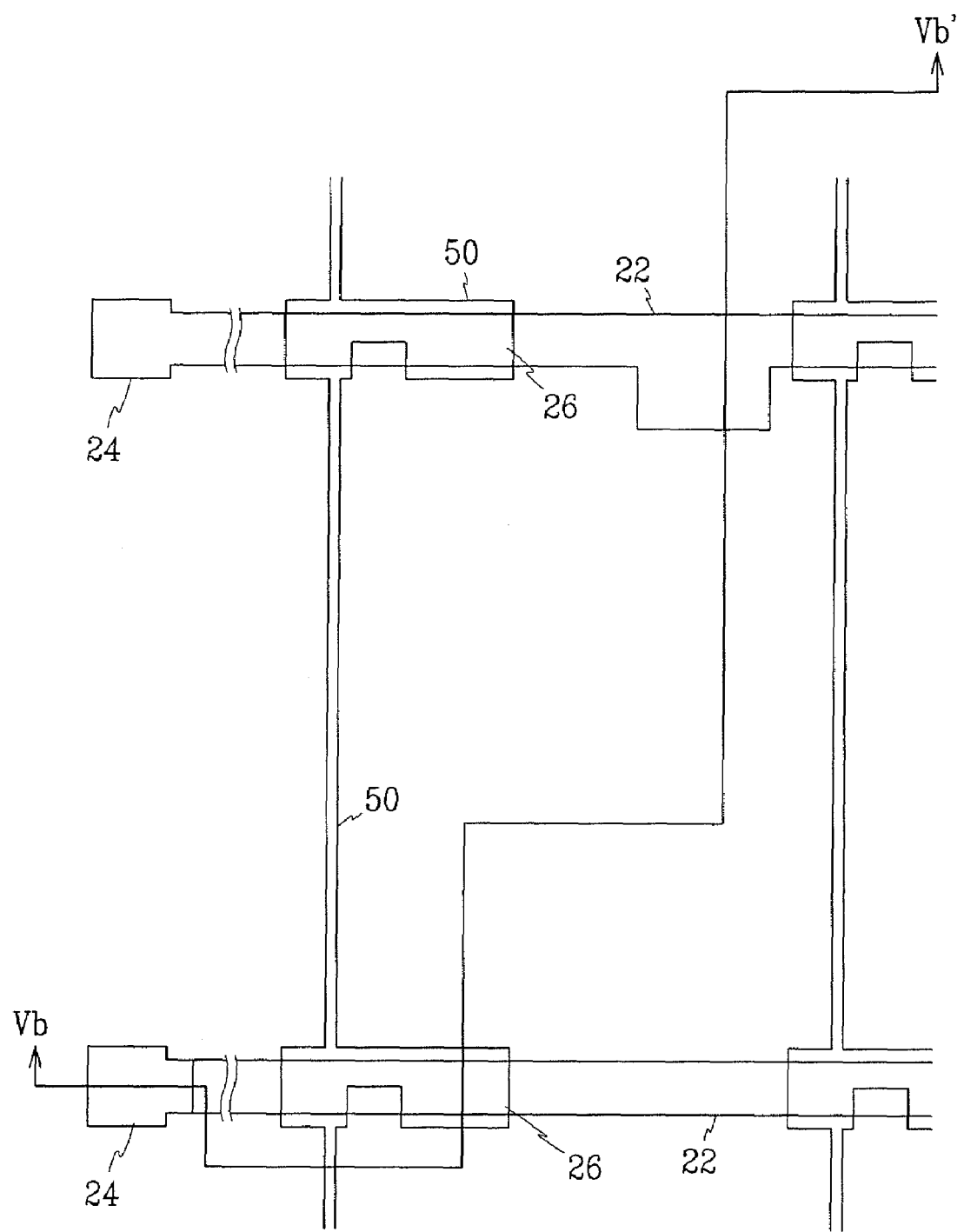

Thereafter, as shown in FIGS. 5A and 5B, a gate insulating layer 30, an amorphous silicon layer 40 and a doped amorphous silicon layer 50 are sequentially deposited onto the substrate 10, and the amorphous silicon layer 40 and the doped amorphous silicon layer 50 are patterned to thereby form a semiconductor layer 40, and an ohmic contact layer 50 on the gate insulating layer 30 over the gate electrodes 24. The semiconductor layer 40, and the ohmic contact layer 50 may be formed along data lines 62 to be formed later.

Figure 6A:
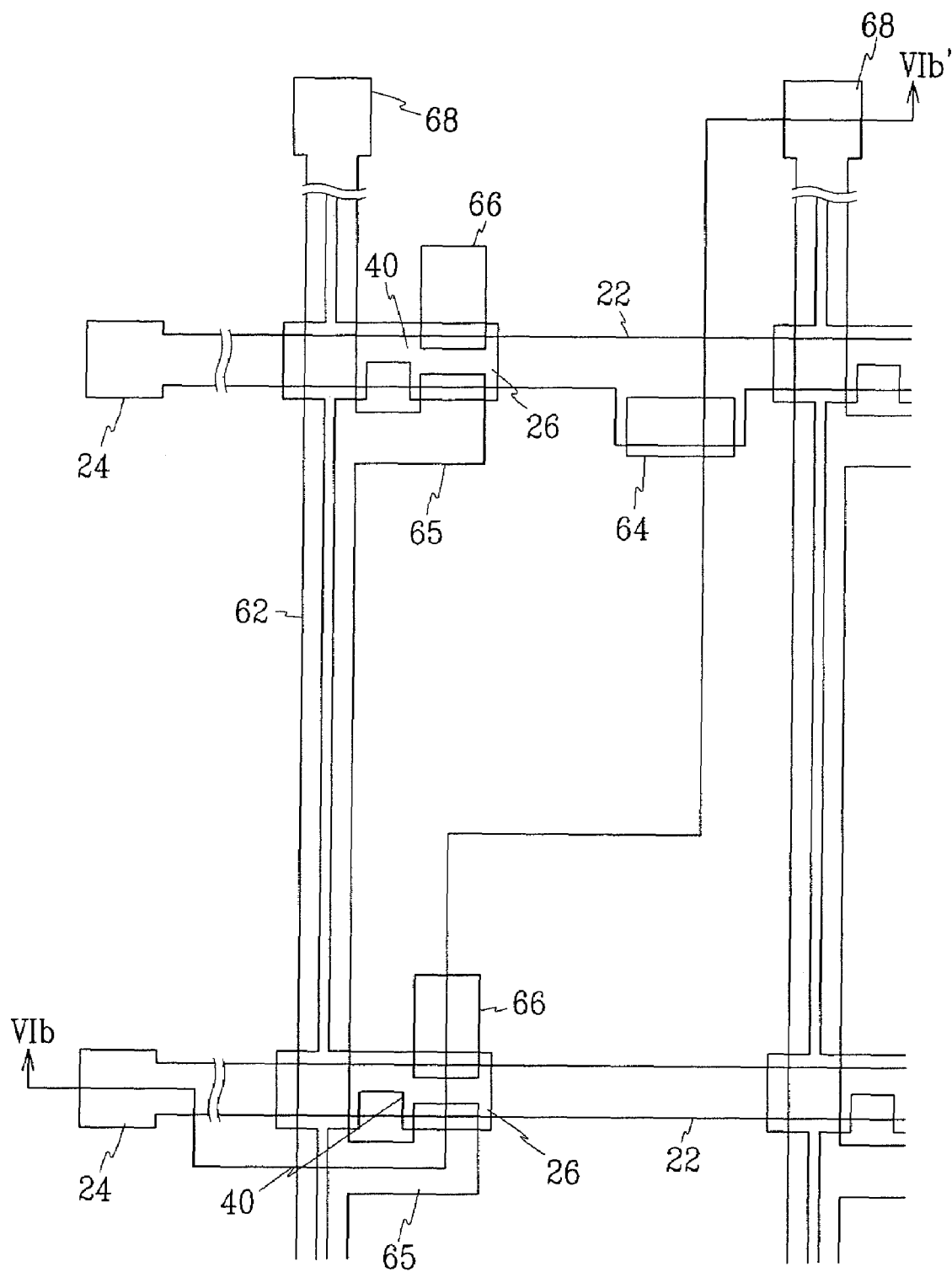

As shown in FIGS. 6A and 6B, a conductive layer based on a conductive material such as chrome, molybdenum, molybdenum alloy, aluminum, aluminum alloy, silver and silver alloy is deposited onto the substrate 10, and patterned through photolithography to thereby form a data line assembly. The data line assembly includes data lines 62 crossing over the gate lines 22, source electrodes connected to the data lines 62 while being extended over the gate electrodes 26, data pads 68 connected to the one-sided ends of the data lines 62, drain electrodes 66 facing the source electrodes 66 around the gate electrodes while being separated from the source electrodes 65, and storage capacitor conductive patterns 64 overlapped with the gate lines 22.

The doped amorphous silicon layer 50 exposed through the data line assembly is etched such that it is separated into two portions 55 and 56 around the gate electrode 26 while exposing the semiconductor layer 40 between them. Thereafter, oxygen plasma is preferably made with respect to the semiconductor layer 40 to stabilize the exposed surface thereof.

Figure 7A:
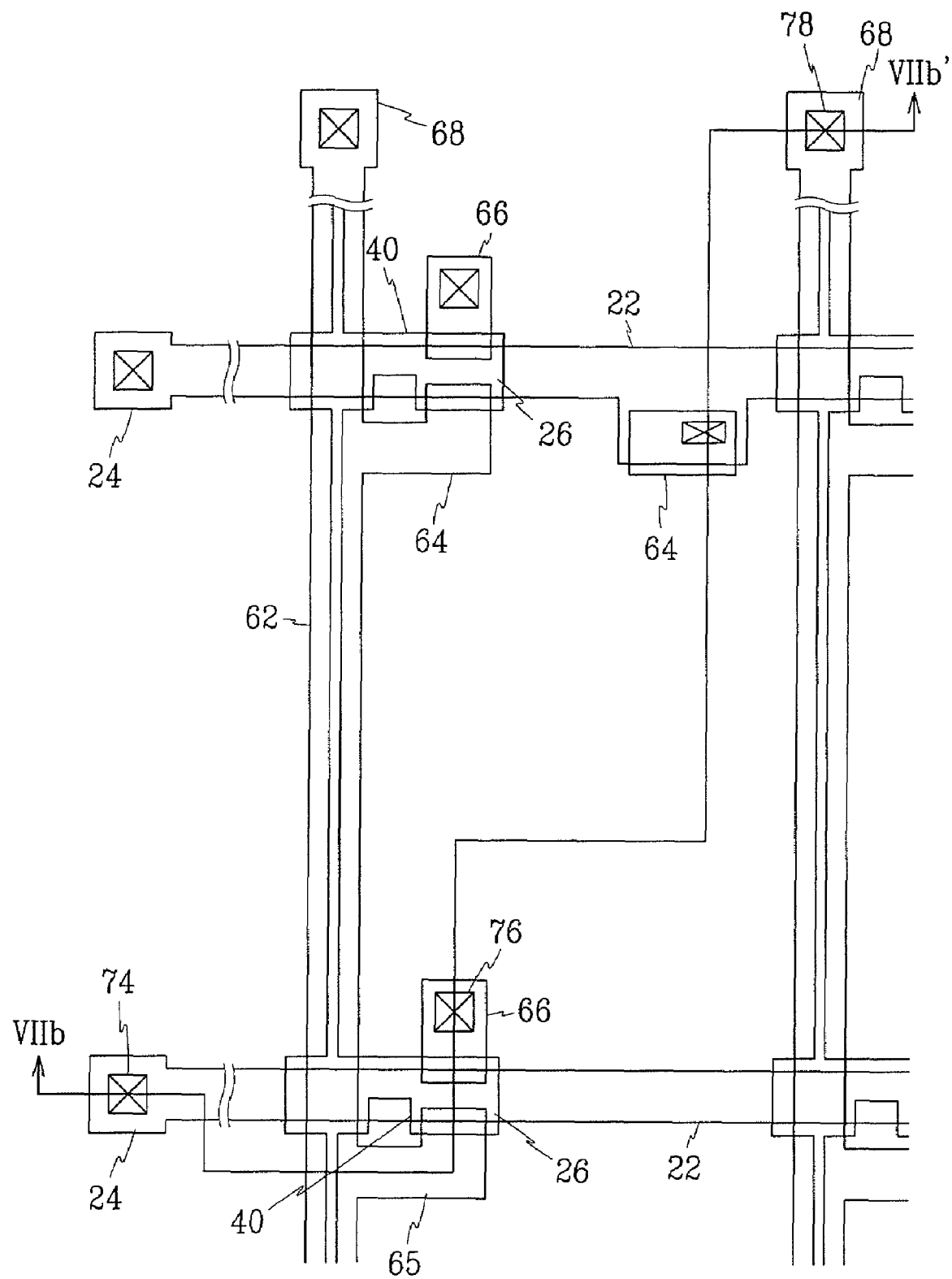
Figure 7B:
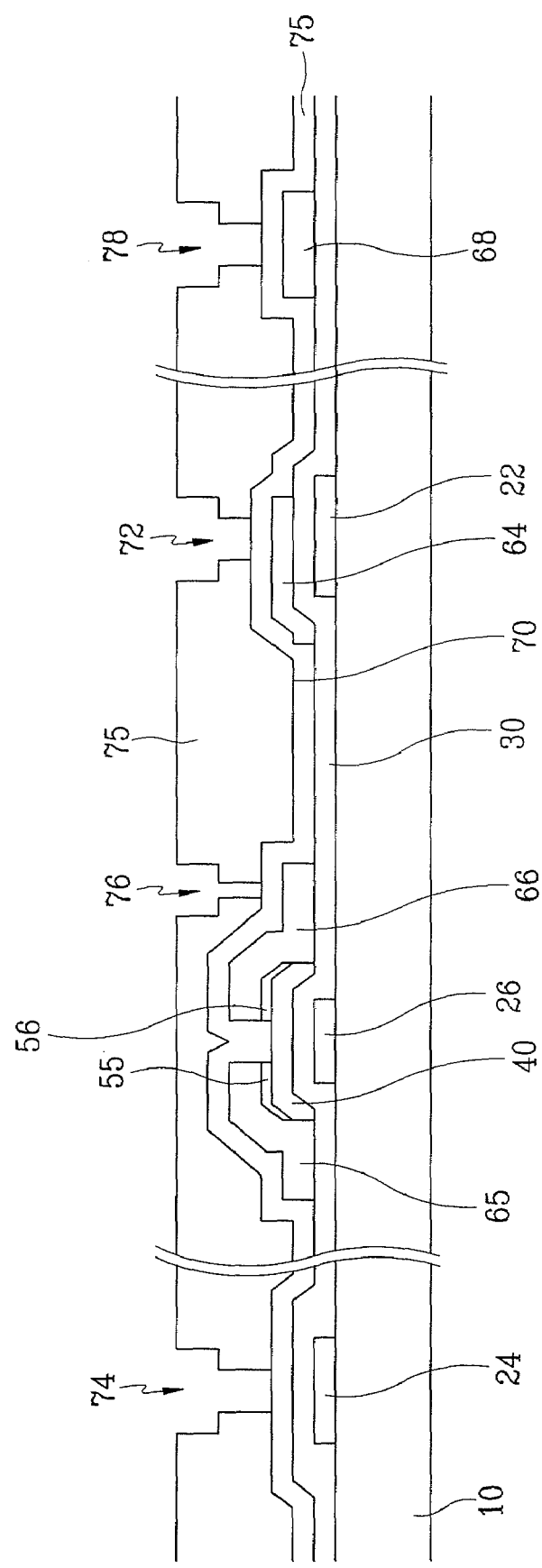
FIG. 7B is a cross sectional view of the thin film transistor array substrate taken along the VIIb-VIIb' line of FIG. 7A.

As shown in FIGS. 7A and 7B a protective layer 70 based on silicon nitride is deposited onto the substrate 10 such that it bears a thickness of about 2000 Å or less, and preferably of about 1000 Å or less. An organic insulating layer 75 is formed on the protective layer 70 with a photosensitive organic insulating material such that it bears a thickness of about 2-4 μm. The organic insulating layer 75 is patterned through photolithography based on a mask to thereby form contact holes 72, 74, 76 and 78 exposing the storage capacitor conductive patterns 64, the gate pads 24, the drain electrodes 66 and the data pads 68, respectively. To process the sidewall of the organic insulating layer 75 defining the contact holes 71, 74, 76 and 78 in a gradual manner, a semitransparent region is provided at the mask around the light transmission region thereof with a slit or lattice-shaped pattern or a semitransparent film. Consequently, the organic insulating layer 75 around the contact holes 72, 74, 76 and 78 can bear a relatively thin thickness.

Figure 8:
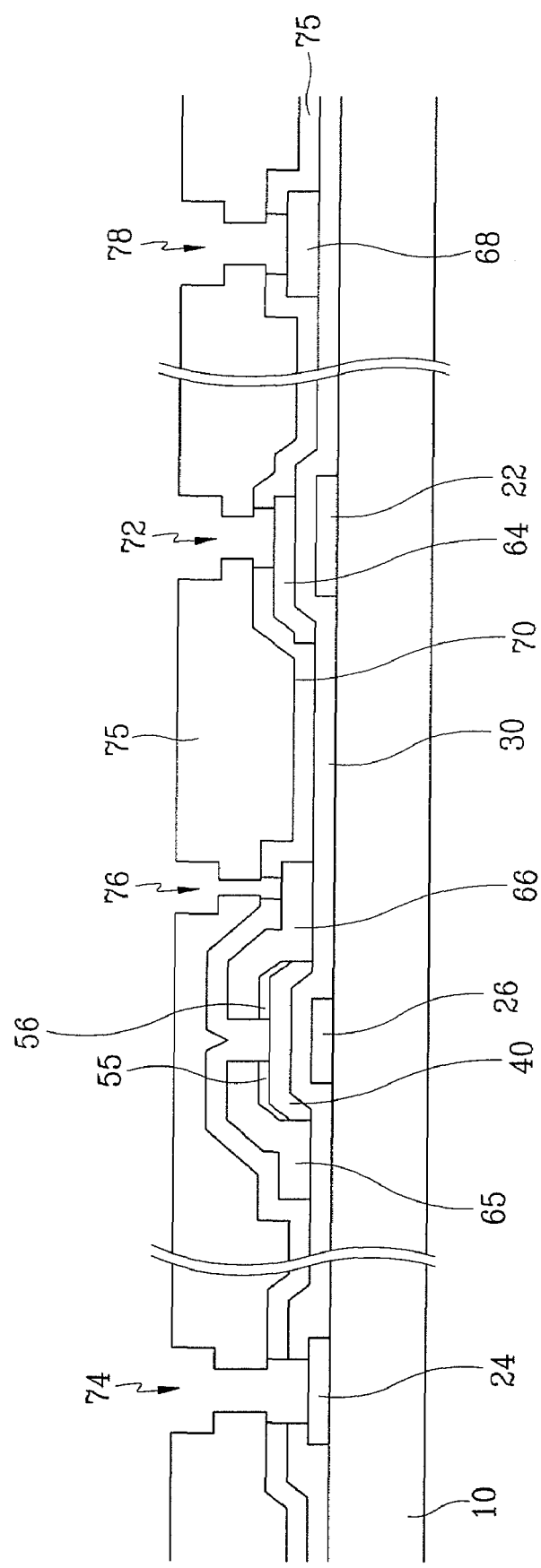
FIG. 8 illustrates the step of fabricating the thin film transistor array substrate following the step illustrated in FIG. 73B.

Thereafter, as shown in FIG. 8, the protective layer 70 and the gate insulating layer 30 exposed through the contact holes 72, 74, 76 and 78 are etched in condition that the organic insulating layer 75 is not etched, thereby exposing the storage capacitor conductive patterns 64, the gate pads 24, the drain electrodes 66 and the data pads 68. Dry etching is preferably made with respect to the protective layer 70 while using $SF_6+O_2$ or $CF_4+O_2$ as the etching gas. Even if the protective layer 70 and the gate insulating layer 30 are etched through the dry etching, they are etched up to the bottom of the organic insulating layer 75 so that undercut is made there.

Figure 9:
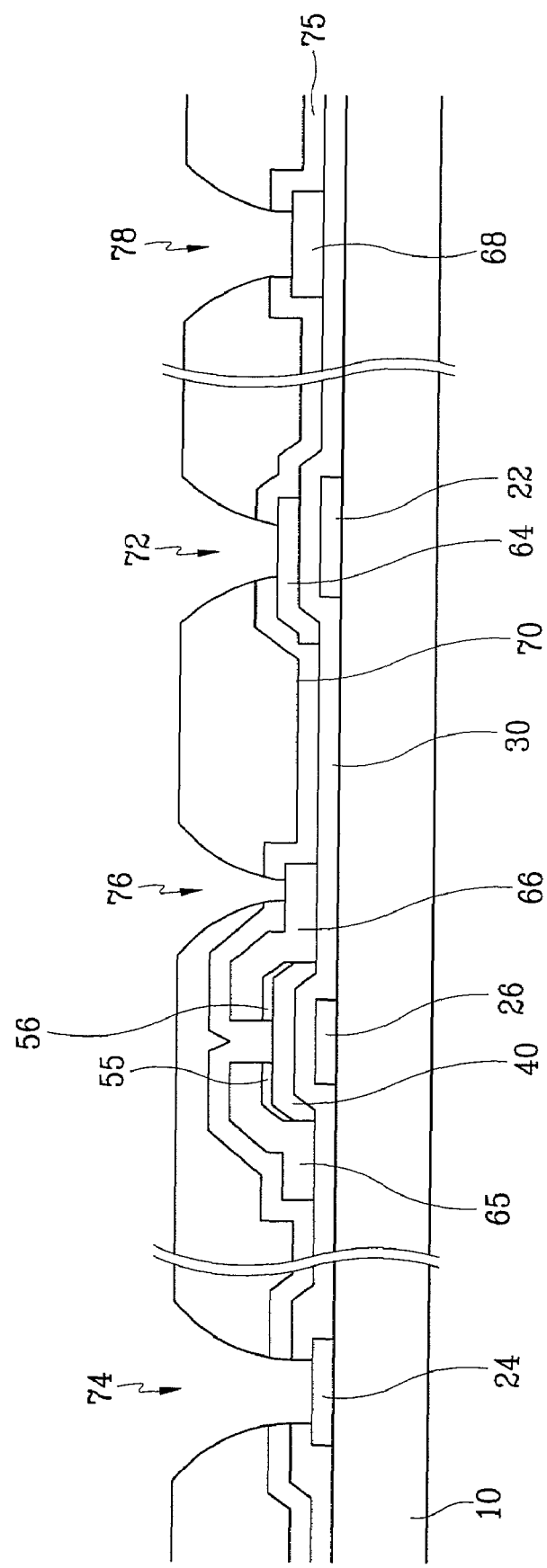
FIG. 9 illustrates the step of fabricating the thin film transistor array substrate following the step illustrated in FIG. 8.

To harden the organic insulating layer 75 while contracting or re-flowing it, curing is made with respect thereto in the temperature range of about 150-350° C., preferably about 200-300° C. Consequently, as shown in FIG. 9, the organic insulating layer 75 is contracted up to the contact holes 72, 74, 76 and 78 defined by the protective layer 70 or the gate insulating layer 30 so that the undercut structure is removed at the contact area. Therefore, the sidewall of the organic insulating layer 75 defining the contact holes 72, 74, 76 and 78 can bear step coverage with a gradual inclination degree. In this preferred embodiment, as the contraction of the organic insulating layer 75 is predominated during the curing process, the boundary of the protective layer 70 or the gate insulating layer 30 at the contact area agrees with that of the organic insulating layer 75. By contrast in the case where the re-flowing of the organic insulating layer 75 is predominated, the organic insulating layer 75 is re-flown to the boundary of the protective layer 70 or the gate insulating layer 30 at the contact area so that the organic insulating layer 75 may completely cover the protective layer 70 or the gate insulating layer 30. In this way, after the contact holes 72, 74, 76 and 78 are formed at the protective layer 70 and the gate insulating layer 30 through etching, curing is made thereto so that the sidewall of the protective layer 70 and the gate insulating layer 30 at the contact area can be formed in a gradual manner. The sidewall of the organic insulating layer 75 at the contact area bears a tapering structure with an inclination degree of about 30-60°.

Finally, as shown in FIGS. 2 and 3, an ITO or IZO-based layer is deposited onto the substrate 10, and patterned through a mask to thereby form pixel electrodes 82, and subsidiary gate and data pads 84 and 88. The pixel electrodes 82 are connected to the storage capacitor conductive patterns 64 and the drain electrodes 66 through the contact holes 72 and 76. The subsidiary gate and data pads 84 and 88 are connected to the gate pads 24 and the data pads 68 through the contact holes 74 and 78, respectively. As the undercut structure at the contact area can be removed through the curing process, the pixel electrodes 82, and the subsidiary gate and data pads 84 and 88 are prevented from being cut at the contact area while bearing a profile proceeding in a gradual manner.

As described above, in this preferred embodiment, the layer overlaid with the organic insulating layer is etched while exposing the underlying wiring line components, and the organic insulating layer suffers curing. In this way, the organic insulating layer may have a sufficient thickness while bearing a contact profile proceeding in a gradual manner. Furthermore, the contact structure can be formed through only one photolithography process, thereby simplifying the relevant processing steps.

Alternatively, the above process may be made using only four masks.

Figure 10:
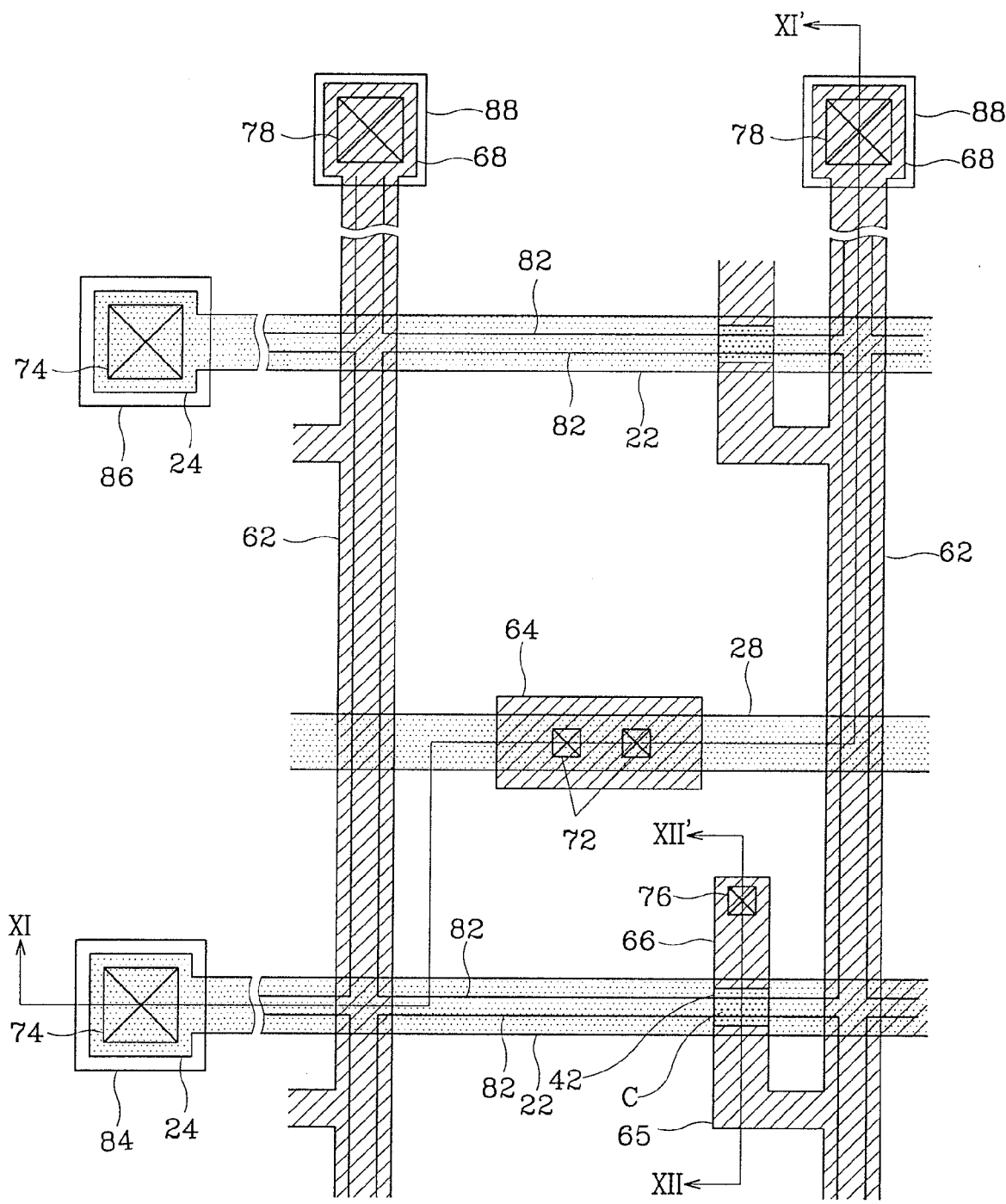
FIG. 10 is a plan view of a thin film transistor array substrate for a liquid crystal display according to a second preferred embodiment of the present disclosure.
Figure 11:
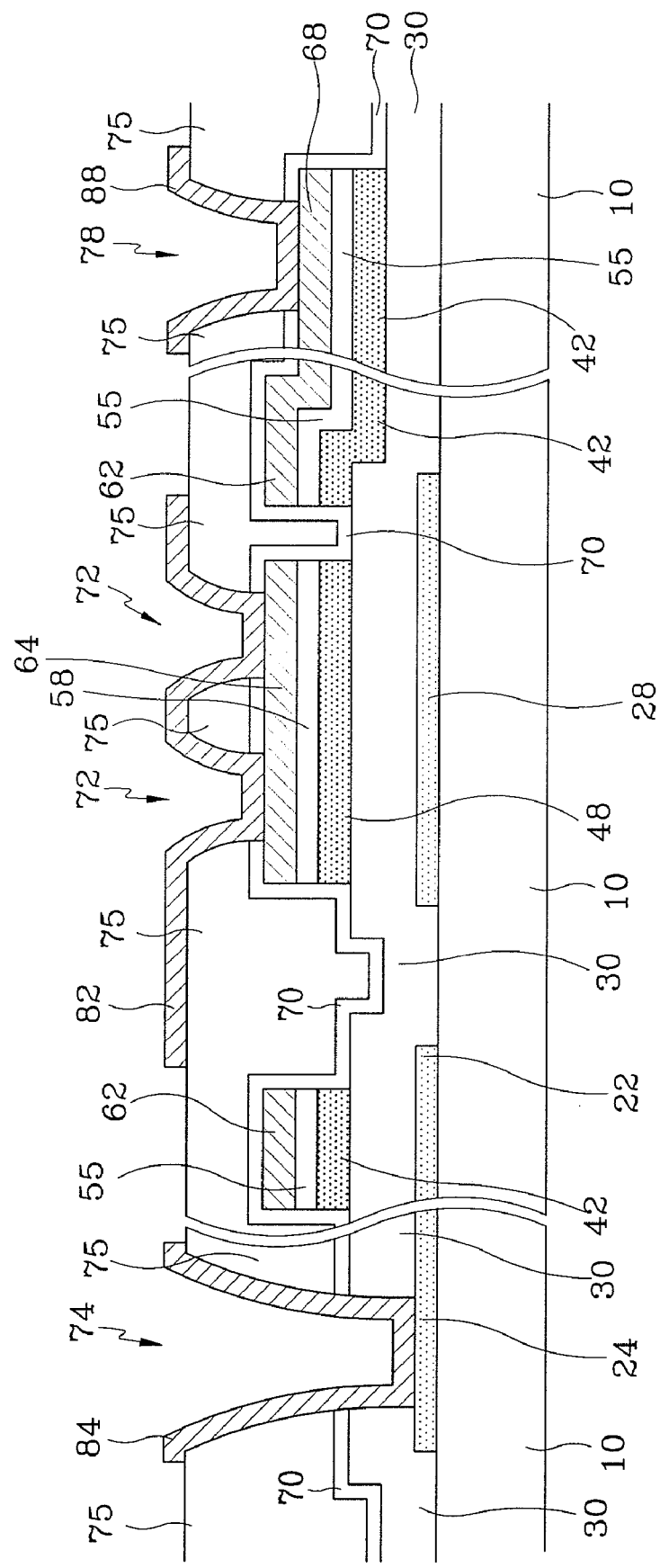

FIG. 10 is a plan view of a thin film transistor array substrate for a liquid crystal display according to a second preferred embodiment of the present disclosure, and FIGS. 11 and 12 are cross sectional views of the thin film transistor array substrate taken along the XI-XI' line and the XII-XII' line of FIG. 10.

A gate line assembly is formed on an insulating substrate 10 with a low resistance conductive material such as aluminum, aluminum alloy, silver and silver alloy. The gate line assembly includes gate lines 22, gate pads 24, and gate electrodes 26. The gate line assembly further includes storage capacitor electrodes 28 proceeding parallel to the gate lines 22 to receive common electrode voltages from the outside. The storage capacitor electrodes 28 are overlapped with storage capacitor conductive patterns 68 connected to pixel electrodes 82 to thereby form storage capacitors for enhancing the electric potential storage capacity of the pixels. In the case where a sufficient storage to capacity is obtained with the overlapping of the pixel electrodes 82 and the gate lines 22, the storage capacitor electrodes 28 may be omitted.

A gate insulating layer 30 is formed on the gate line assembly with silicon nitride SiNx while covering the gate line assembly.

Semiconductor patterns 42 and 48 are formed on the gate insulating layer 30 with hydrogenated amorphous silicon. Ohmic contact patterns 55, 56 and 58 are formed on the semiconductor patterns 42 and 48 with amorphous silicon where n type impurities such as phosphorous P are doped at high concentration.

A data line assembly is formed on the ohmic contact patterns 55, 56 and 58 with a low resistance aluminum-based conductive material. The data line assembly includes a data line unit with data lines 62 proceeding in the vertical direction, data pads 68 connected to the one-sided ends of the data lines 62 to receive picture signals from the outside, and source electrodes 65 branched from the data lines 62. The data line assembly further includes drain electrodes 66 facing the source electrodes 65 around the gate electrodes 26 or the channel portions C while being separated from the source electrodes 65 and storage capacitor conductive patterns 64 placed over the storage capacitor electrodes 28. In the case where the storage capacitor electrodes 28 are absent the storage capacitor conductive patterns 64 are also omitted.

The ohmic contact patterns 55, 56 and 58 lower the contact resistance between the semiconductor patterns 42 and 48 and the data line assembly while bearing the same shape as the data line assembly. For example, the data line unit ohmic contact pattern 55 has the same shape as the data line unit 62, 65 and 68, and the drain electrode ohmic contact pattern 56 has the same shape as the drain electrode 66, and the storage capacitor ohmic contact pattern 58 has the same shape as the storage capacitor conductive pattern 64.

Meanwhile, the semiconductor patterns 42 and 48 have the same shape as the data line assembly and the ohmic contact patterns 55, 56 and 58 except for the channel portions C. Preferably, the storage capacitor semiconductor pattern 48, the storage capacitor conductive pattern 64 and the storage capacitor ohmic contact pattern 58 have the same shape, but the thin film transistor to semiconductor pattern 42 slightly differs from the data line assembly and the ohmic contact patterns. For example, the source and the drain electrodes 65 and 66 are separated from each other at the channel portion C, and the data line unit ohmic contact pattern 55 and the drain electrode ohmic contact pattern 56 are also separated from each other at the channel portion C. However, the thin film transistor semiconductor pattern 42 continuously proceeds at the channel portion C without separation to thereby form a thin film transistor channel.

A protective layer 70 and an organic insulating layer 75 are formed on the data line assembly while bearing contact holes 76, 78 and 72 exposing the drain electrodes 66, the data pads 68, and the storage capacitor conductive patterns 64, respectively. Furthermore, the protective layer 70 and the organic insulating layer 75 have contact holes 74 exposing the gate pads 24 together with the gate insulating layer 30. The sidewall of the organic insulating layer 75 outlining the contact holes 72, 74, 76 and 78 is inclined in a gradual manner.

Pixel electrodes 82 are formed on the organic insulating layer 75 to receive picture signals from the thin film transistors and form electric fields together with a common electrode formed at the counter substrate. The pixel electrodes 82 are formed with a transparent conductive material such as indium zinc oxide (IZO) and indium tin oxide (ITO). The pixel electrodes 82 are electrically connected to the drain electrodes 66 through the contact holes 76 to receive the picture signals. Furthermore, the pixel electrodes 82 are overlapped with the neighboring gate lines 22 and data lines 62 to enhance the opening or aperture ratio. The overlapping may be omitted. In addition, the pixel electrodes 82 are connected to the storage capacitor conductive patterns 64 through the contact holes 72 to transmit the picture signals to the conductive patterns 64. Subsidiary gate and data pads 84 and 88 are formed over the gate and the data pads 24 and 68 while being connected thereto through the contact holes 74 and 78 to reinforce the adhesive strength of the pads 24 and 68 to external circuits while protecting the pads. The subsidiary gate and data pads 84 and 88 are not necessary, but may be selectively introduced. As the organic insulating layer 75 has a tapering structure at the contact holes 72, 74, 76 and 78 to with a gradual inclination degree, the pixel electrodes 82, and the subsidiary gate and data pads 84 and 88 can bear a profile with a gradual inclination degree at the contact area.

In the case of a reflective type liquid crystal display, the pixel electrodes 82 may be formed with an opaque conductive material.

A method of fabricating the thin film transistor array substrate will be now explained with reference to FIGS. 13A to 19C as well as FIGS. 10 to 12.

Figure 13A:
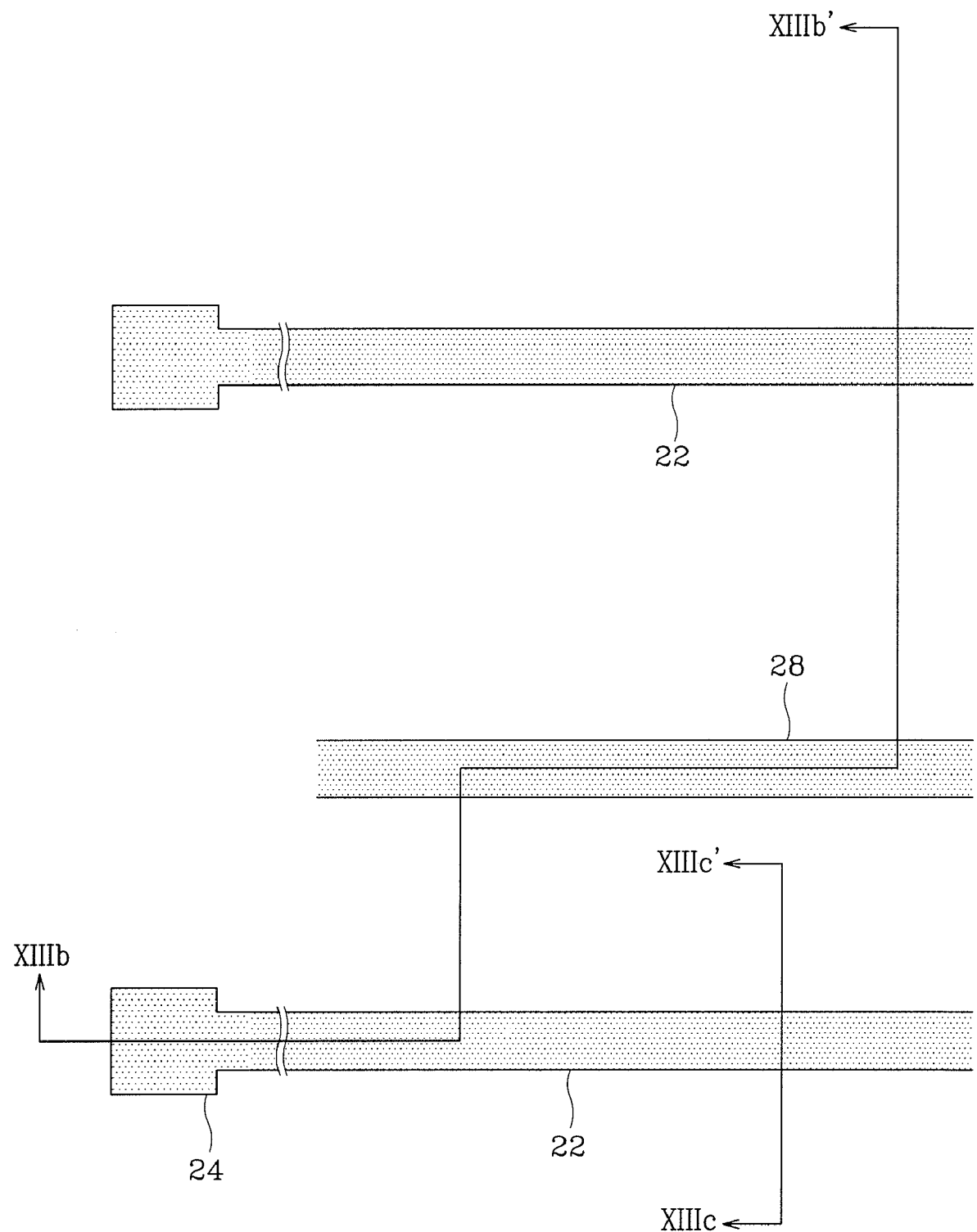
FIG. 13A illustrates the first step of fabricating the thin film transistor array substrate shown in FIG. 10.
Figure 13B:
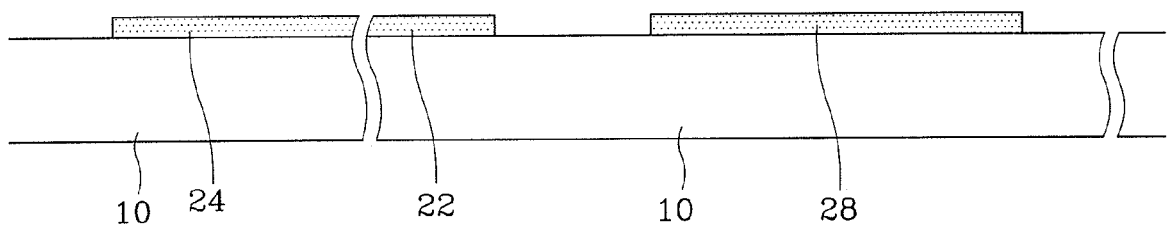
FIGS. 13B and 13C are cross sectional views of the thin film transistor array substrate taken along the XIIIb-XIIIb' line and the XIIIc-XIIIc' line of FIG. 13A.
Figure 13C:
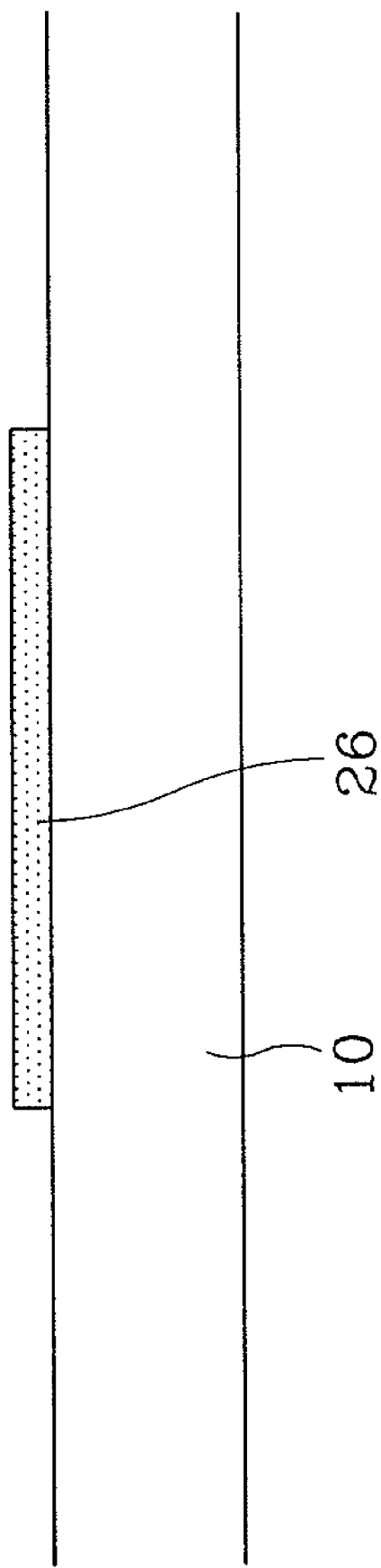

As shown in FIGS. 13A to 13C, a conductive layer is deposited onto a substrate 10, and patterned through photolithography based on a first mask to thereby form a gate line assembly. The gate line assembly has gate lines 22, gate pads 24, gate electrodes 26, and storage capacitor electrodes 28.

Figure 14A:
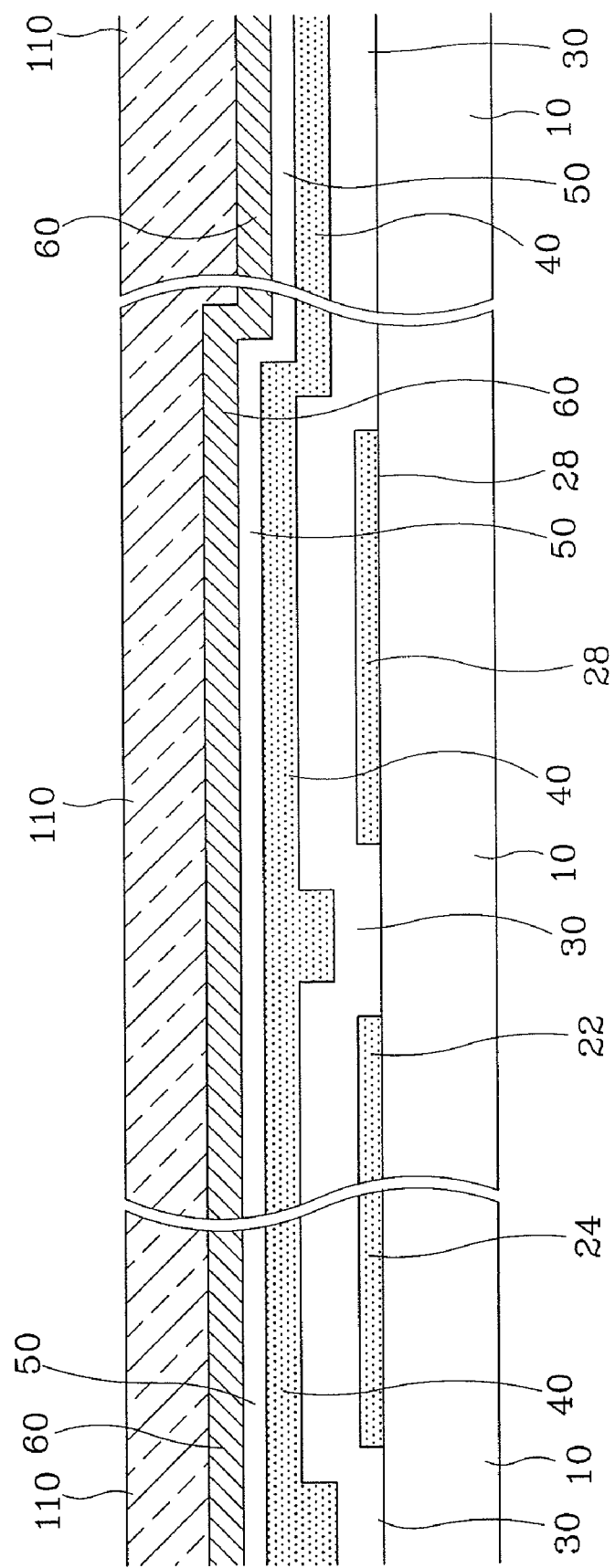

Thereafter, as shown in FIGS. 14A and 14B, a gate insulating layer 30, a semiconductor layer 40 and an ohmic contact layer 50 are sequentially deposited onto the substrate 10 by way of chemical vapor deposition such that they bear a thickness of about 1500-5000 Å, about 500-2000 Å and about 300-600 Å, respectively. A conductive layer 60 based on a low resistance conductive material is deposited onto the substrate 10 by way of sputtering such that it bears a thickness of about 1500-3000 Å. A photoresist film 110 with a thickness of about 1-2 μm is then coated onto the conductive layer 60.

Figure 15A:
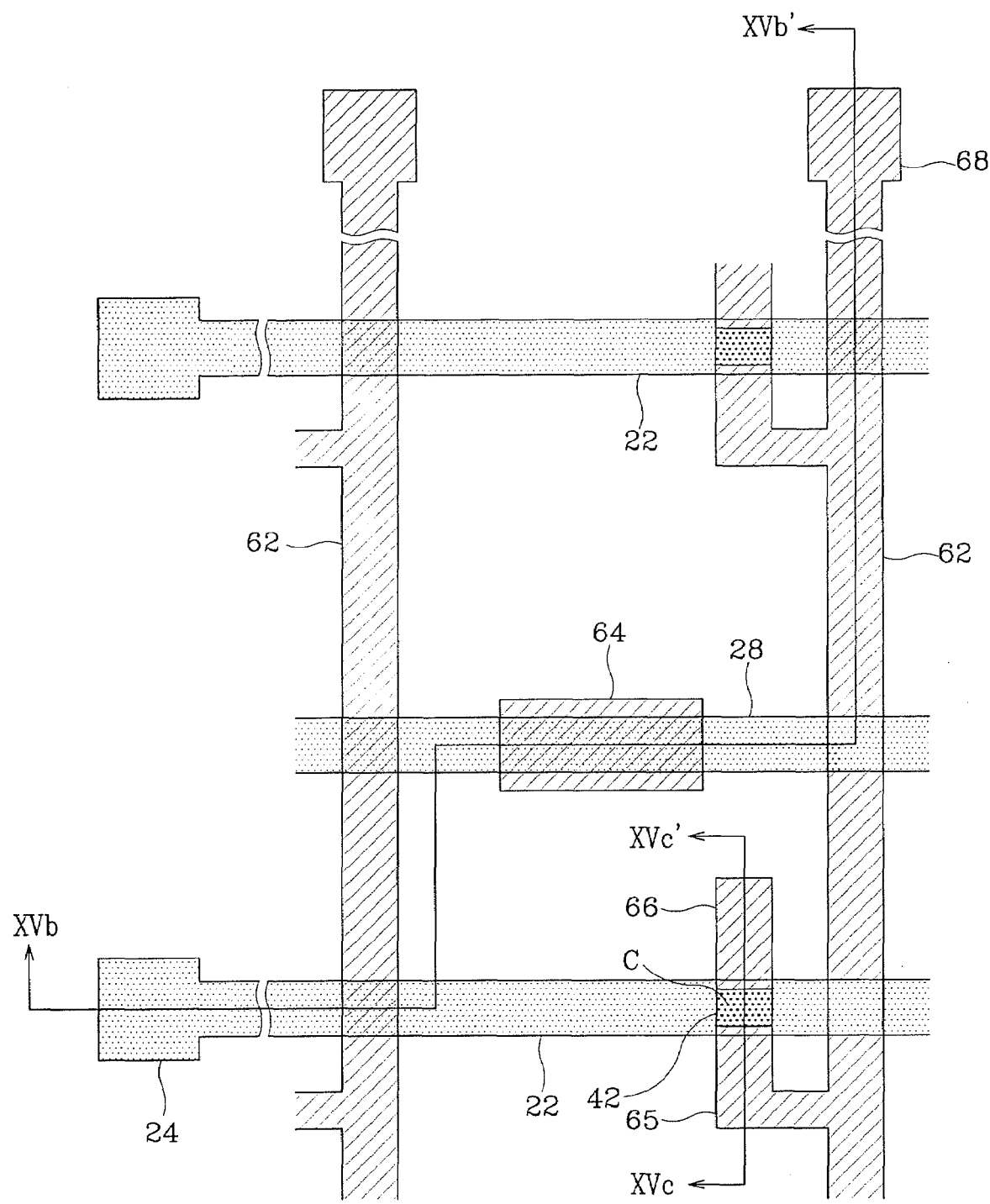
FIG. 15A illustrates the step of fabricating the thin film transistor array substrate following the step illustrated in FIGS. 14A and 14B.
Figure 15B:
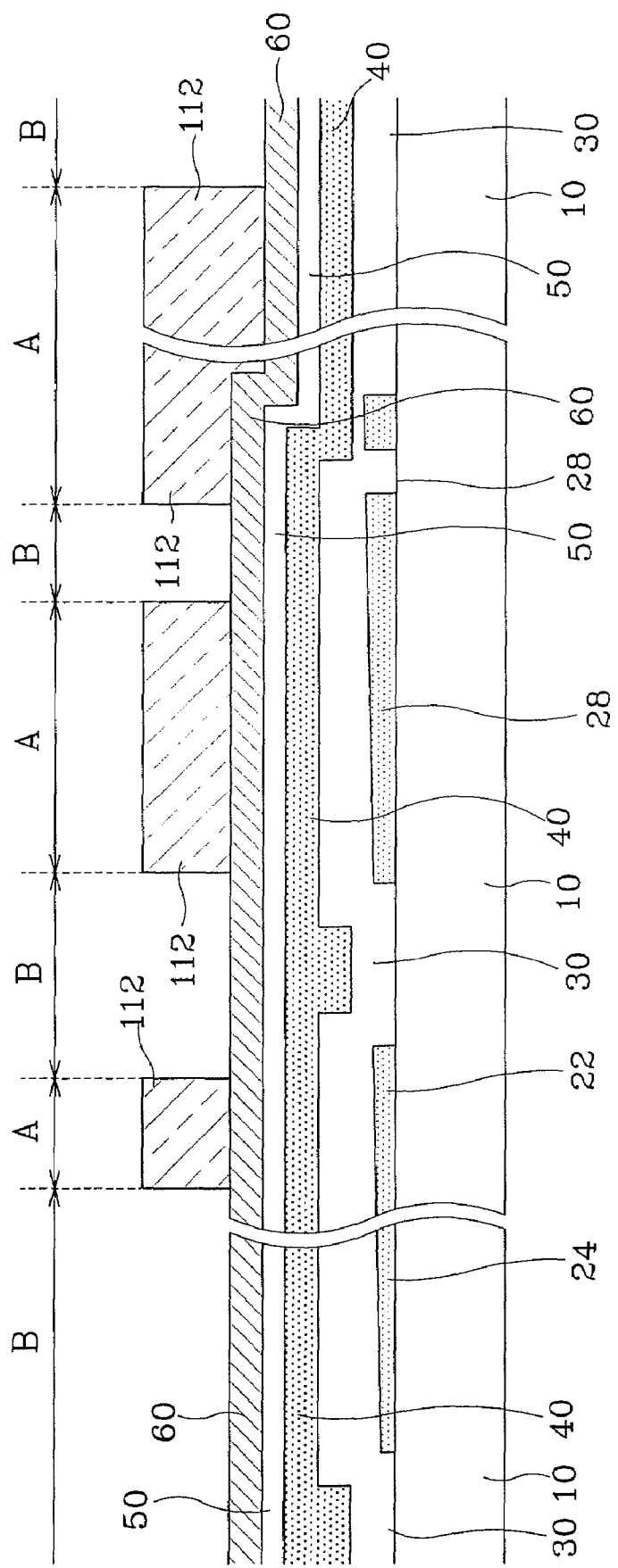
FIGS. 15B and 15C are cross sectional views of the thin film transistor array substrate taken along the XVb-XVb' line and the XVc-XVc' line of FIG. 15A.
Figure 15C:
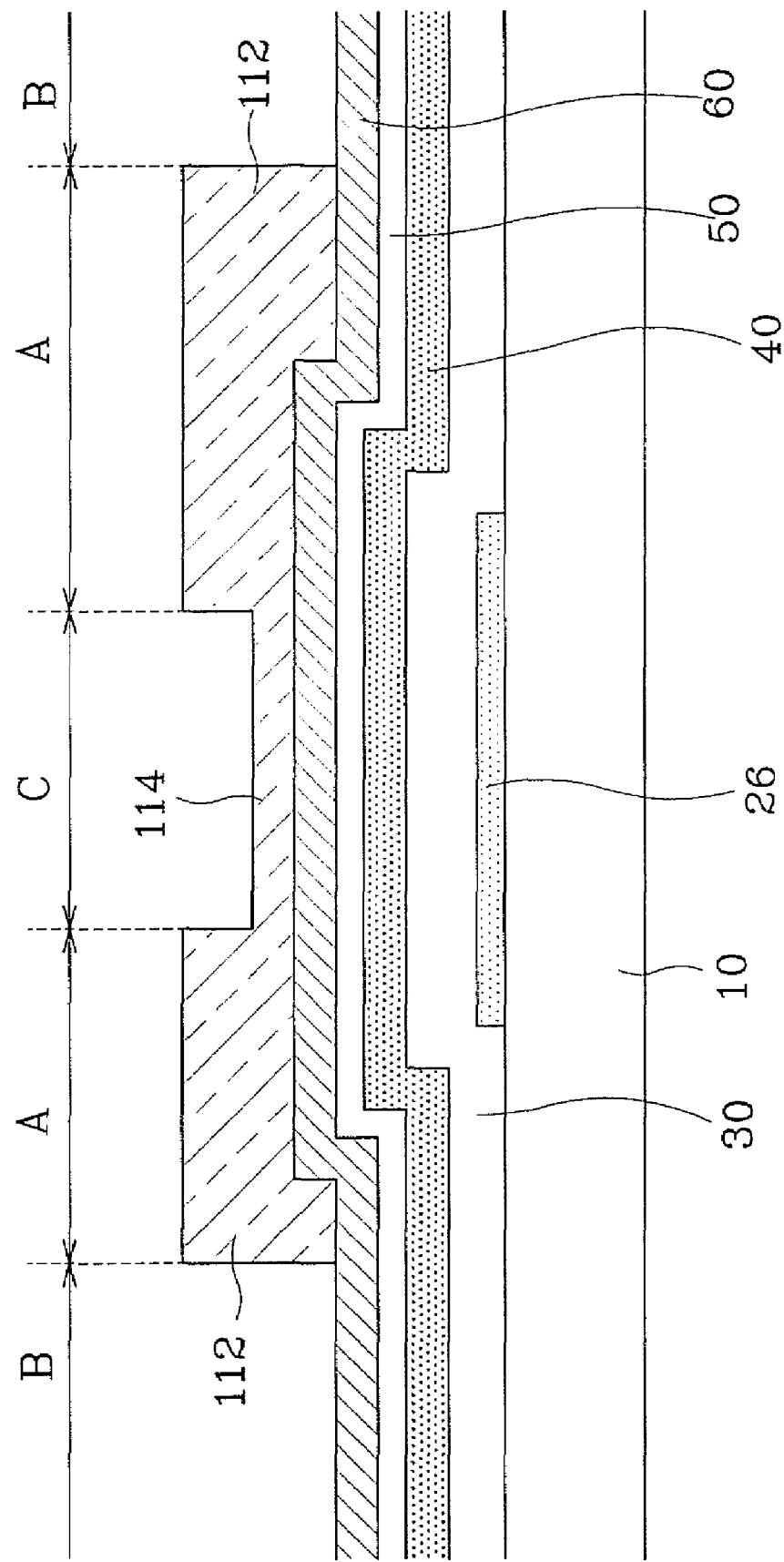

As shown in FIGS. 15B and 15C, the photoresist film 110 is then exposed to light through a second mask, and developed to thereby form a photoresist pattern with first and second pattern portions 114 and 112. The first photoresist pattern portion 114 is placed at the channel area C between the source and the drain electrodes 65 and 66, and the second photoresist pattern portion 112 is placed at the data line assembly area A. The first photoresist pattern portion 114 is established to bear a thickness smaller than that of the second photoresist pattern portion 112. The photoresist film portion at the remaining area B is all removed. The thickness ratio of the first photoresist pattern portion 114 to the second photoresist pattern portion 112 should be controlled to be varied depending upon the etching conditions at the subsequent processing steps. It is preferable that the thickness of the first photoresist pattern portion 114 should be established to be ½ or less of the thickness of the second photoresist pattern portion 112, for instance to be about 4000 Å or less.

To differentiate the thickness of the photoresist film, a semi-transmission region may be formed at the mask with a slit or lattice pattern or a semitransparent film. Of course, this technique may be also used in the case where during the process of fabricating the thin film transistor array substrate according to the first preferred embodiment, the portion of the organic insulating layer 75 surrounding the contact holes 72, 74, 76 and 78 is established to be thinner than other portions.

It is preferable that the patterning width should be smaller than the light decomposition capacity of the light exposing device. In the case of using the semitransparent film, thin films differentiated in the light transmission or the thickness may be used to control the light transmission in the fabrication of a mask.

When a photoresist film is exposed to light using such a mask, the high molecules at the portion of the photoresist film directly exposed light are entirely decomposed, those at the portion of the photoresist film with a slit pattern or a semitransparent film are decomposed at some degree, and those at the portion of the photoresist film intercepted by a light interception film are not nearly decomposed. When the photoresist film is developed, the portions of the photoresist film where the high molecules are not decomposed are left over while being differentiated in thickness depending upon the molecular decomposition degree. In the case where the light exposing time is too long, all of the molecules are liable to be decomposed.

Such a photoresist film 114 with a relatively thin thickness may be formed using a material capable of making re-flow. In this case, the target film is exposed to light using a usual mask with a light transmission region and a light interception region, and developed. The film portion is partially re-flown to the non-film portion.

Thereafter, the photoresist pattern 114, and the underlying conductive layer 60, ohmic contact layer 50 and semiconductor layer 40 are etched. At this time, the data line assembly and the underlying layers are left over at the data line assembly area A, only the semiconductor layer is left over at the channel area C, and all of the conductive layer 60, the ohmic contact layer 50 and the semiconductor layer 40 are removed at the remaining area B while exposing the gate insulating layer 30 to the outside.

Figure 16A:
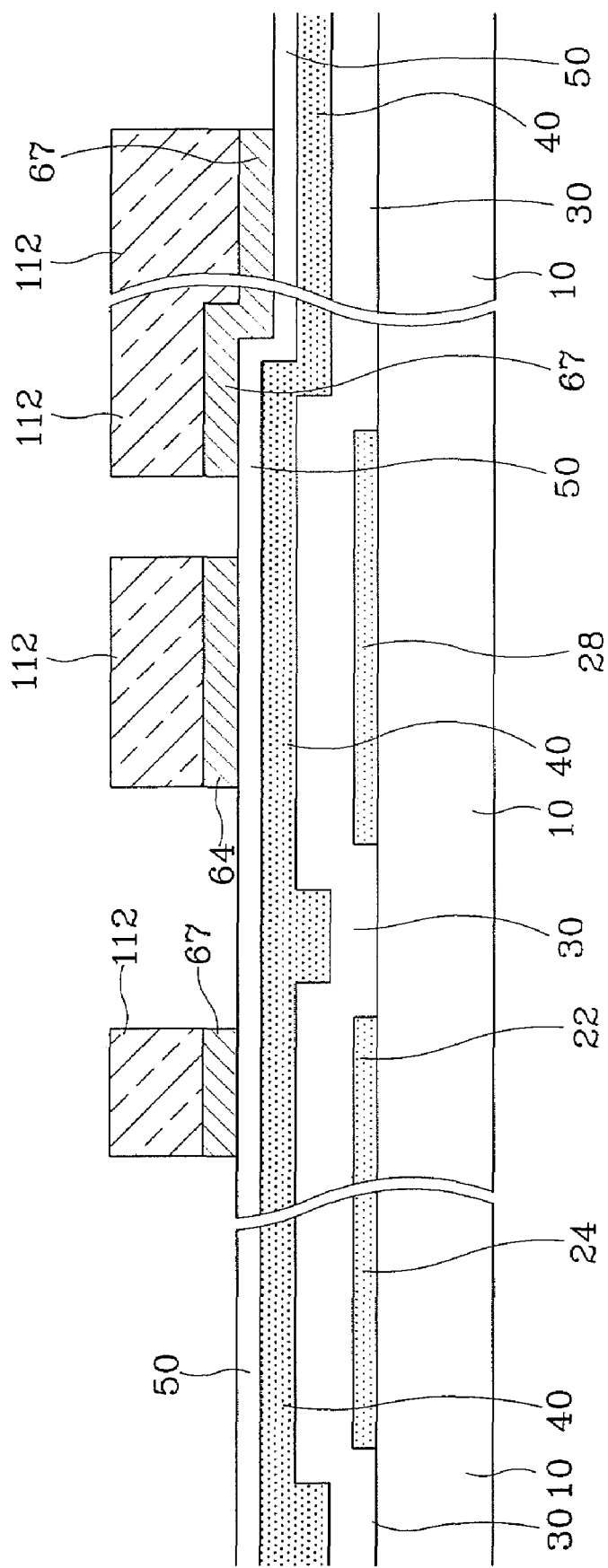
FIGS. 16A to 18B sequentially illustrate the steps of fabricating the thin film transistor array substrate following the step illustrated in FIGS. 15B and 15C.
Figure 16B:
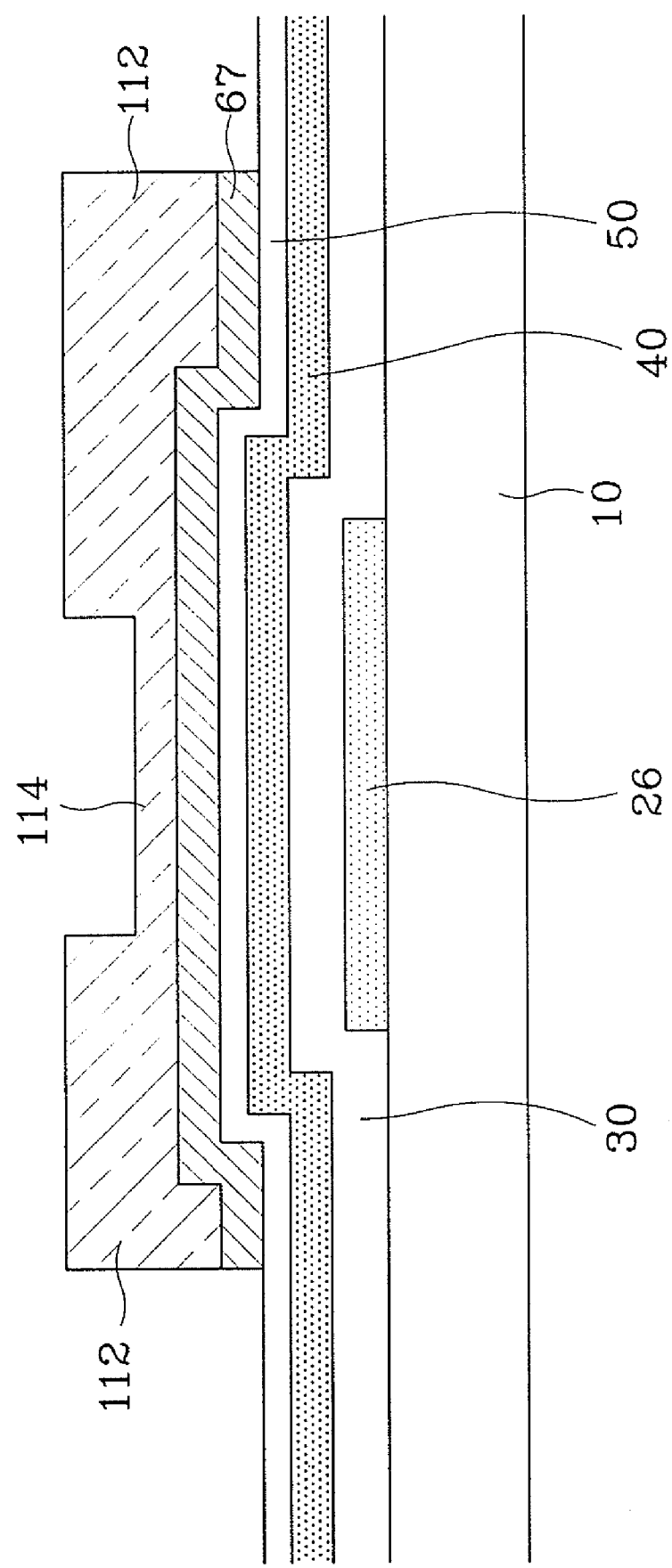

Preferably, as shown in FIGS. 16A and 16B, the conductive layer 60 exposed at the B area is removed while exposing the underlying ohmic contact layer 50. In this process, either dry etching or wet etching may be used in condition that the conductive layer 60 is etched while not nearly etching the photoresist patterns 112 and 114. However, in the case of the dry etching, it is difficult to find a condition in that only the conductive layer 60 is etched while not etching the photoresist patterns 112 and 114. Therefore it may be established that the photoresist patterns 112 and 114 be etched together. In this case, the thickness of the first photoresist pattern portion 114 should be established so large as to prevent the underlying conductive layer 60 from being exposed to the outside through the etching.

In the case where the data line assembly conductive material is aluminum or aluminum alloy, either dry etching or wet etching may be used. However, in the case of chrome as it is not well removed through the dry etching wet etching is preferably made with respect to the chrome-based layer white using CeNHO₃ as an etching solution. In the case where the chrome-based layer bears an extremely thin thickness of up to about 500 Å, dry etching may be applied thereto.

Consequently, as shown in FIGS. 16A and 16B, the source/drain conductive pattern 67 and the storage capacitor conductive pattern 64 are left over at the channel area C and the data line assembly area A, and the conductive layer 60 at the remaining area B is all removed white exposing the underlying ohmic contact layer 50. The conductive patterns 67 and 64 have the same shape as the data line assembly except that the source and the drain electrodes 65 and 66 are connected to each other without separation. Furthermore, in the case of using the dry etching, the photoresist patterns 112 and 114 are also etched by a predetermined thickness.

Figure 17A:
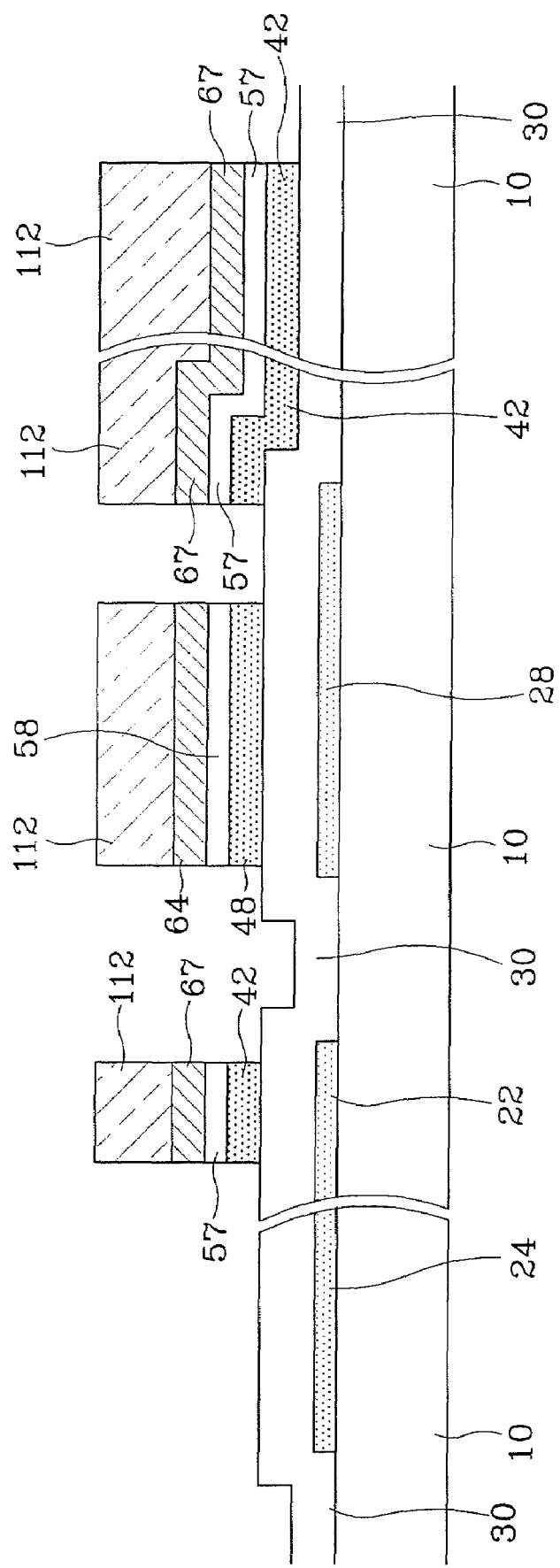

Thereafter, as shown in FIGS. 17A and 17B, the ohmic contact layer 50 exposed at the B area and the underlying semiconductor layer 40 are simultaneously removed through dry etching together with the first photoresist pattern portion 114. In the case where the conductive pattern 67 is etched through dry etching, the ohmic contact layer 50 and the semiconductor layer 40 may be continuously etched through dry etching in situ. The etching with respect to the ohmic contact layer 50 and the semiconductor layer 40 should be made in condition that the photoresist patterns 112 and 114, the ohmic contact layer 50 and the semiconductor layer 40 (the semiconductor layer and the ohmic contact layer having no etching selectivity) are simultaneously etched while not etching the gate insulating layer 30. Particularly, the etching ratios with respect to the photoresist patterns 112 and 114 and the semiconductor layer 40 are preferably established to be the same. In the case where the etching ratios with respect to the photoresist patterns 112 and 114 and the semiconductor layer 40 are the same, the thickness of the first photoresist pattern portion 114 should be the same as, or less than the sum in thickness of the semiconductor layer 40 and the ohmic contact layer 50.

Consequently, as shown in FIGS. 17A and 17B, the source/drain conductive pattern 67 and the storage capacitor conductive pattern 64 are left over at the channel area C and the data line assembly area A, and the conductive layer 60 at the B area is all removed. Furthermore, the first photoresist pattern portion 114 at the channel area C is removed while exposing the source/drain conductive pattern 67, and the ohmic contact layer 50 and the semiconductor layer 40 at the B area are removed while exposing the underlying gate insulating layer 30 to the outside. Meanwhile, the second photoresist pattern portion 112 at the data line assembly area A is also etched while being reduced in thickness. In this processing step, semiconductor patterns 42 and 48 are completed. Reference numerals 57 and 58 indicate the ohmic contact patterns under the source/drain conductive pattern 67 and the storage capacitor to conductive pattern 64, respectively. The source/drain conductive pattern 67 at the channel area C may be exposed through a separate PR etch back process. In condition that the photoresist film is etched in a sufficient manner, the PR etch back process may be omitted.

The photoresist film residue remained on the surface of the source/drain conductive pattern 67 at the channel area C is removed through ashing.

Figure 18A:
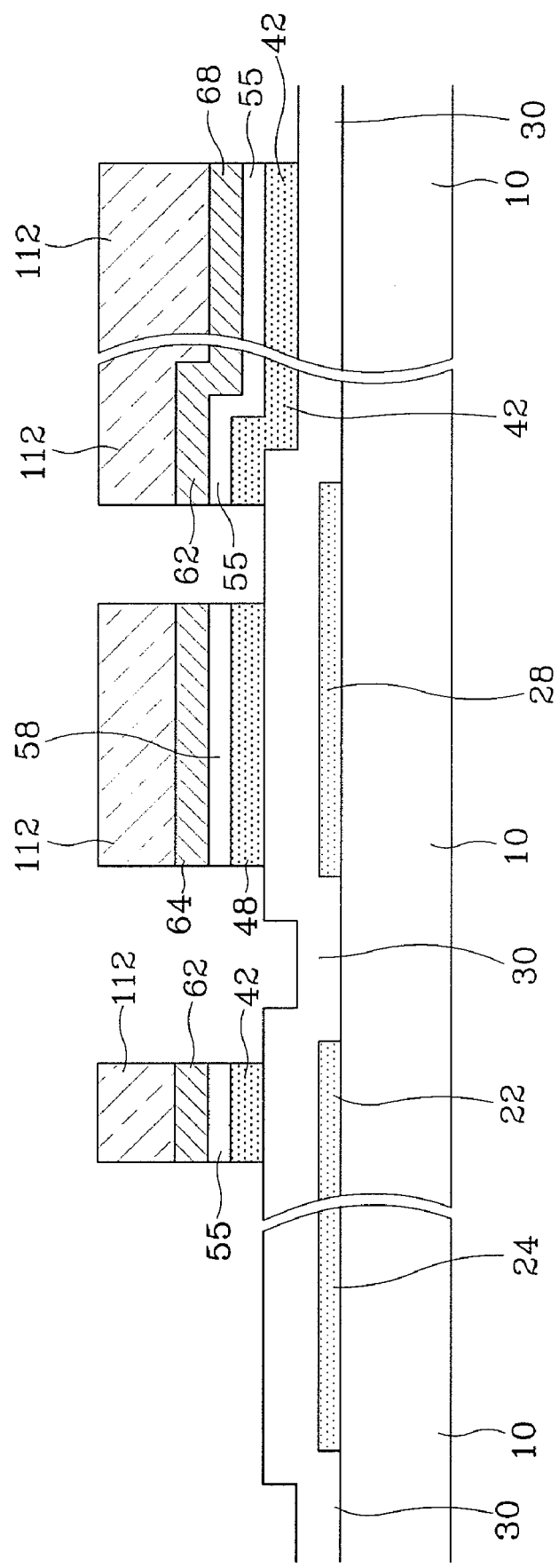
Figure 18B:
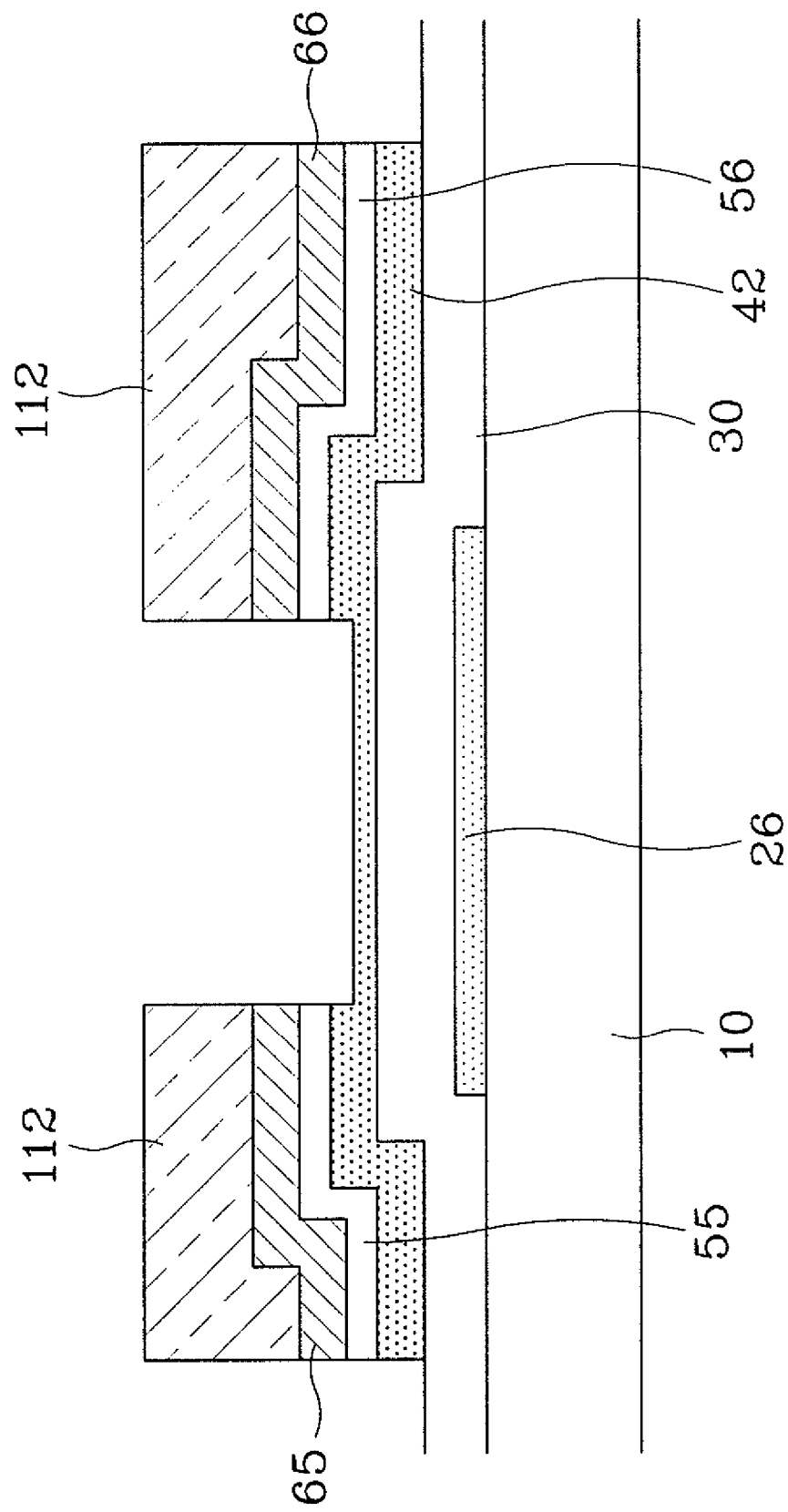

Thereafter, as shown in FIGS. 18A and 18B, the source/drain conductive pattern 67 at the channel area C and the underlying source drain ohmic contact pattern 57 are removed through etching. Dry etching may be made with respect to both of the source/drain conductive pattern 67 and the ohmic contact pattern 57. Wet etching may be made with respect to the source/drain conductive pattern 67 while applying the dry etching to the ohmic contact pattern 57. At this time, as shown in FIG. 15B, the semiconductor pattern 42 is partially removed while being reduced in thickness, and the second photoresist pattern portion 112 is etched by a predetermined thickness. The etching should be made in condition that the gate insulating layer 30 is not etched. The photoresist film should be so thick as to prevent the second photoresist pattern portion 112 from being etched white exposing the underlying data line assembly.

Consequently, the source and the drain electrodes 65 and 66 are separated from each other while completing the data line assembly and the underlying ohmic contact patterns 55, 56 and 58.

Finally, the second photoresist pattern portion 112 remained at the data line assembly area A is removed. However, the removal of the second photoresist pattern portion 112 may be made after the source/drain conductive pattern 67 at the channel area C is removed but before the removal of the underlying ohmic contact pattern 57.

Figure 19A:
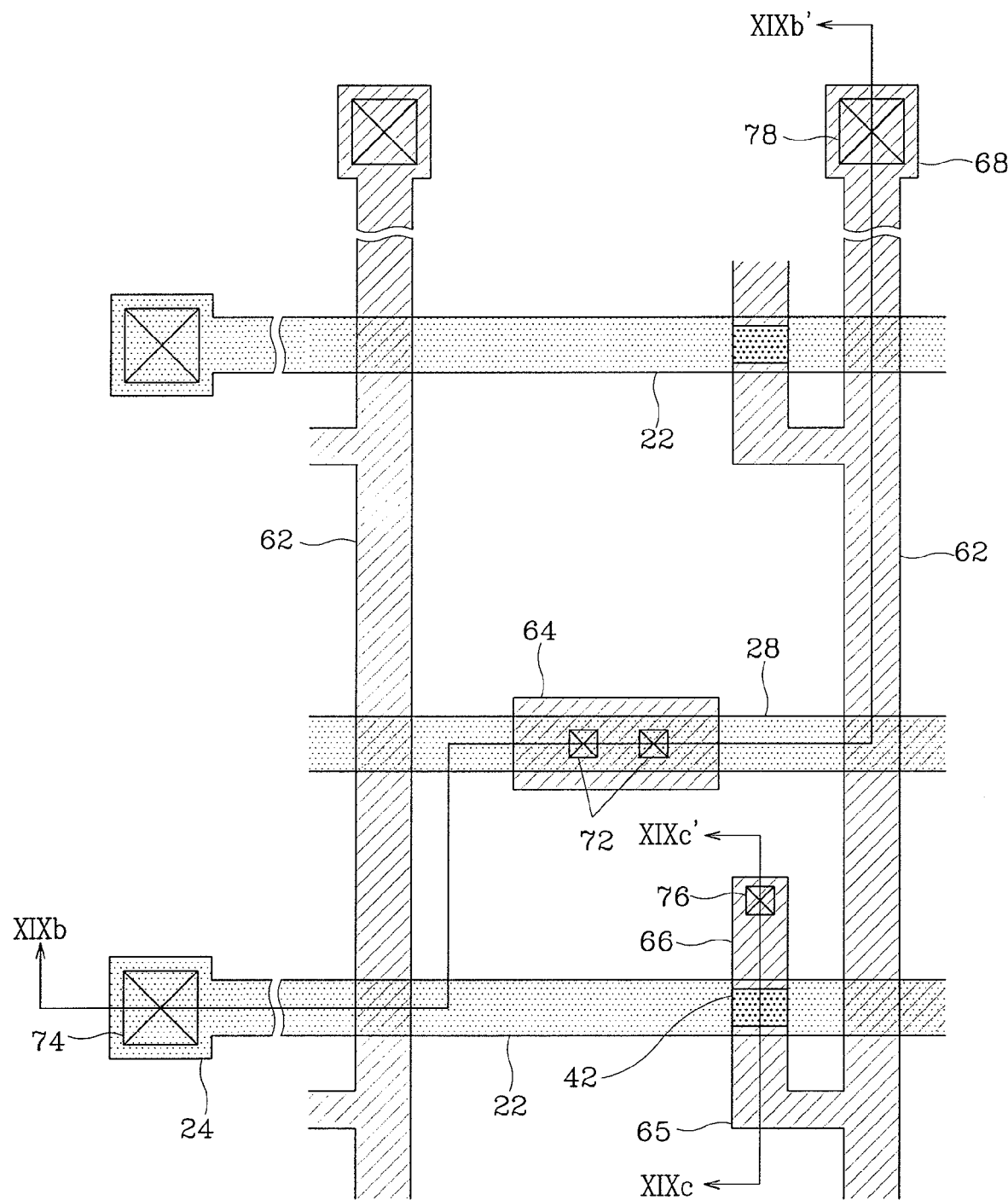
FIG. 19A illustrates the step of fabricating the thin film transistor array substrate following the step illustrated in FIGS. 18A and 18B.
Figure 19B:
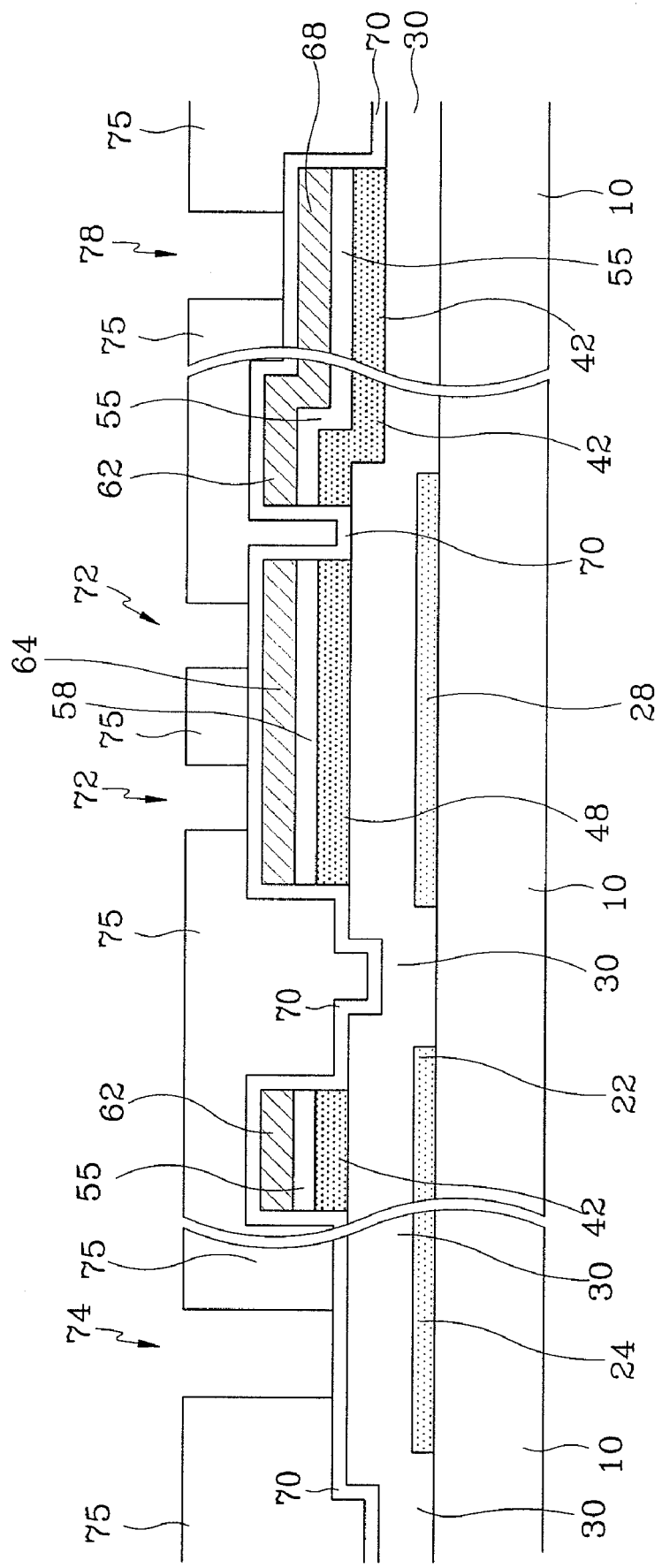
FIGS. 19B and 19C are cross sectional views of the thin film transistor array substrate taken along the XIXb-XIXb' line and the XIXc-XIXc' line of FIG. 19A.
Figure 19C:
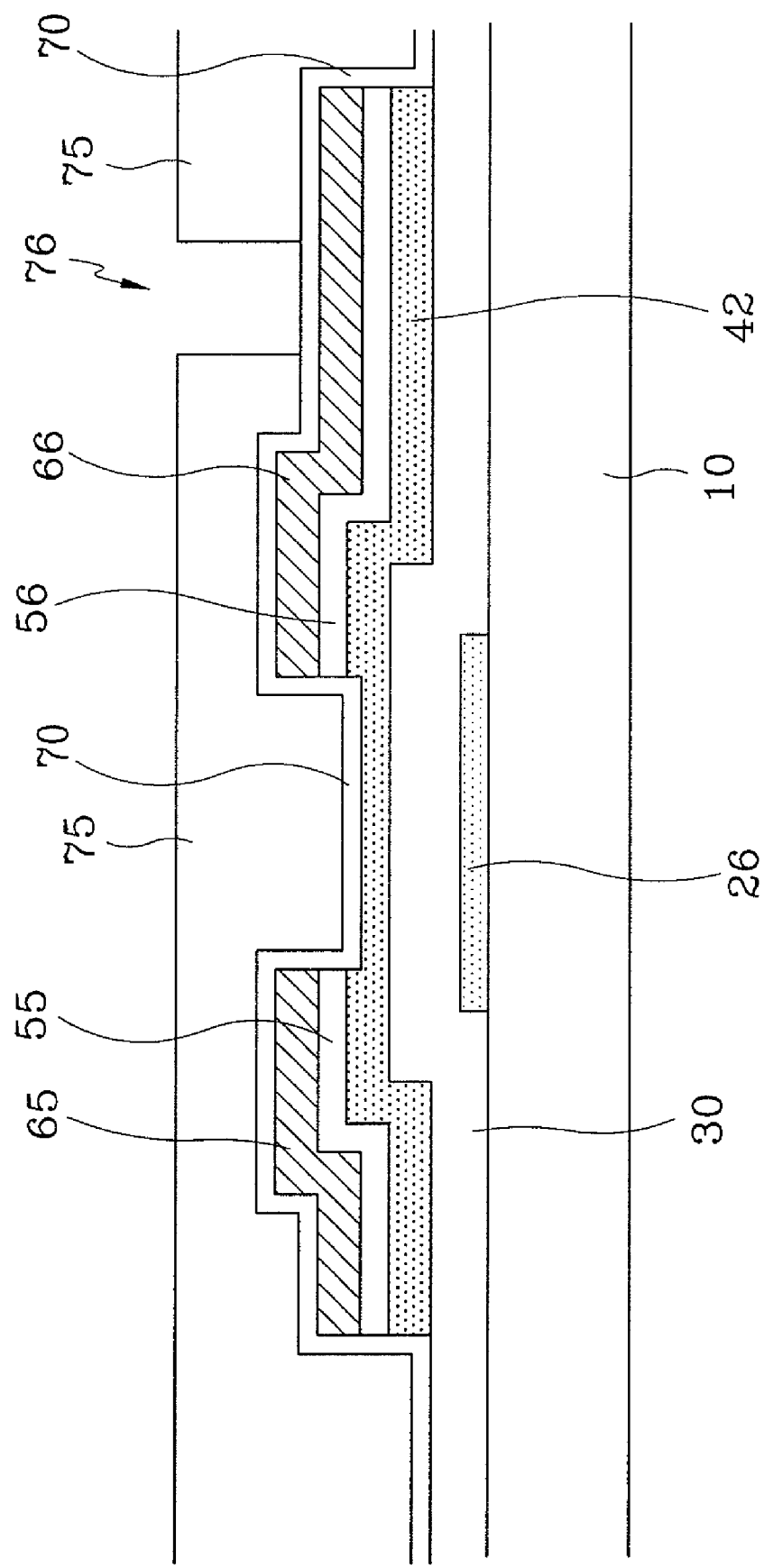

After the data line assembly is formed, as shown in FIGS. 19A to 19C, a silicon nitride layer is deposited through CVD to thereby form a protective layer 70. A photosensitive organic insulating material is spin-coated onto the protective layer 70 to thereby form an organic insulating layer 75. Then, the organic insulating layer 75 is exposed to light using a third mask, and developed to thereby form contact holes 72, 74, 76 and 78 exposing the protective layer 70 over the storage capacitor conductive patterns 64, the gate pads 24, the drain electrodes 66 and the data pads 68.

Figure 20A:
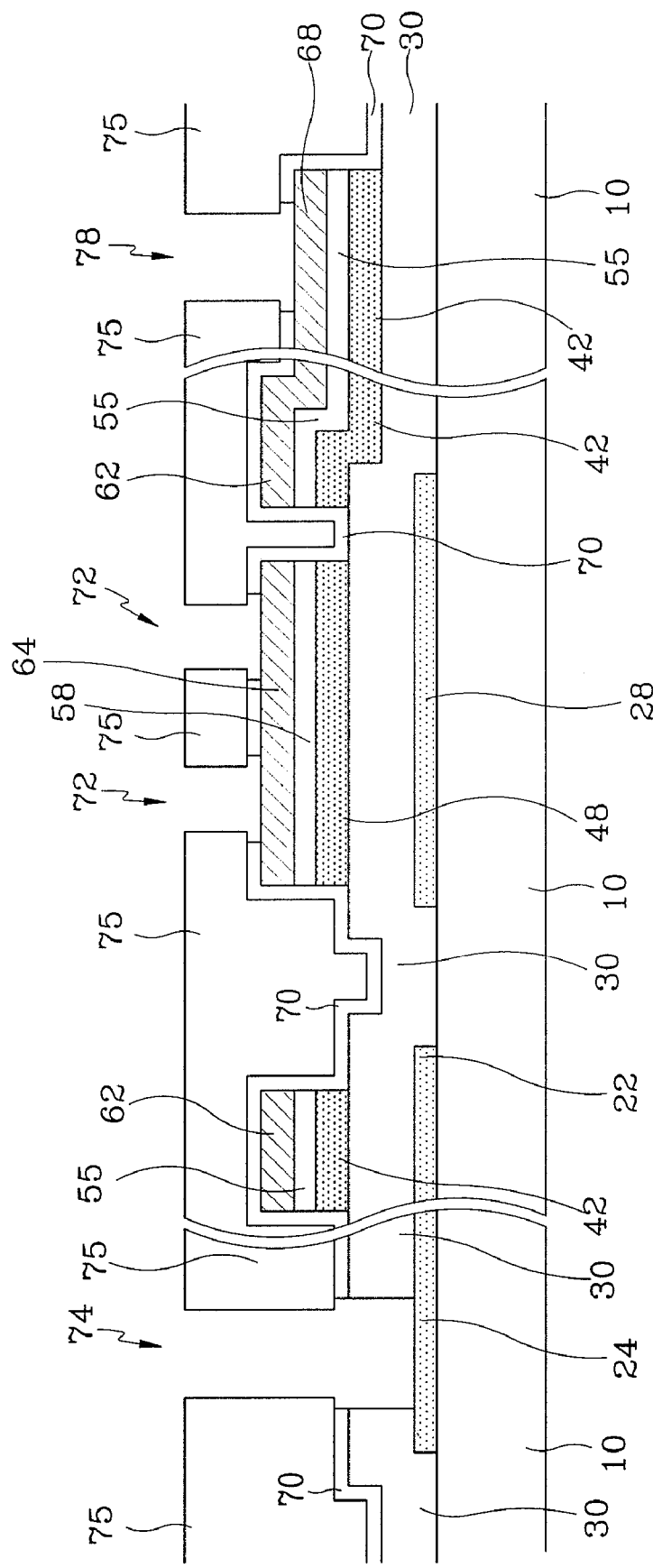
FIGS. 20A to 21B sequentially illustrate the steps of fabricating the thin film transistor array substrate following the step illustrated in FIGS. 19B and 19C.
Figure 20B:
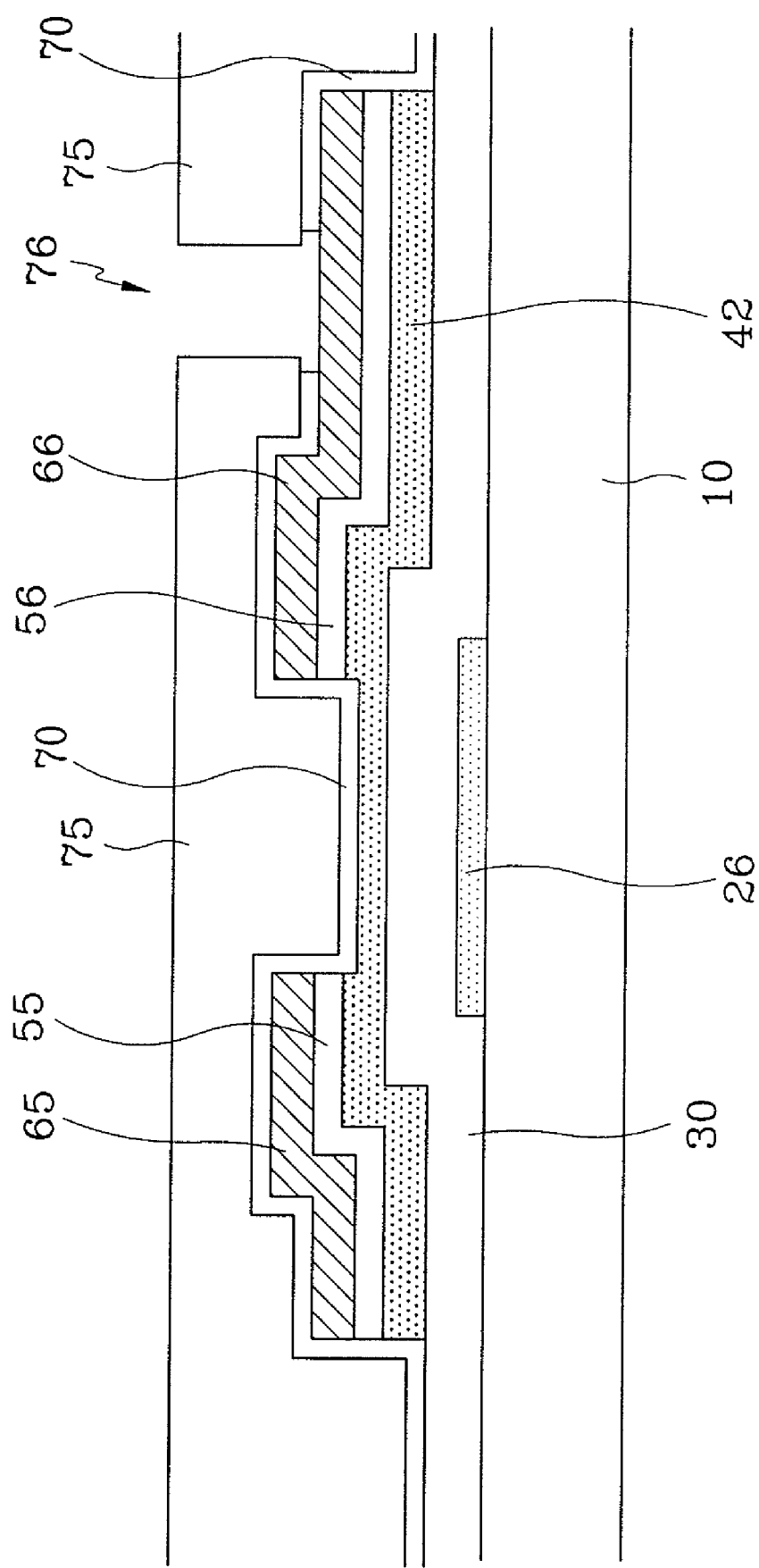

Thereafter, as shown in FIGS. 20A and 20B, the protective layer 70 exposed through the contact holes 72, 74, 76 and 78 is etched together with the gate insulating layer 30 such that the storage capacitor conductive patterns 64, the gate pads 24, the drain electrodes 66 and the data pads 68 are exposed through the contact holes 72, 74, 76 and 78, respectively. At this time, the protective layer 70 or the gate insulating layer 30 is etched up to the bottom of the organic insulating layer 75 so that an undercut structure is made at the contact area.

Figure 21A:
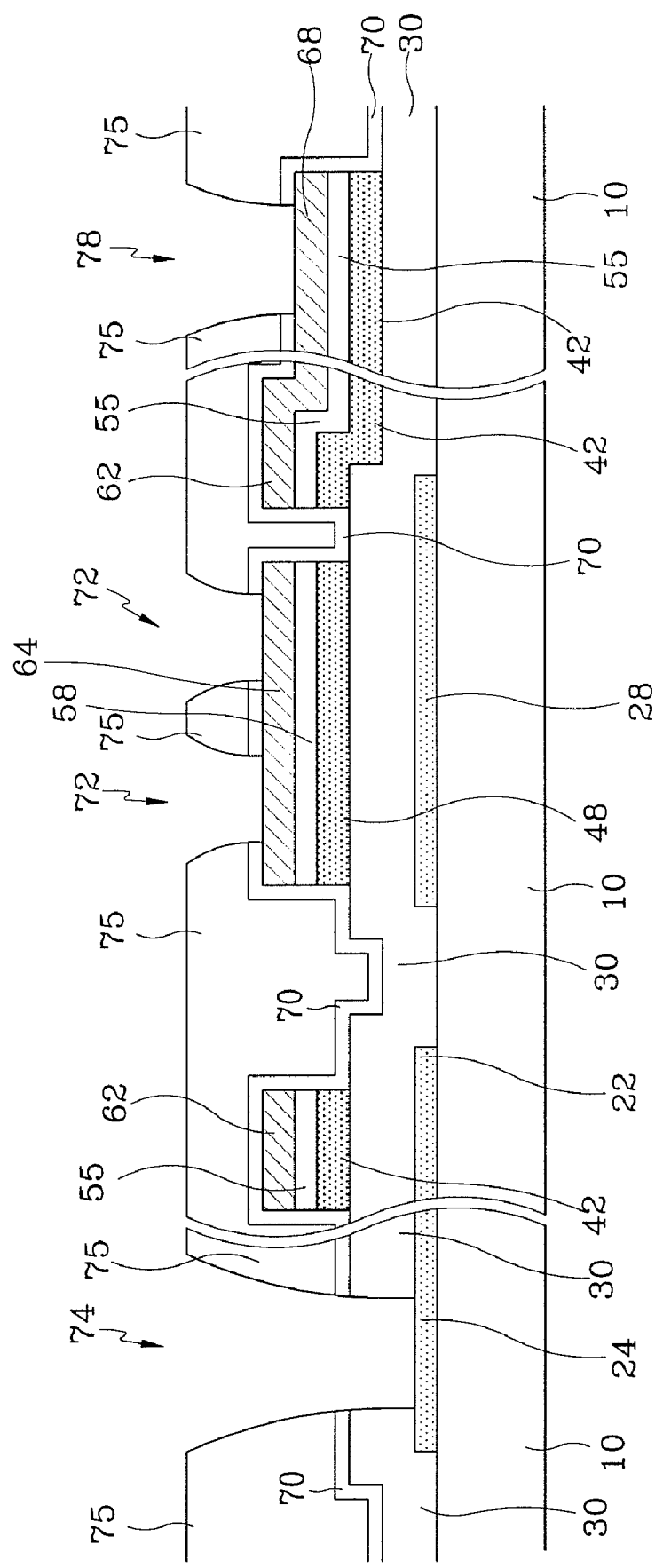
Figure 21B:
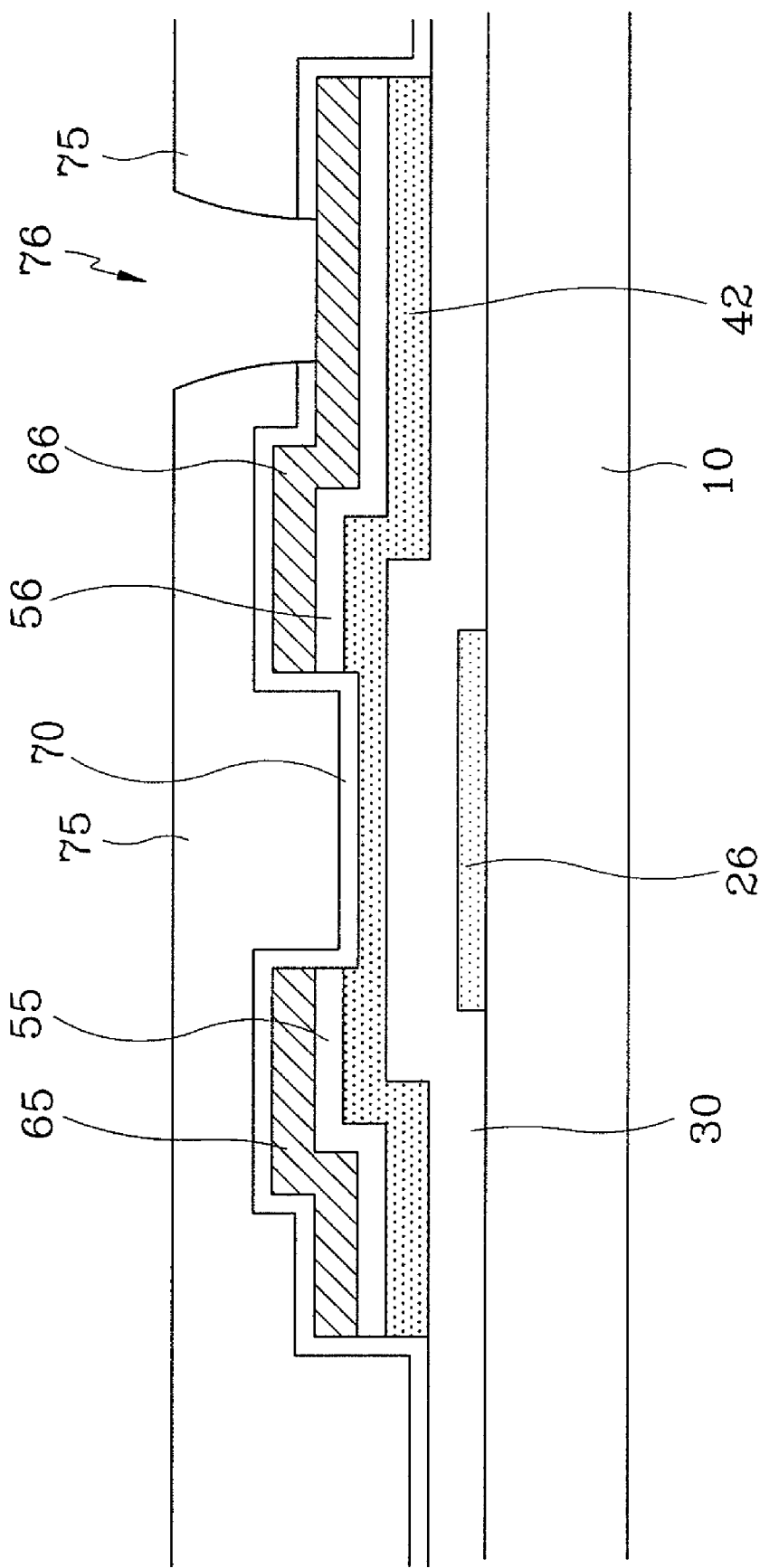

Ashing is made with respect to the organic insulating layer 75, and the solid film is removed from the surface of the organic insulating layer 75 such that the organic insulating layer 75 bears a thickness of about 1000 Å or less. As shown in FIGS. 21A and 21B, curing is made with respect to the organic insulating layer 75 to harden it. At this time, the organic insulating layer 75 at the contact holes 72, 74, 76 and 78 is contracted up to the boundary of the gate insulating layer 30 and the protective layer 70, and the sidewall of the organic insulating layer 75 defining the contact holes 72, 74, 76 and 78 becomes to bear a tapering structure with an inclination degree of about 30-60°.

Finally, as shown in FIGS. 10 to 12, an ITO or IZO-based layer is deposited onto the substrate 10 such that it bears a thickness of about 400-500 Å. The ITO or IZO-based layer is etched using a fourth mask to thereby form pixel electrodes 82 connected to the drain electrodes 66 and the storage capacitor conductive patterns 64, subsidiary gate pads 84 connected to the gate pads 24, and subsidiary data pads 88 connected to the data pads 68.

In this preferred embodiment, the data line assembly and the underlying ohmic contact patterns 55, 56 and 58 and semiconductor patterns 42 and 48 are formed using one mask. In this process, the source and the drain electrodes 65 and 66 are separated from each other. In this way, the processing steps can be simplified.

Figure 22:
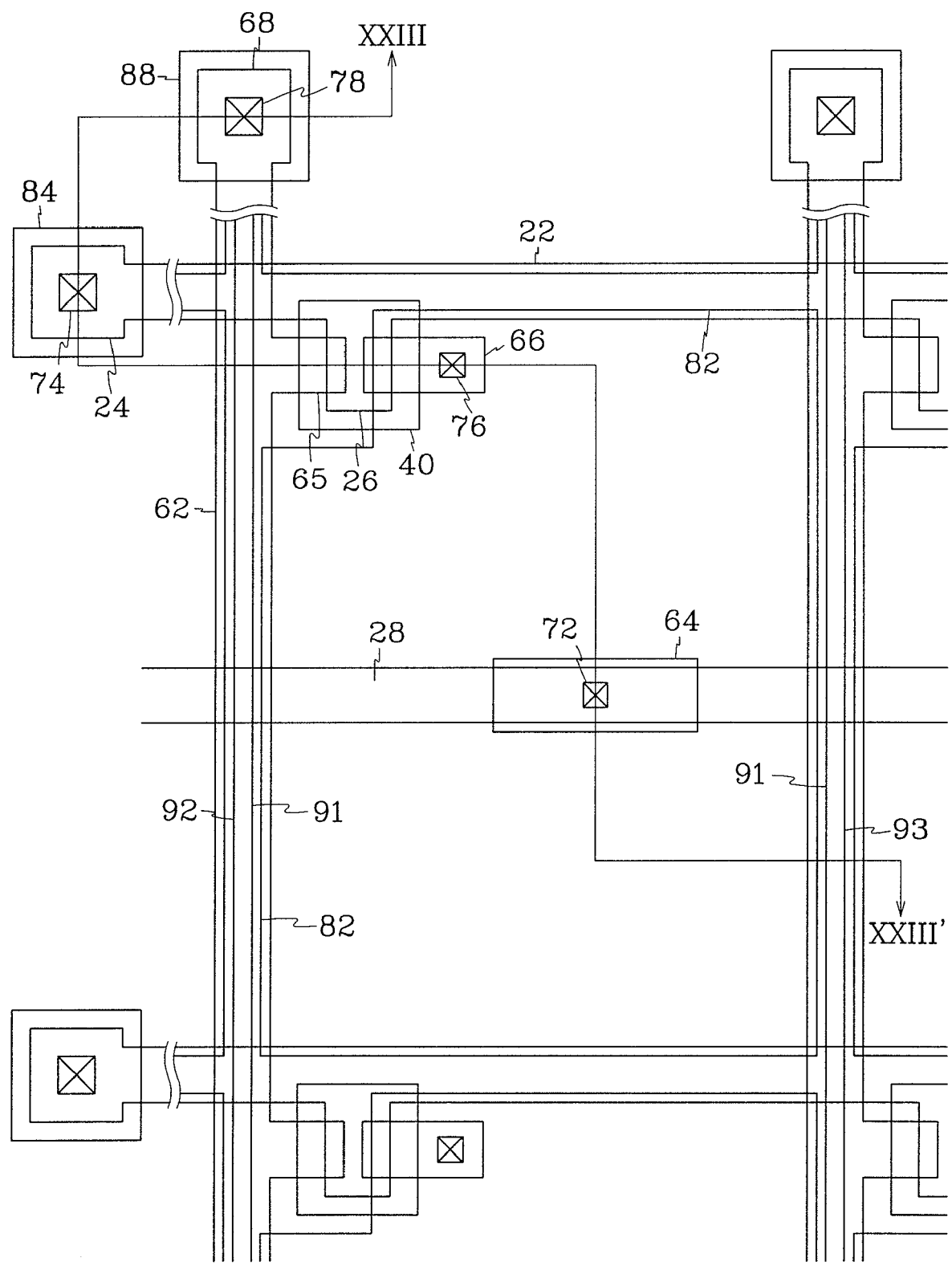
FIG. 22 is a plan view of a thin film transistor array substrate for a liquid crystal display according to a third preferred embodiment of the present disclosure.
Figure 23:
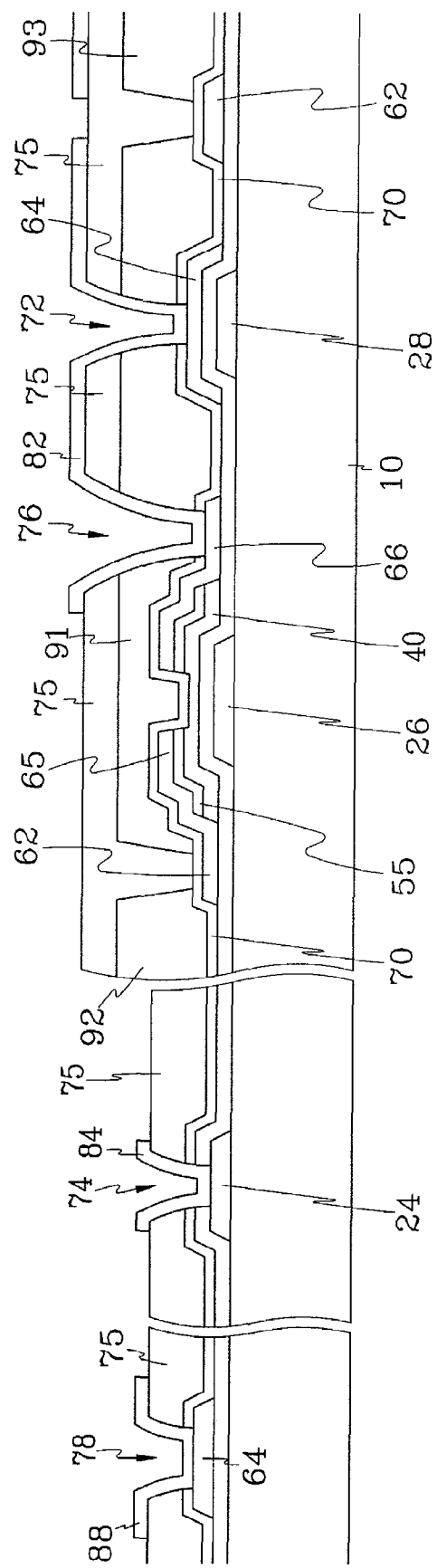
FIG. 23 is a cross sectional view of the thin film transistor array substrate taken along the XXIII-XXIII' line of FIG. 22.

FIG. 22 is a plan view of a thin film transistor array substrate for a liquid crystal display according to a third preferred embodiment of the present disclosure, and FIG. 23 is a cross sectional view of the thin film transistor array substrate taken along the XXIII-XIII' line of FIG. 22.

In this preferred embodiment, other components and structures of the thin film transistor array substrate are the same as those related to the first preferred embodiment except that storage capacitor electrodes 82 are formed at the same plane as the gate line assembly while proceeding parallel to the gate lines 22, and storage capacitor conductive patterns 64 are formed at the same plane as the data line assembly while being overlapped with the storage capacitor electrodes 28.

Color filters of red, green and blue 91, 92 and 93 are formed on the protective layer 70 over the data line assembly and the semiconductor layer 40 with pigments of red, green and blue while proceeding in the vertical direction. The boundary of the color filters 91, 92 and 93 is spaced apart from the data lines 62, but may be overlapped with the data lines 62. Furthermore, the color filters 91, 92 and 93 may be formed over the gate and the data pads 24 and 68.

An organic insulating layer 75 is formed on the color filters 91, 92 and 93 and the protective layer 70 with an organic insulating material bearing an excellent flattening characteristic and a lower dielectric constant. The organic insulating layer 75 bears contact holes 72, 74, 76 and 78 exposing the storage capacitor conductive patterns 64, the gate pads 24, the drain electrodes 66 and the data pads 68 together with the gate insulating layer 30, the color filters 91, 92 and 93 and the protective layer 70. The sidewall of the organic insulating layer 75 and the color filters 91, 92 and 93 defining the contact holes 72, 74, 76 and 78 is formed with a tapering structure bearing a gradual inclination degree.

Pixel electrodes 82 are formed on the organic insulating layer 75 that is electro-physically connected to the drain electrodes 66 through the contact holes 76 to receive picture signals. The pixel electrodes 82 are overlapped with the neighboring gate lines 22 and data lines 62 to enhance the aperture ratio, but may be omitted. Furthermore, the pixel electrodes 82 are connected to the storage capacitor conductive patterns 64 through the contact holes 74. Subsidiary gate and data pads 114 and 116 are formed at the same plane as the pixel electrodes 82 while being connected to the gate and the data pads 24 and 68 through the contact holes 74 and 78.

A method of fabricating the thin film transistor array substrate will be now explained with reference to FIGS. 24A to 27 as well as FIGS. 22 and 23.

The steps of forming a gate line assembly, a gate insulating layer 30, a semiconductor layer 40, ohmic contact layers 55 and 56 and a data line assembly are the same as those related to the first preferred embodiment.

Figure 24A:
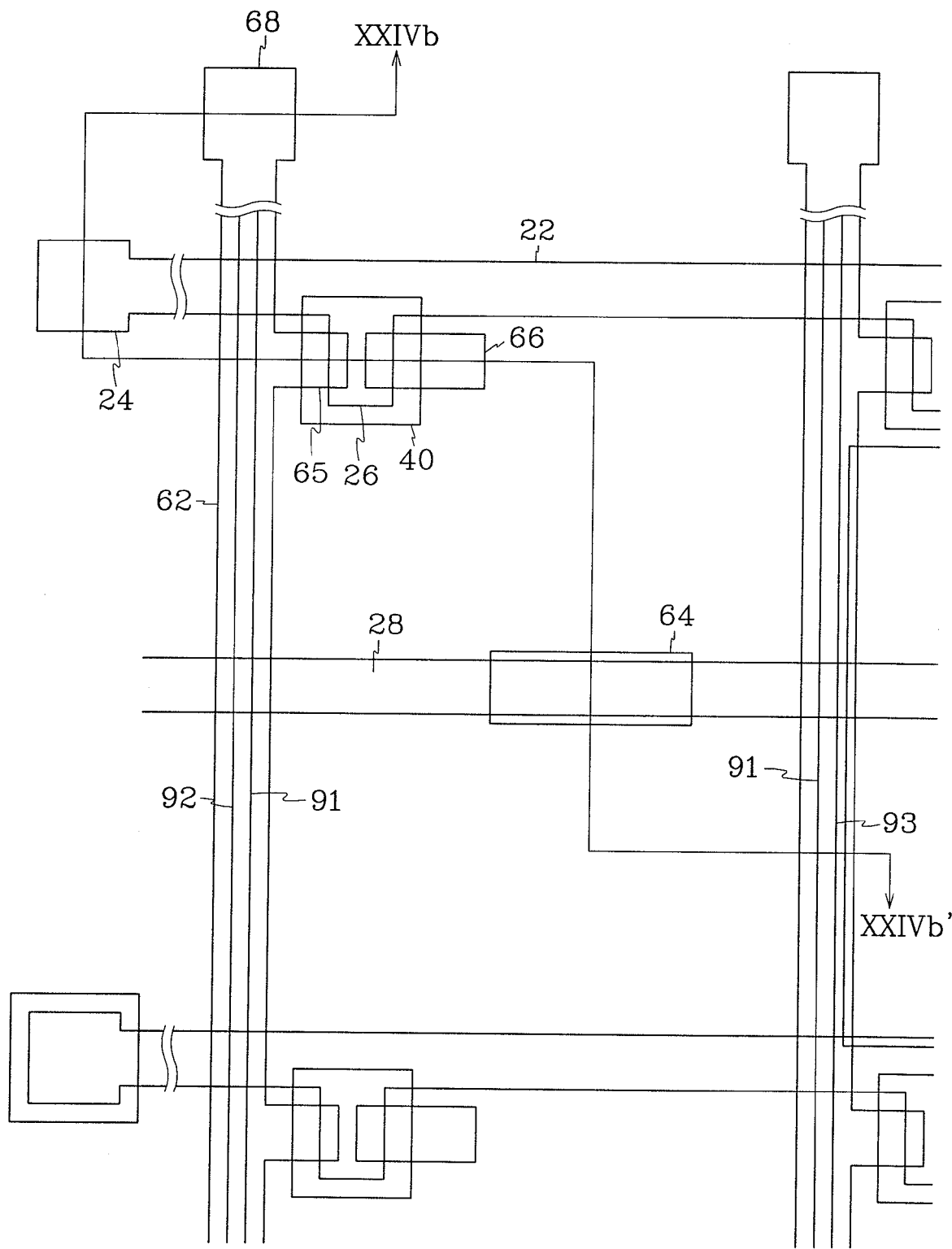
FIGS. 24A and 25A sequentially illustrate the intermediary steps of fabricating the thin film transistor array substrate shown in FIG. 22.
Figure 24B:
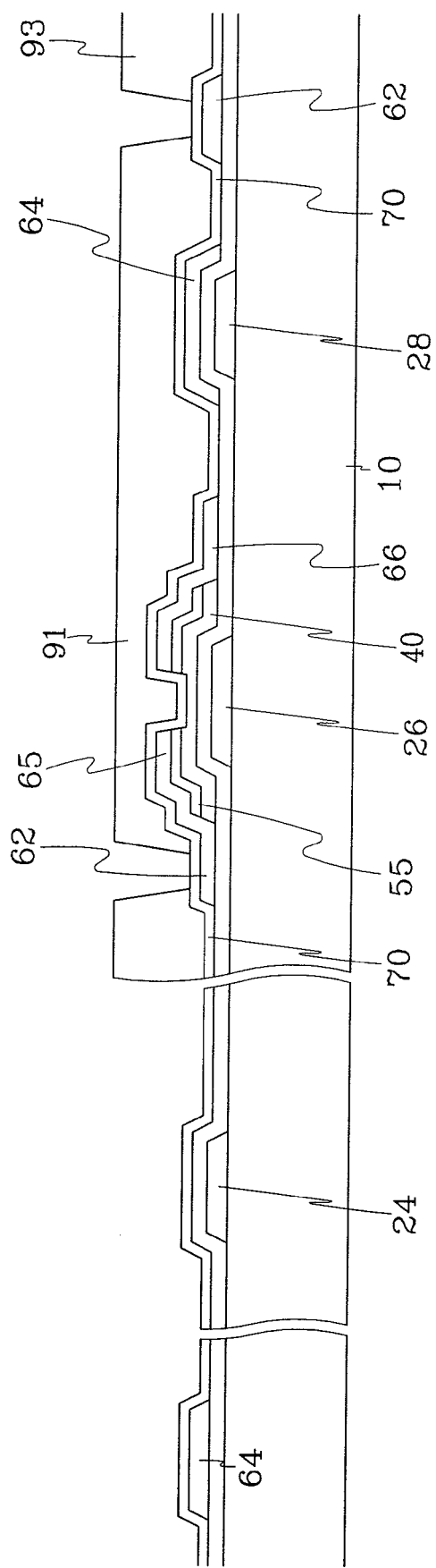
FIGS. 24B and 25B are cross sectional views of the thin film transistor array substrate taken along the XXIVb-AXIVb' line of FIG. 24A and the XXVb-XXVb' line of FIG. 25A, respectively.

As shown in FIGS. 24A and 24B, a silicon nitride or silicon oxide layer is deposited onto the substrate 10 to thereby form a protective layer 70. The protective layer 70 covers the semiconductor layer 40. Photosensitive organic materials containing pigments of red, green and blue are sequentially coated onto the protective layer 70 to thereby form color filters of red, green and blue 91, 92 and 93. The color filters 91, 92 and 93 may be formed using a printing technique or a laser illumination technique to minimize the production cost.

Figure 25A:
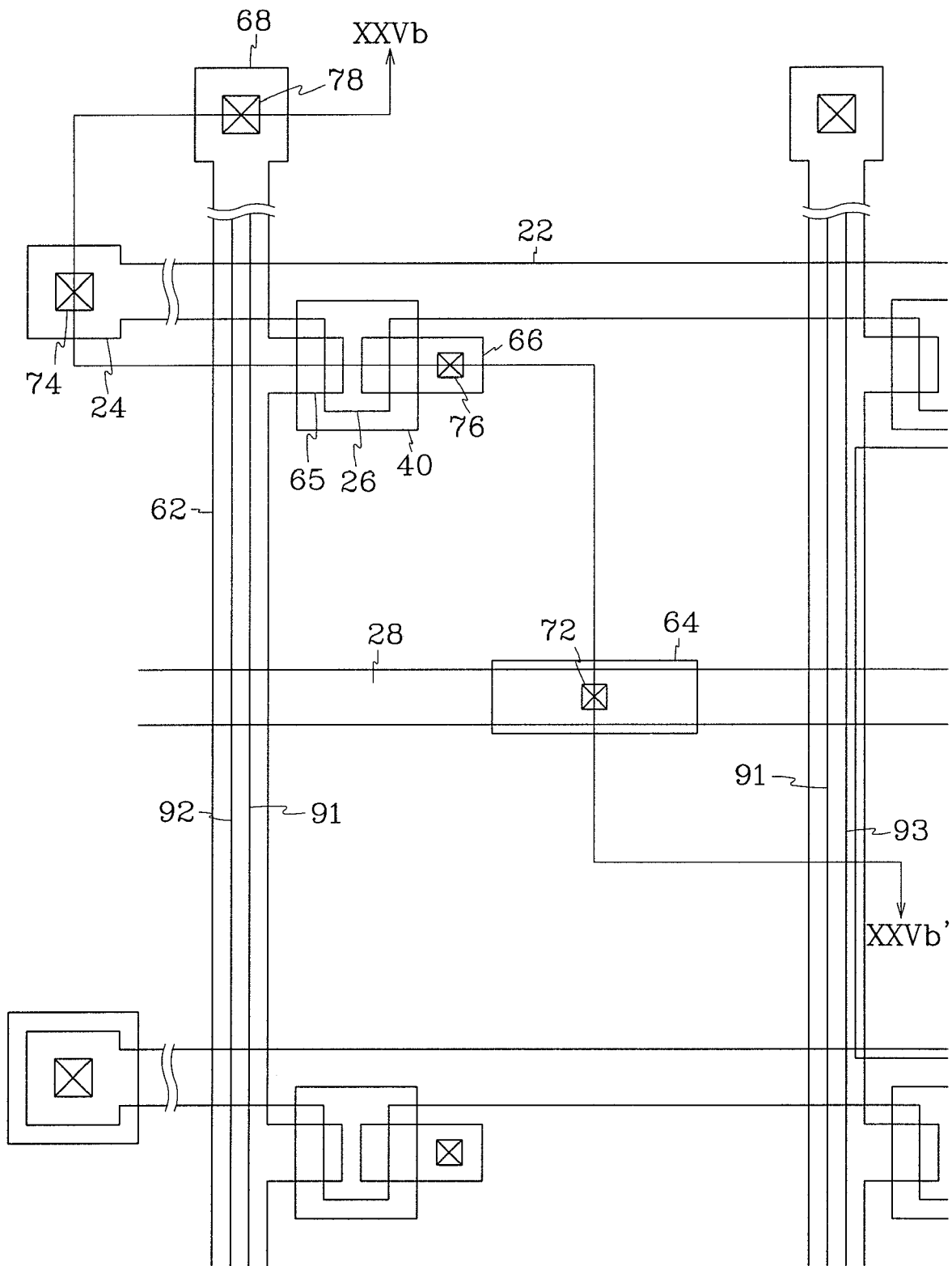
Figure 25B:
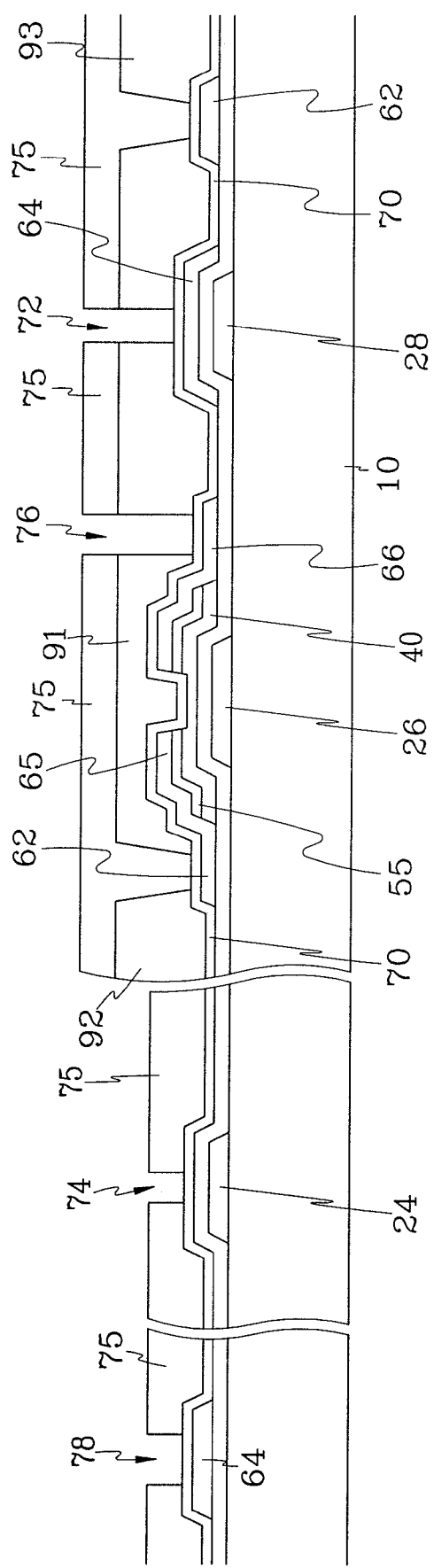

Thereafter, as shown in FIGS. 25A and 25B, a photosensitive organic material with a lower dielectric constant and an excellent flattening characteristic is coated onto the protective layer 70 and the color filters 91 to 93 to thereby form an organic insulating layer 75. The organic insulating layer 75 and the color filters 91 to 93 are processed through photolithography using a mask to thereby form contact holes 72, 74, 76 and 78 exposing the protective layer 70 over the storage capacitor conductive patterns 64, the gate pads 24, the drain electrodes 66, and the data pads 68.

Figure 26:
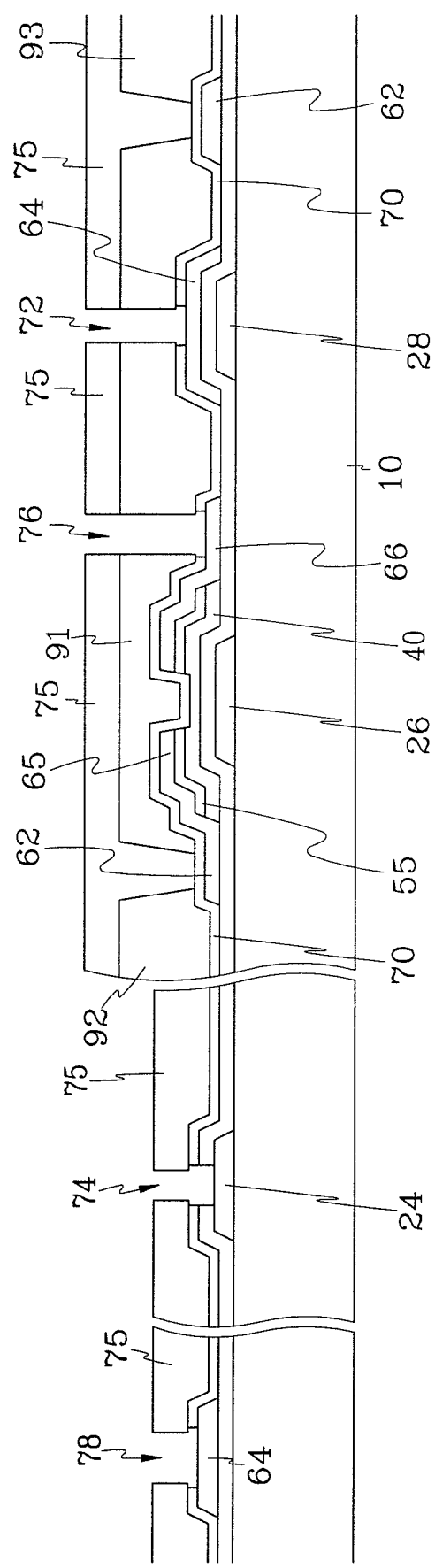
FIG. 26 illustrates the step of fabricating the thin film transistor array substrate following the step illustrated in FIG. 25B.

As shown in FIG. 26, the protective layer 70 exposed through the contact holes 72, 74, 76 and 78 is etched together with the gate insulating layer 30 such that the storage capacitor conductive patterns 64, the gate pads 24, the drain electrodes 66 and the data pads 68 are exposed through the contact holes 72, 74, 76 and 78, respectively. At this time, the protective layer 70 or the gate insulating layer 30 is etched up to the bottom of the organic insulating layer 75 and the color filters 91 to 93 so that an undercut structure is made at the contact area.

Figure 27:
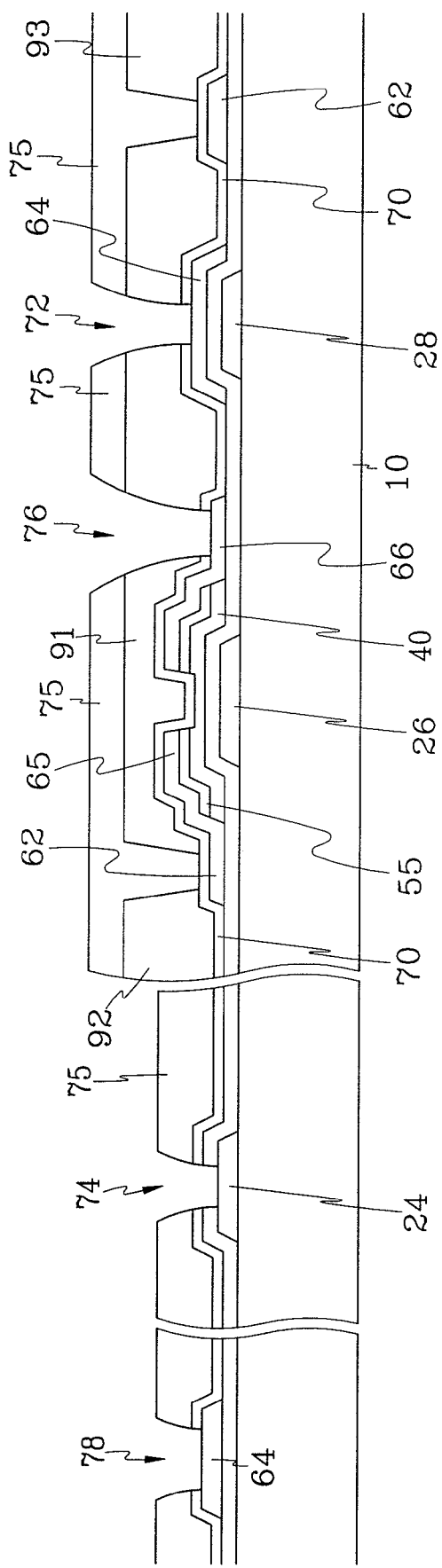
FIG. 27 illustrates the step of fabricating the thin film transistor array substrate following the step illustrated in FIG. 26.

Ashing is made with respect to the organic insulating layer 75, and a solid film is removed from the surface of the organic insulating layer 75 such that the organic insulating layer 75 bears a thickness of about 1000 Å or less. As shown in FIG. 27, curing is made with respect to the organic insulating layer 75 to harden it. At this time, the organic insulating layer 75 at the contact holes 72, 74, 76 and 78 is contracted up to the boundary of the gate insulating layer 30 and the protective layer 70, and the sidewall of the organic insulating layer 75 defining the contact holes 72, 74, 76 and 78 becomes to bear a tapering structure with an inclination degree of about 30-60°.

Finally, as shown in FIGS. 22 and 23, an ITO or IZO-based layer is deposited onto the substrate 10 such that it bears a thickness of about 400-500 Å. The ITO or IZO-based layer is etched using a fourth mask to thereby form pixel electrodes 82 connected to the drain electrodes 66 and the storage capacitor conductive patterns 64, subsidiary gate pads 84 connected to the gate pads 24, and subsidiary data pads 88 connected to the data pads 68.

Examples of this invention will be now illustrated.

In Examples 1 to 3, a wiring line assembly was formed on a substrate, and a protective layer was formed on the wiring line assembly with silicon nitride while covering the latter. An organic insulating layer was deposited onto the protective layer with acryl-based PC-403 such that it had a thickness of about 3.6 μm. The organic insulating layer was developed, and baked at about 100° C. The organic insulating layer was cured at about 230° C. for about 60 minutes under the argon gas atmosphere.

In Examples 1 and 2, the protective layer placed under the organic insulating layer was formed with silicon nitride such that it has a thickness of about 2000 Å. Dry etching was made with respect to the protective layer using $SF_6+O_2$ as an etching gas such that the undercut structure was made at the contact area to be about 0.5 μm or less. In Example 2, the light exposing and the developing during the process of forming the contact structure were made using a mask with a slit pattern such that the boundary of the organic insulating layer defining the contact holes was formed with a stepped shape.

EXAMPLE 1

FIGS. 28A to 28D are photographs illustrating variation in the contact structure as a function of time periods for making ashing after the curing according to Example 1.

Figure 28A:
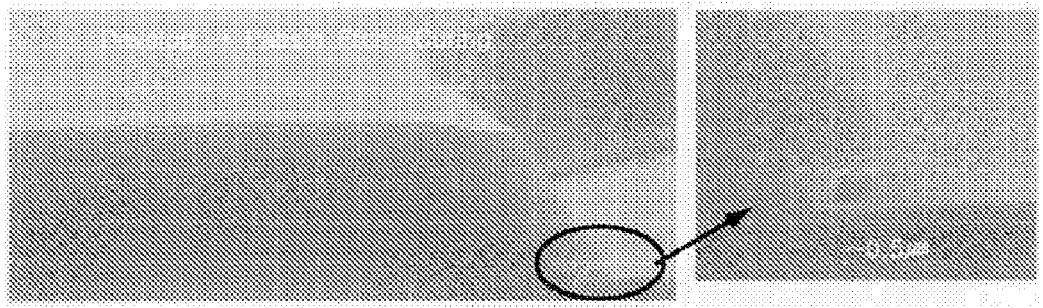
FIGS. 28A to 28D are photographs illustrating variation in the contact structure as a function of time periods for ashing after curing is made according to Example 1.
Figure 28B:
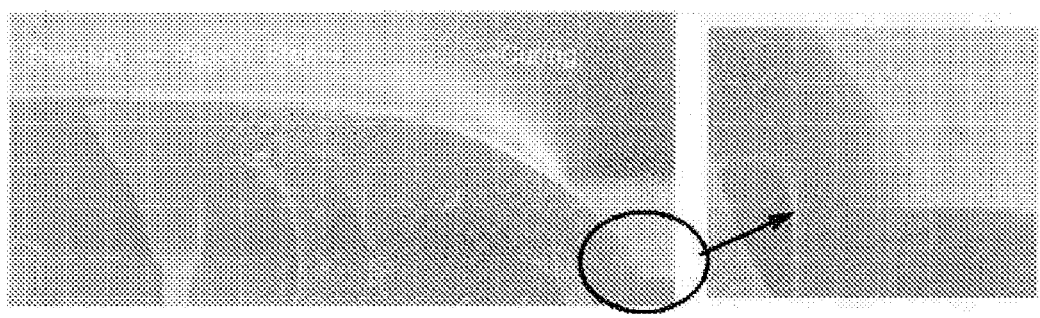
Figure 28C:
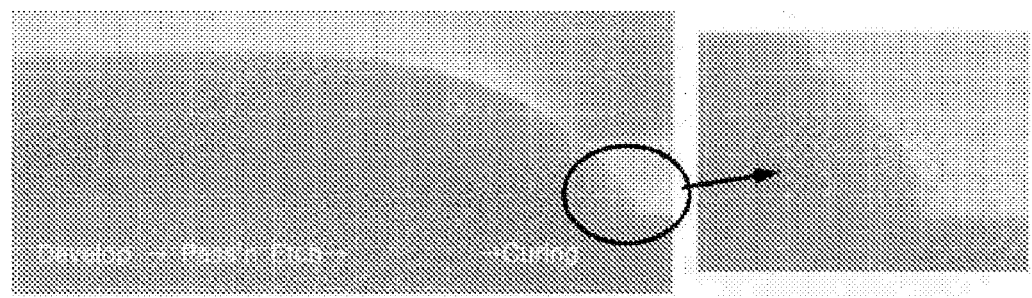
Figure 28D:
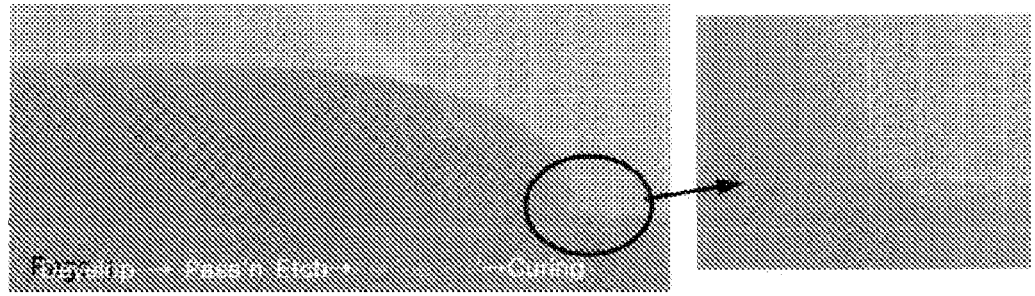

FIG. 28A is a photograph of the contact structure where the protective layer under the organic insulating layer was etched, and curing was made with respect to the organic insulating layer. FIGS. 28B to 28D are photographs of the contact structure where before the curing, the organic insulating layer suffered ashing for 30 seconds, 60 seconds and 90 seconds to remove a solid film from the surface of the organic insulating layer.

As shown in FIG. 28A, only under the application of the curing, the organic insulating layer was not nearly varied in structure, and the undercut structure remained without variation. By contrast, as shown in FIGS. 28B to 28D, under the application of the ashing and the curing, the organic insulating layer was re-flown and contracted so that the undercut structure was removed at the contact area. Even though the time period for the ashing was elongated, the removal of the undercut structure was made in the same manner. Considering that the organic insulating layer should be reduced in thickness as small as possible, the time period for the ashing was established to be 30 seconds or less.

EXAMPLE 2

FIGS. 29A to 29D are photographs illustrating variation in the contact structure as a function of time periods for making ashing after the curing according to Example 2.

Figure 29A:
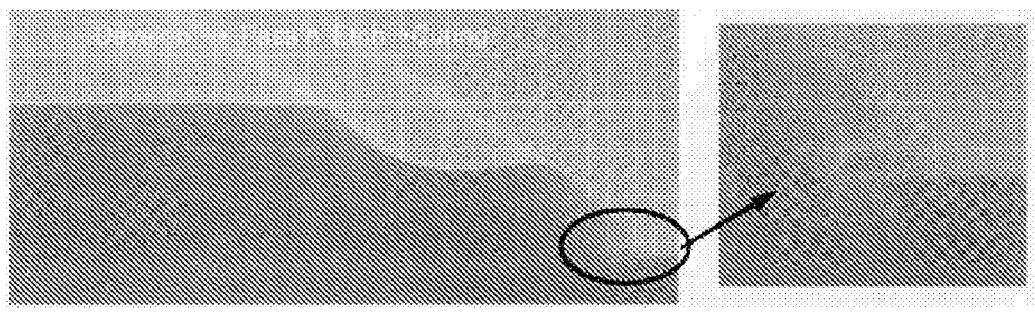
FIGS. 29A to 29D are photographs illustrating variation in the contact structure as a function of time periods for ashing after curing is made according to Example 2.
Figure 29B:
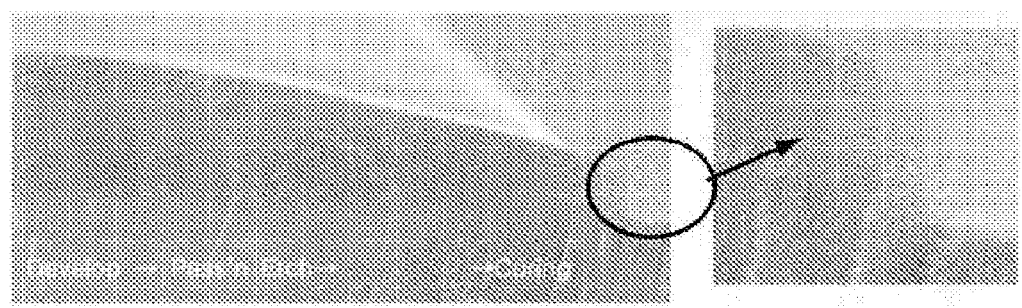
Figure 29C:
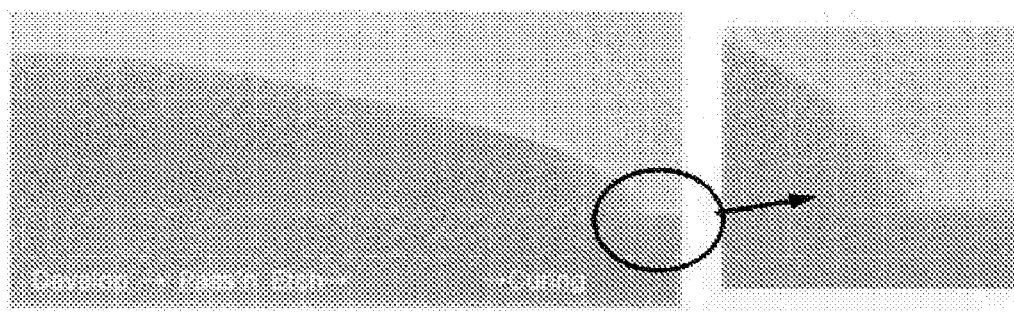
Figure 29D:
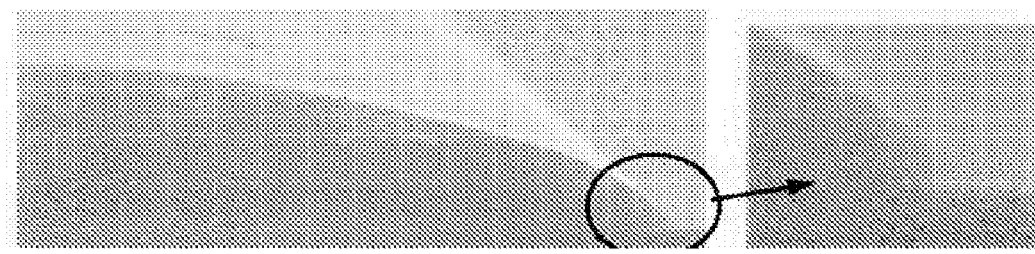

FIG. 29A is a photograph of the contact structure where the protective layer under the organic insulating layer was etched, and curing was made with respect to the organic insulating layer. FIGS. 29B to 29D are photographs of the contact structure where before the curing, the organic insulating layer suffered ashing for 30 seconds, 60 seconds and 90 seconds to remove a solid film from the surface of the organic insulating layer. In Example 2, the organic insulating layer was exposed to light using a mask with a slit pattern, and developed such that the boundary of the organic insulating layer defining the contact holes was formed with a stepped shape.

As shown in FIG. 29A, only under the application of the curing, the organic insulating layer was not nearly varied in structure, and the undercut structure remained without variation. By contrast, as shown in FIGS. 29B to 29D, under the application of the ashing and the curing, the organic insulating layer was re-flown and contracted so that the undercut structure was removed at the contact area. As the side wall of the organic insulating layer at the contact area was formed with a stepped shape, the contraction or re-flowing effect of the organic insulating layer was further effectively made so that the side wall of the organic insulating layer was formed to be more gradual. Therefore, even if the undercut structure is largely made, it can be easily removed through the curing. Furthermore, due to increase in the amount of re-flowing, the inclination of the side wall of the organic insulating layer at the contact area can be fluently made in a gradual manner.

EXAMPLE 3

In Example 3, the protective layer under the organic insulating layer was formed with silicon nitride such that it had a thickness of about 500 Å. Dry etching was made with respect to the protective layer using $CF_4+O_2$ as an etching gas such that the undercut structure was made at the contact area to be about 0.5-1.75 μm.

Figure 30A:
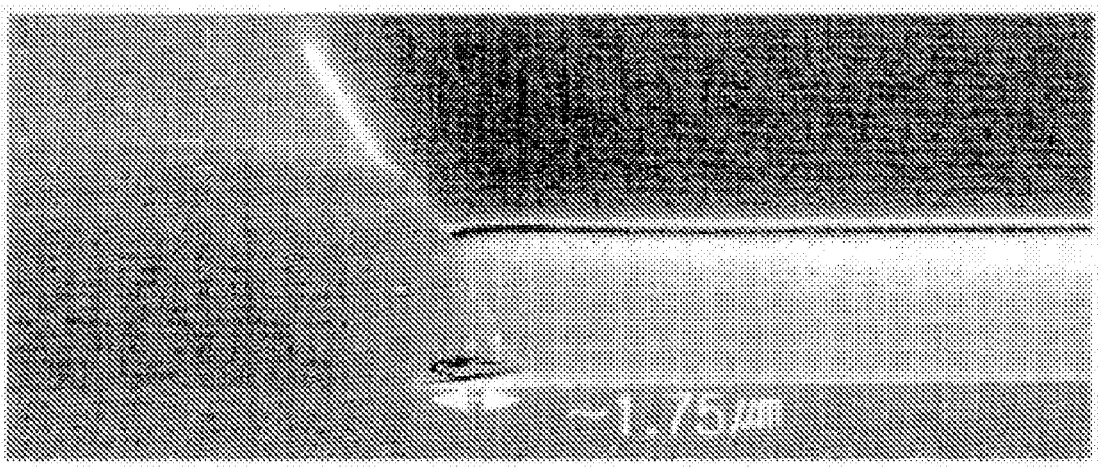
FIGS. 30A to 32D are photographs illustrating variation in the contact structure as a function of time periods for ashing after curing is made according to Example 3.
Figure 30B:
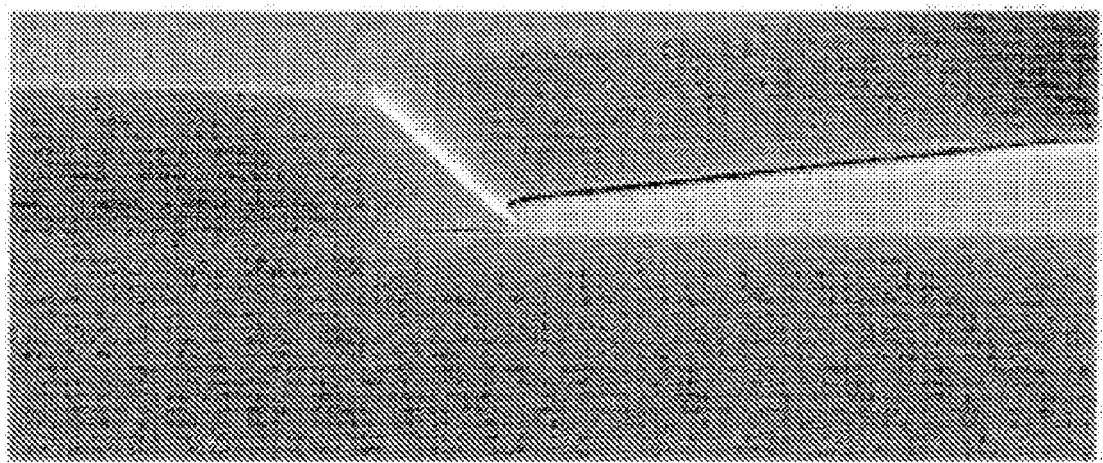
Figure 30C:
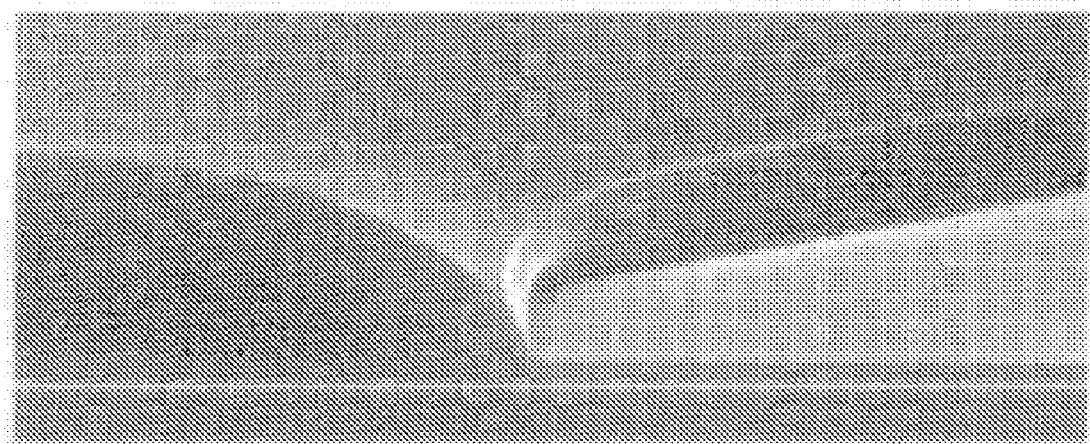
Figure 30D:
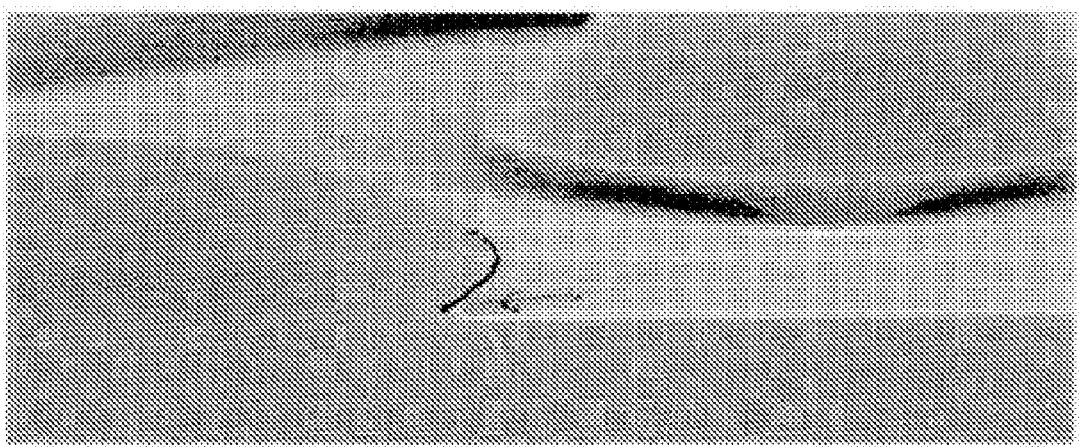
Figure 31A:
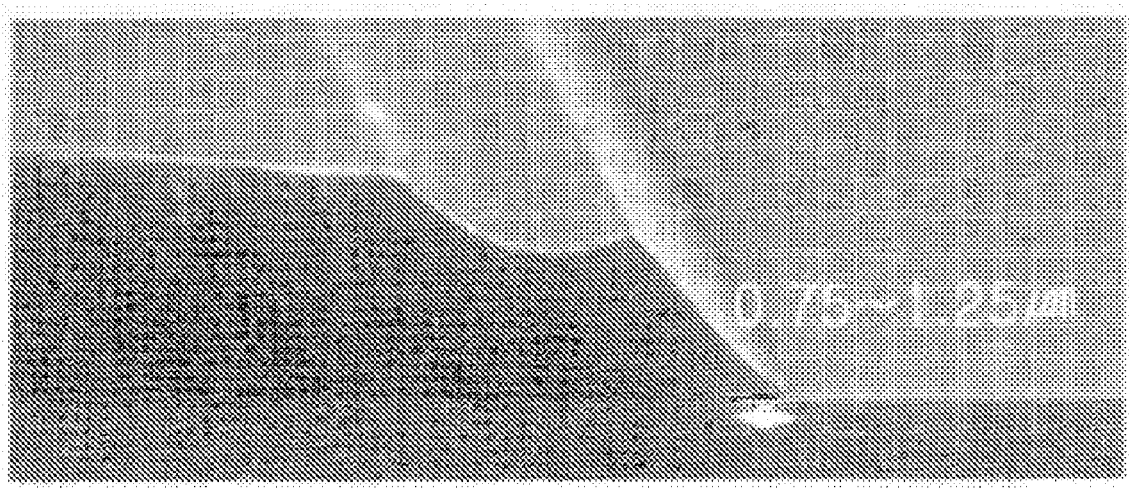
Figure 31B:
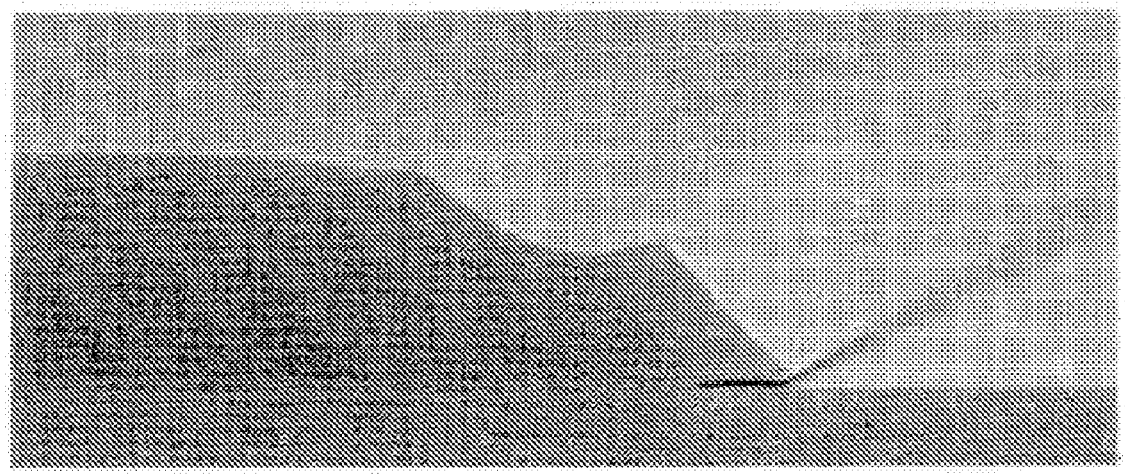
Figure 31C:
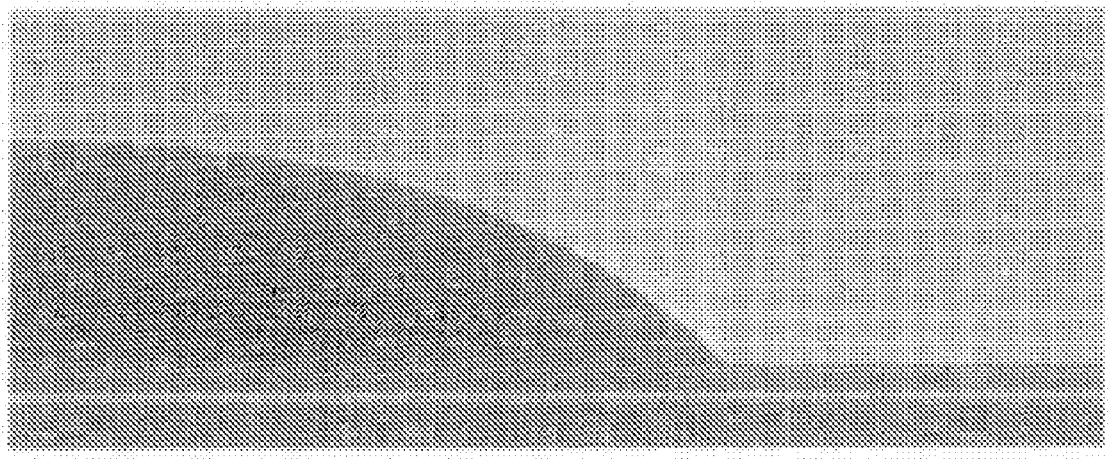
Figure 31D:
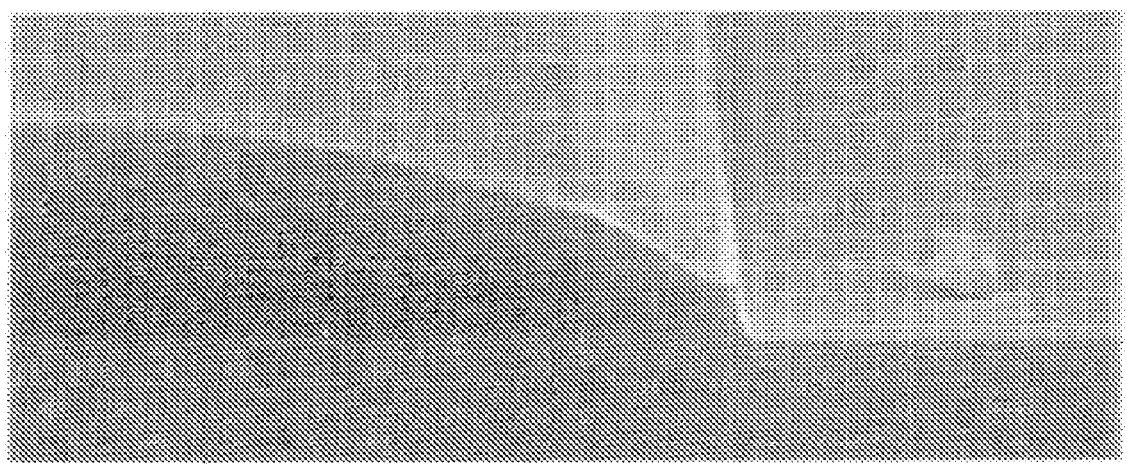
Figure 32A:
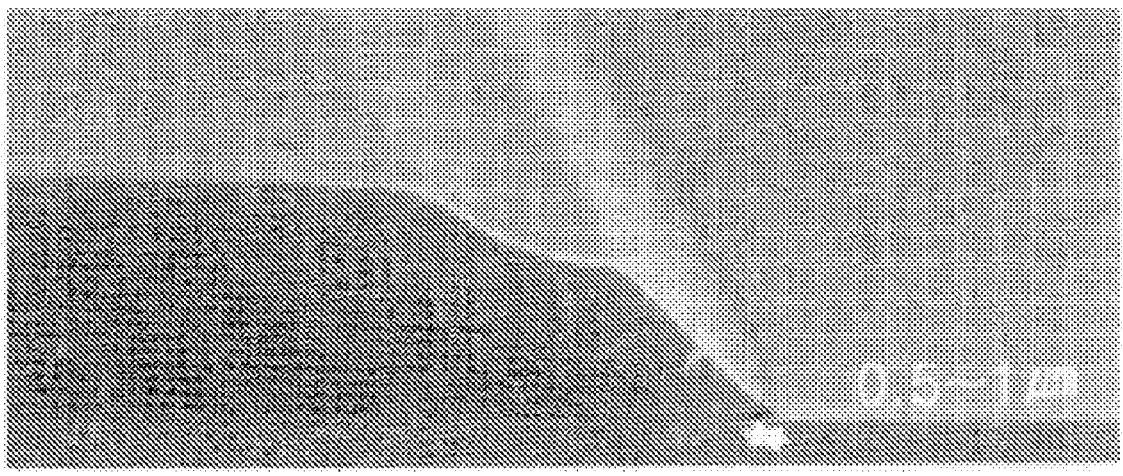
Figure 32B:
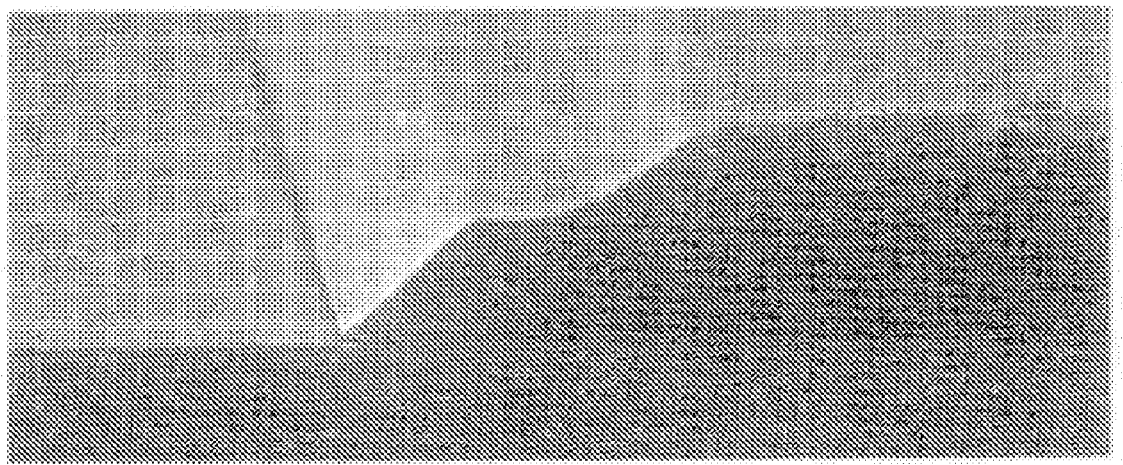
Figure 32C:
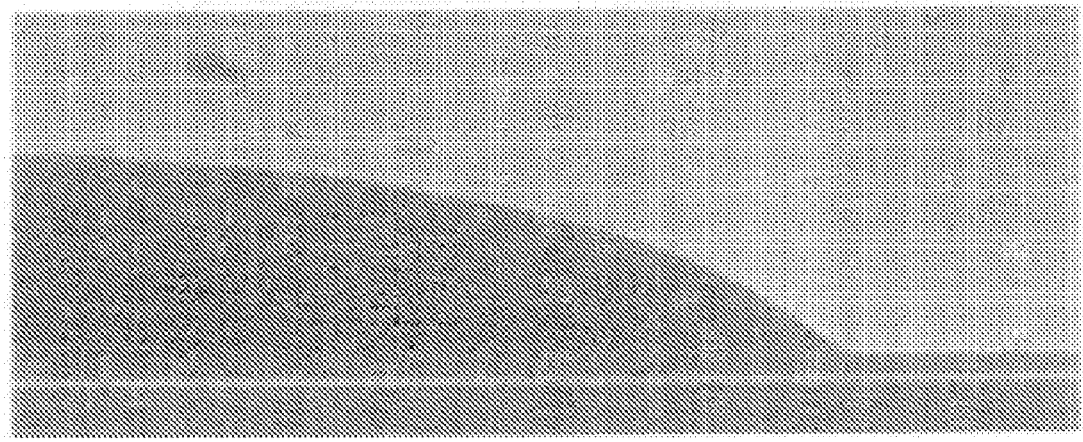
Figure 32D:
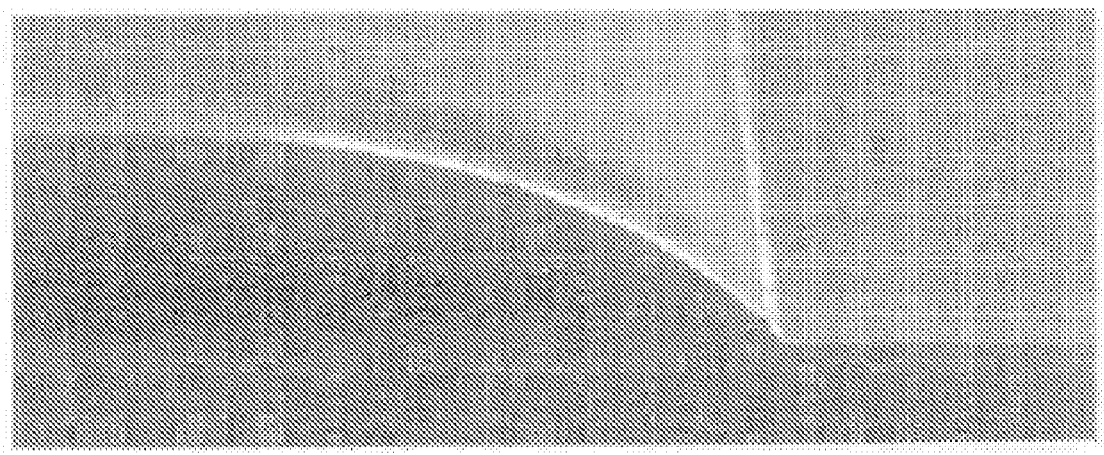

FIGS. 30A to 32D are photographs illustrating variation in the contact structure as a function of time periods for making ashing after the curing according to Example 3. FIGS. 30A to 30D illustrate the case where a mask with no slit pattern was used in the process of forming contact holes at the organic insulating layer, and FIGS. 31A to 31D illustrate the case where a mask with a slit pattern was used in the process of forming contact holes at the organic insulating layer. FIGS. 32A to 32D illustrate the case where a mask with double slit patterns was used in the process of forming contact holes at the organic insulating layer. FIGS. 30A, 31A and 32A illustrate the contact structure where the protective layer under the organic insulating layer was etched. FIGS. 30B, 31B and 32B illustrate the contact structure where the protective layer under the organic insulating layer suffered etching, and ashing for 30 seconds. FIGS. 30C, 31C and 32C illustrate the contact structure where the protective layer under the organic insulating layer suffered etching, ashing for 60 seconds, and curing. FIGS. 30D, 31D and 32D illustrate the contact structure where the protective layer under the organic insulating layer suffered etching, ashing for 90 seconds, and curing.

As shown in FIGS. 30A to 32D, in the case where the protective layer under the organic insulating layer suffered only etching or ashing, the undercut structure was not removed at the contact area. By contrast, in the case where the protective layer suffered ashing and curing, the undercut structure was removed at the contact area. Furthermore, in the case where contact holes were formed at the organic insulating layer using a mask with a slit pattern, the sidewall of the organic insulating layer defining the contact holes had a gradual inclination degree. In the case where the undercut structure is largely made at the contact area, it is preferable that the amount of contraction is reduced while increasing the amount of re-flowing. This can be controlled through varying the ashing time and the slit width of the slit pattern. It is preferable that the ashing is made for a short time within 60 seconds. The slit width of the slit pattern is preferably established to be about 0.5-3.5 mm. One to four slit patterns may be preferably formed at the mask. The processing conditions may be selected in consideration of the materials for the organic insulating layer, the thickness of the protective layer, and the conditions of patterning the organic insulating layer. Furthermore, in the case where the protective layer under the organic insulating layer bears a thin thickness of about 500 Å or less, re-flowing may be largely made at the curing process such that the sidewall of the organic insulating layer at the contact area is formed to proceed more gradually. Therefore, in the case so where the thickness of the protective layer is established to be about 2000 Å or less, the undercut structure can be easily removed.

As described above, when the layer placed under the organic insulating layer is undercut at the contact area, the organic insulating layer is contracted or re-flown while suffering ashing and curing so that the side wall thereof at the contact area can bear a tapering structure with a gradual inclination degree. This prevents the contact area from being cut while giving reliability to the contact area and enhancing the quality of the resulting display device. With application of this process, the steps of fabricating the thin film transistor array substrate can be simplified while decreasing the production cost.

Thus, in a method of fabricating a thin film transistor array substrate for a liquid crystal display, a gate line assembly is formed on a substrate while proceeding in the horizontal direction. The gate line assembly has gate lines, gate electrodes, and gate pads. A gate insulating layer is formed on the substrate with the gate line assembly. A semiconductor layer and an ohmic contact layer are sequentially formed on the gate insulating layer. A conductive layer is deposited onto the substrate, and patterned to thereby form a data line assembly. The data line assembly has data lines crossing over the gate lines, source electrodes, drain electrodes, and data pads. A protective layer and an organic insulating layer are deposited onto the substrate. The organic insulating layer is exposed to light, and developed to thereby form contact holes exposing the protective layer over the drain electrodes, the gate pads and the data pads. The protective layer is etched using the organic insulating layer as a mask to thereby expose the drain electrodes, the gate pads and the data pads. The organic insulting layer is contracted or re-flown through curing such that the undercut structure is removed at the contact area. The organic insulating layer suffers ashing before the curing step. An ITO or IZO-based layer is deposited onto the organic insulating layer, and patterned to thereby form pixel electrodes, subsidiary gate pads, and subsidiary data pads. The pixel electrodes are connected to the drain electrodes, and the subsidiary gate and data pads are connected to the gate and the data pads.

These and other advantages may be achieved by the features of the present disclosure, as described herein. For example when contact holes exposing pads or wiring lines are formed at the contact area, the layer placed under an organic insulating layer is etched using the organic insulating layer with contact holes as a mask while exposing the pads or the wiring lines, and curing is then made with respect to the organic insulating layer to harden it. Ashing is made before the curing step to enhance the curing effect.

Preferably, in a method of fabricating a semiconductor device, a first wiring line assembly is formed on a substrate. An under-layer is formed on the first wiring line assembly. An organic insulating layer is formed on the under-layer. The organic insulating layer is patterned to thereby form contact holes exposing the under-layer. The under-layer exposed through the contact holes is etched such that the underlying first wiring line assembly is exposed to the outside. The organic insulating layer is cured. A second wiring line assembly is formed on the organic insulating layer such that the second wiring line assembly is connected to the first wiring line assembly through the contact holes.

The under-layer is formed with silicon nitride, silicon oxide, or a conductive material. The organic insulating layer is formed with a photosensitive organic material. The organic insulating layer suffers ashing before the curing step. The organic insulating layer is reduced in thickness at the ashing step such that the organic insulating layer bears a thickness of about 1000 Å or less. This process may be well applied for use in fabricating a thin film transistor array substrate for a liquid crystal display.

A gate line assembly is formed on an insulating substrate. The gate line assembly has gate lines, and gate electrodes connected to the gate lines. A gate insulating layer is deposited onto the substrate with the gate line assembly. A semiconductor layer is formed on the gate insulating layer. A data line assembly is formed on the semiconductor layer. The gate line assembly has data lines crossing over the gate lines, source electrodes connected to the data lines while being positioned close to the gate electrodes, and drain electrodes positioned opposite to the source electrodes with respect to the gate electrodes. A protective layer is deposited onto the substrate, and an organic insulating layer is formed on the protective layer. The organic insulating layer is patterned to thereby form first contact holes exposing the protective layer over the drain electrodes. The protective layer exposed through the first contact holes is etched such that the drain electrodes are exposed to the outside. The organic insulating layer is cured. Pixel electrodes are formed on the protective layer such that the pixel electrodes are connected to the drain electrodes through the first contact holes.

The organic insulating layer is formed with a photosensitive organic material. The organic insulating layer suffers ashing before the curing step. The organic insulating layer is reduced in thickness at the ashing step such that the organic insulating layer bears a thickness of about 1000 Å or less.

The gate line assembly further has gate pads for receiving scanning signals from the outside and transmitting the scanning signals to the gate lines. The data line assembly further has data pads for receiving picture signals from the outside and transmitting the picture signals to the data lines. The organic insulating layer has second and third contact holes exposing the data and the gate pads together with the protective layer or the gate insulating layer. Subsidiary gate and data pads are formed at the same plane as the pixel electrodes such that the subsidiary gate and data pads are electrically connected to the gate and data pads through the second and the third contact holes.

The second and the third contact holes are formed together with the first contact holes, and the portion of the organic insulating layer defining the first to the third contact holes is established to bear a relatively thin thickness compared to other portions of the organic insulating layer. Color filters of red, green and blue may be formed between the protective layer and the organic insulating layer.

As the semiconductor device becomes more highly integrated, it is optimized in area with a multi-layered wiring line assembly that serves to assist the pads connected to the signal lines to receive the required signals from the outside. The semiconductor device involves an insulating layer, disposed between the wiring lines, that is formed with a low dielectric organic material bearing an excellent flattening characteristic. This is to minimize interference of the signals transmitted through the wiring lines. Contact holes are formed at the insulating layer, and the wiring lines are electrically connected to each other through the contact holes. To prevent that undercut is made at the contact area during the contact hole formation process curing is made with respect to the organic insulating layer after the target layer placed under the insulating layer is etched to form contact holes exposing the pads or the wiring tines.

While the present disclosure has been described in detail with reference to the preferred embodiments, those skilled in the art will appreciate that various modifications and substitutions can be made thereto without departing from the spirit and scope of the present disclosure as set forth in the appended claims.

What is claimed is:

1. A method of fabricating a semiconductor device, the method comprising the steps of:
    forming a first wiring line assembly on a substrate;
    forming an under-layer on the first wiring line assembly;
    forming an organic insulating layer such that the organic insulating layer covers the under-layer;
    patterning the organic insulating layer to thereby form contact holes exposing the under-layer;
    etching the under-layer exposed through the contact holes such that the underlying first wiring line assembly is exposed to the outside;
    curing the organic insulating layer after etching the under-layer; and
    forming a second wiring line assembly on the organic insulating layer such that the second wiring line assembly is connected to the first wiring line assembly through the contact holes.

2. The method of claim 1, wherein an undercut structure made at the contact area is removed by curing the organic insulating layer.

3. The method of claim 1, wherein the under-layer is etched using a mask with the organic insulating layer.

4. The method of claim 1 wherein the portion of the organic insulating layer defining the contact holes is thinner than the other portions at the step of forming the contact holes.

5. The method of claim 4, wherein the organic insulating layer is formed with a photosensitive organic material.

6. The method of claim 3, wherein the organic insulating layer is formed with a photosensitive organic material.

7. The method of claim 2, wherein the portion of the organic insulating layer defining the contact holes is thinner than the other portions at the step of forming the contact holes.

8. The method of claim 7, wherein the organic insulating layer is formed with a photosensitive organic material.

9. The method of claim 2, wherein the organic insulating layer is formed with a photosensitive organic material.

10. The method of claim 1, wherein the under-layer is etched using a mask with the organic insulating layer.

11. The method of claim 10, wherein the portion of the organic insulating layer defining the contact holes is thinner than the other portions at the step of forming the contact holes.

12. The method of claim 11, wherein the organic insulating layer is formed with a photosensitive organic material.

13. The method of claim 10, wherein the organic insulating layer is formed with a photosensitive organic material.

14. The method of claim 1, wherein the portion of the organic insulating layer defining the contact holes is thinner than the other portions at the step of forming the contact holes.

15. The method of claim 14, wherein the organic insulating layer is formed with a photosensitive organic material.

16. The method of claim 1, wherein the organic insulating layer is formed with a photosensitive organic material.

* * * * *